:::

United States Patent
Takasuka et al.

(10) Patent No.: US 9,785,048 B2
(45) Date of Patent: Oct. 10, 2017

(54) RESIST COMPOSITION

(71) Applicant: Mitsubishi Gas Chemical Company, Inc., Tokyo (JP)

(72) Inventors: Masaaki Takasuka, Kanagawa (JP); Masatoshi Echigo, Kanagawa (JP); Yu Okada, Okayama (JP); Yumi Ochiai, Okayama (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 14/895,634

(22) PCT Filed: May 28, 2014

(86) PCT No.: PCT/JP2014/064083
§ 371 (c)(1),
(2) Date: Dec. 3, 2015

(87) PCT Pub. No.: WO2014/196425
PCT Pub. Date: Dec. 11, 2014

(65) Prior Publication Data
US 2016/0124303 A1    May 5, 2016

(30) Foreign Application Priority Data
Jun. 7, 2013    (JP) .................................. 2013-121183

(51) Int. Cl.
| G03F 7/004 | (2006.01) |
| G03F 7/20 | (2006.01) |
| G03F 7/32 | (2006.01) |
| G03F 7/38 | (2006.01) |
| G03F 7/038 | (2006.01) |
| G03F 7/039 | (2006.01) |

(52) U.S. Cl.
CPC ............ *G03F 7/0045* (2013.01); *G03F 7/039* (2013.01); *G03F 7/0382* (2013.01); *G03F 7/0395* (2013.01); *G03F 7/0397* (2013.01); *G03F 7/2059* (2013.01); *G03F 7/322* (2013.01); *G03F 7/38* (2013.01)

(58) Field of Classification Search
None
See application file for complete search history.

(56) References Cited

U.S. PATENT DOCUMENTS

| 6,093,517 A | 7/2000 | Ito et al. |
| 2008/0153031 A1 | 6/2008 | Echigo et al. |

FOREIGN PATENT DOCUMENTS

| JP | 2005-326838 A | 11/2005 |
| JP | 2007-197389 A | 8/2007 |
| JP | 2008-145539 A | 6/2008 |
| JP | 2009-173623 A | 8/2009 |
| JP | 2013-140342 A | 7/2013 |
| TW | 200949439 A1 | 12/2009 |
| WO | 2009-119784 A1 | 10/2009 |
| WO | 2011-037071 A1 | 3/2011 |
| WO | 2011-037073 A1 | 3/2011 |
| WO | 2011-070718 A1 | 6/2011 |

OTHER PUBLICATIONS

Machine-assisted English translation of WO 2009/119784 A1 (Oct. 1, 2009).*
International Search Report date of mailing Sep. 2, 2014 for PCT/JP2014/064083 and English translation of the same (4 pages).
T Nakayama, M Nomura, K Hag and M Ueda; Bull. Chem. Soc.Jpn., 71, p. 2979-2984 (1998).

* cited by examiner

*Primary Examiner* — Sin Lee
(74) *Attorney, Agent, or Firm* — Fitch, Even, Tabin & Flannery LLP

(57) ABSTRACT

The resist composition according to the present invention is a resist composition comprising a solid component comprising a resist base material, and a solvent. In the resist composition according to the present invention, the resist composition contains 1 to 80% by mass of the solid component and 20 to 99% by mass of the solvent, the resist base material comprises a compound (ctt form) represented by a predetermined formula (1) and a compound represented by a predetermined formula (3), the proportion of the compound (ctt form) represented by the predetermined formula (1) to the resist base material is from 65 to 99% by mass, and the mass ratio of the compound represented by the predetermined formula (3) to the compound (ctt form) represented by the predetermined formula (1) is from 0.01 to 0.53.

15 Claims, No Drawings

RESIST COMPOSITION

CROSS-REFERENCE TO RELATED APPLICATIONS

This application is a U.S. national phase application filed under 35 U.S.C. § 371 of International Application PCT/JP2014/064083, filed on May 28, 2014, designating the U.S., which claims priority from Japanese Application Number 2013-121183, filed June 7, 2013, which are hereby incorporated herein by reference in their entirety.

FIELD OF THE INVENTION

The present invention relates to a resist composition and a method for forming a resist pattern using the composition.

BACKGROUND OF THE INVENTION

Conventional typical resist materials are polymer based materials capable of forming amorphous thin films. For example, a resist thin film is made by coating a substrate with a solution of a polymer resist material such as polymethyl methacrylate, polyhydroxy styrene having an acid dissociation reactive group, polyalkyl methacrylate. A line pattern of about 45 to 100 nm is subsequently formed by irradiating the resist thin film with ultraviolet, far ultraviolet, electron beam, extreme ultraviolet (EUV), and X-ray or the like.

However, polymer based resists have a molecular weight as large as about 10,000 to 100,000 and also wide molecular weight distribution. In lithography using a polymer based resist, roughness accordingly occurs on a fine pattern surface; the pattern dimension becomes difficult to be controlled; and the yield decreases. Therefore, there is a limitation in miniaturization with lithography using a conventional polymer based resist material, and in order to make a finer pattern, various low molecular weight resist materials have been proposed.

For example, an alkaline development type negative type radiation-sensitive composition using a low molecular weight polynuclear polyphenolic compound as a main component has been suggested (for example, see Patent Literatures 1 and 2).

Also, as a candidate of a low molecular weight resist material having high heat resistance, an alkaline development type negative type radiation-sensitive composition using a low molecular weight cyclic polyphenolic compound as a main component has been suggested (for example, see Patent Literature 3 and Non Patent Literature 1). Because of their low molecular weights, these low molecular weight cyclic polyphenolic compounds are expected to provide a resist pattern having a small molecular size, high resolution, and small roughness. Also, the low molecular weight cyclic polyphenolic compounds, which have a rigid cyclic structure in their skeletons, impart high heat resistance in spite of their low molecular weights.

CITATION LIST

Patent Literature

Patent Literature 1: Japanese Patent Application Laid-Open No. 2005-326838

Patent Literature 2: Japanese Patent Application Laid-Open No. 2008-145539

Patent Literature 3: Japanese Patent Application Laid-Open No. 2009-173623

Non Patent Literature

Non Patent Literature 1: T. Nakayama, M. Nomura, K. Haga, M. Ueda: Bull. Chem. Soc. Jpn., 71, 2979 (1998)

SUMMARY OF INVENTION

However, the negative type radiation-sensitive compositions described in Patent Literatures 1 and 2 have the disadvantages that the heat resistance is not sufficient and the shape of the resulting resist pattern becomes poor.

The cyclic phenolic compound described in Patent Literature 3 yields a good pattern, but fails to stably produce a good pattern shape because of its slightly unstable material characteristics such as solubility.

Currently known low molecular weight cyclic polyphenolic compounds, including the compound described in Non Patent Literature 1, have problems such as low solubility in a safe solvent used in a semiconductor production process, low sensitivity, and the poor shape of the resulting resist pattern. Improvement in such low molecular weight cyclic polyphenolic compounds is desired.

The present invention has been made in light of the problems of the conventional techniques, and an object of the present invention is to provide a resist composition which has high solubility in a safe solvent, has high sensitivity, has small roughness, and stably imparts a good shape to a resist pattern.

The inventors have, as a result of devoted examinations to solve the above problems, found out that by using a specific stereoisomer of a cyclic compound as a main component and a specific cyclic compound as a secondary component for a resist base material, a resist composition becomes surprisingly effective for solving the above problems. Specifically, the inventors have found out that this resist composition has high solubility in a safe solvent, has high sensitivity, has small roughness, and stably imparts a better shape to a resist pattern, and reached the present invention.

More specifically, the present invention is as follows.

[1]

A resist composition comprising a solid component comprising a resist base material, and a solvent, wherein the resist composition comprises 1 to 80% by mass of the solid component and 20 to 99% by mass of the solvent, the resist base material comprises a compound (ctt form) represented by the formula (1) and a compound represented by the formula (3), a proportion of the compound (ctt form) represented by the formula (1) to the resist base material is from 65 to 99% by mass, and a mass ratio of the compound represented by the formula (3) to the compound (ctt form) represented by the formula (1) is from 0.01 to 0.53:

[Formula 1]

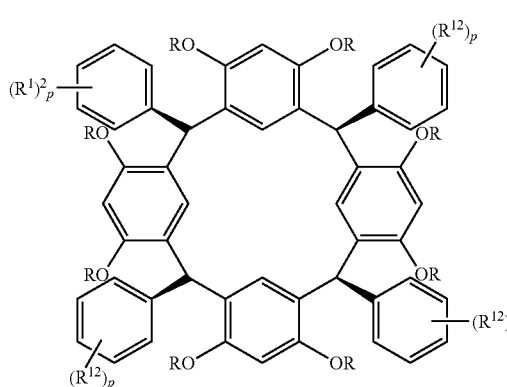

(1)

(in formula (1), R are each independently a hydrogen atom, a substituted or unsubstituted heterocyclic group, a halogen atom, a substituted or unsubstituted linear aliphatic hydrocarbon group having 1 to 20 carbon atoms, a substituted or unsubstituted branched aliphatic hydrocarbon group having 3 to 20 carbon atoms, a substituted or unsubstituted cyclic aliphatic hydrocarbon group having 3 to 20 carbon atoms, a substituted or unsubstituted aryl group having 6 to 20 carbon atoms, a substituted or unsubstituted aralkyl group having 7 to 30 carbon atoms, a substituted or unsubstituted alkoxy group having 1 to 20 carbon atoms, a substituted or unsubstituted amino group having 0 to 20 carbon atoms, a substituted or unsubstituted alkenyl group having 2 to 20 carbon atoms, a substituted or unsubstituted acyl group having 1 to 20 carbon atoms, a substituted or unsubstituted alkoxycarbonyl group having 2 to 20 carbon atoms, a substituted or unsubstituted alkyloyloxy group having 1 to 20 carbon atoms, a substituted or unsubstituted aryloyloxy group having 7 to 30 carbon atoms, a substituted or unsubstituted alkylsilyl group having 1 to 20 carbon atoms, or any of these groups bonded to a divalent group (one or more groups selected from the group consisting of a substituted or unsubstituted alkylene group, a substituted or unsubstituted arylene group, and an ether group); $R^{12}$ is an unsubstituted cyclic aliphatic hydrocarbon group having 3 to 14 carbon atoms; and p is an integer of 0 to 4.)

[Formula 2]

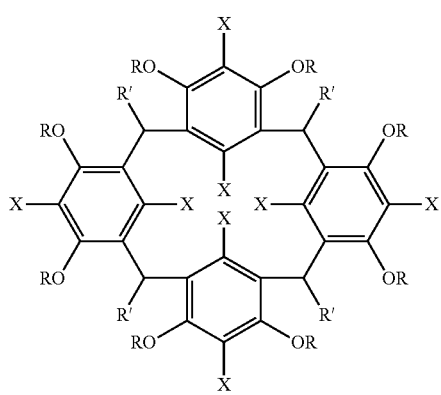

(3)

(in formula (3), R is the same as defined above; R' and X are each independently a hydrogen atom, a hydroxyl group, a cyano group, a nitro group, a substituted or unsubstituted heterocyclic group, a halogen atom, a substituted or unsubstituted linear aliphatic hydrocarbon group having 1 to 20 carbon atoms, a substituted or unsubstituted branched aliphatic hydrocarbon group having 3 to 20 carbon atoms, a substituted or unsubstituted cyclic aliphatic hydrocarbon group having 3 to 20 carbon atoms, a substituted or unsubstituted aryl group having 6 to 20 carbon atoms, a substituted or unsubstituted aralkyl group having 7 to 20 carbon atoms, a substituted or unsubstituted alkoxy group having 1 to 20 carbon atoms, a substituted or unsubstituted amino group having 0 to 20 carbon atoms, a substituted or unsubstituted alkenyl group having 2 to 20 carbon atoms, a substituted or unsubstituted acyl group having 1 to 20 carbon atoms, a substituted or unsubstituted alkoxycarbonyl group having 2 to 20 carbon atoms, a substituted or unsubstituted alkyloyloxy group having 1 to 20 carbon atoms, a substituted or unsubstituted aryloyloxy group having 7 to 20 carbon atoms, a substituted or unsubstituted alkylsilyl group having 1 to 20 carbon atoms, or a group in which a divalent group (one or more groups selected from the group consisting of a substituted or unsubstituted alkylene group, a substituted or unsubstituted arylene group, and an ether group) is bonded to any of these groups, provided that the compound represented by the formula (3) differs from any of the compound (ctt form) represented by the formula (1) and stereoisomers thereof.)

[2]

The resist composition according to [1], wherein, in the formula (1), R is a hydrogen atom.

[3]

The resist composition according to [1] or [2], wherein, in the formula (1), p is 1.

[4]

The resist composition according to [3], wherein the compound represented by the formula (1) is represented by the following formula (X):

[Formula 3]

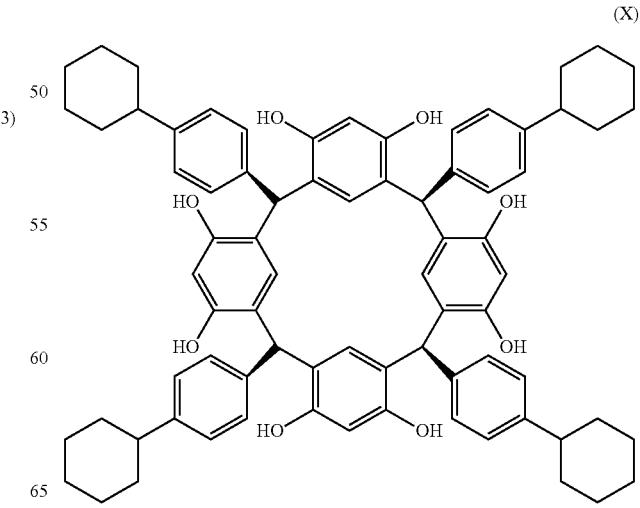

(X)

[5]

The resist composition according to any of [1] to [4], wherein, in the formula (3), R' is represented by the following formula (2):

[Formula 4]

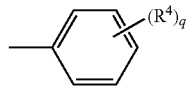
(2)

(in formula (2), $R^4$ are each independently a hydroxyl group, a cyano group, a nitro group, a substituted or unsubstituted heterocyclic group, a halogen atom, a substituted or unsubstituted linear aliphatic hydrocarbon group having 1 to 14 carbon atoms, a substituted or unsubstituted branched aliphatic hydrocarbon group having 3 to 14 carbon atoms, a substituted cyclic aliphatic hydrocarbon group having 3 to 14 carbon atoms, a substituted or unsubstituted aryl group having 6 to 14 carbon atoms, a substituted or unsubstituted alkoxy group having 1 to 14 carbon atoms, or a substituted or unsubstituted alkylsilyl group having 1 to 14 carbon atoms; and q is an integer of 0 to 5.)

[6]

The resist composition according to any of [1] to [5], wherein in the formula (3), R is a hydrogen atom.

[7]

The resist composition according to any of [1] to [6], wherein the compound represented by the formula (3) comprises 70 mol % or more of a ctt form or a ccc form thereof.

[8]

The resist composition according to any of [1] to [7], wherein the compound represented by the formula (3) is at least one selected from the following compound group:

[Formula 5-1]

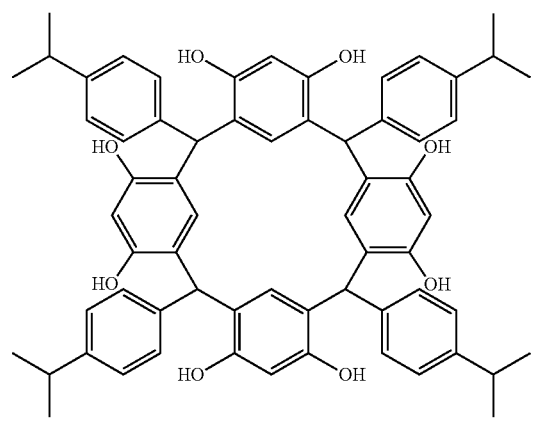

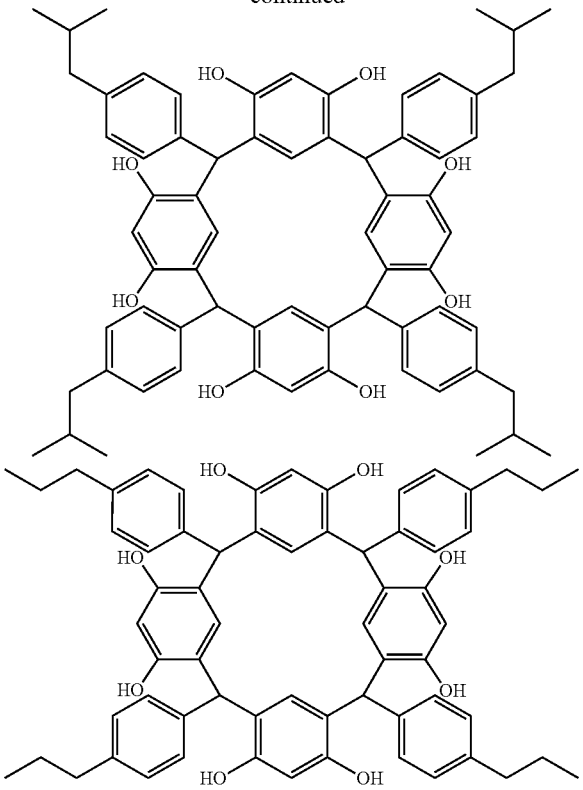

[Formula 5-2]

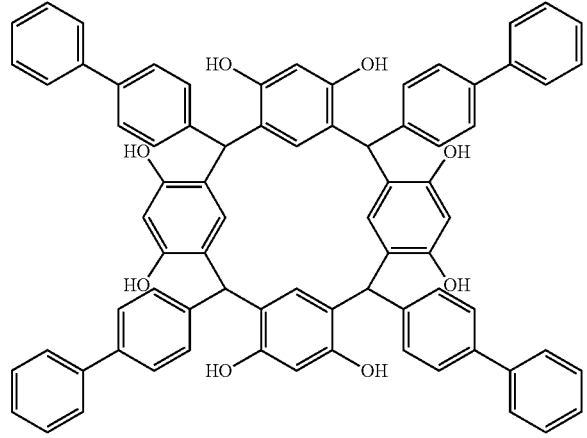

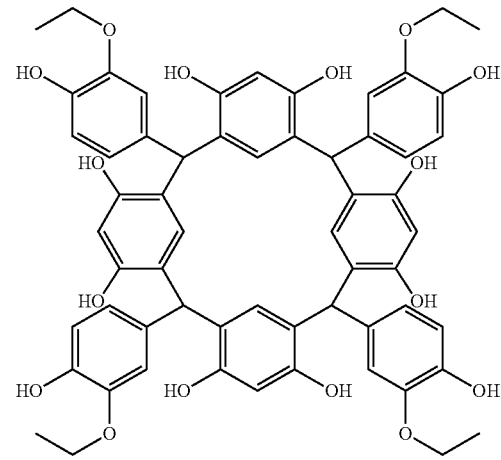

-continued

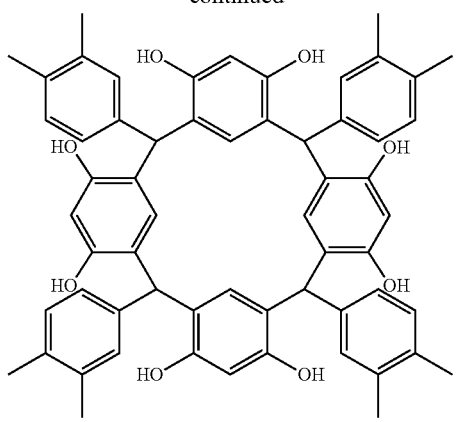

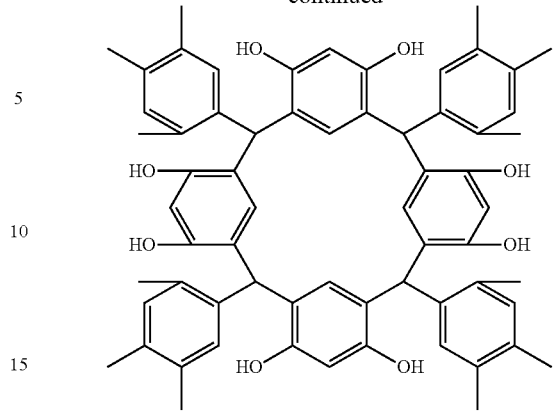

[Formula 5-3]

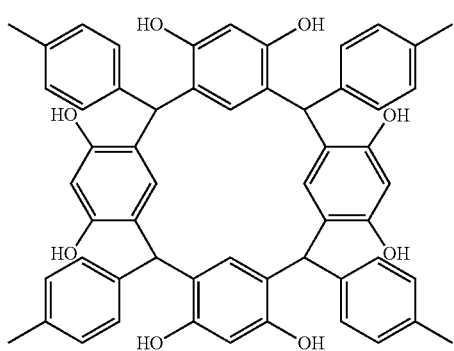

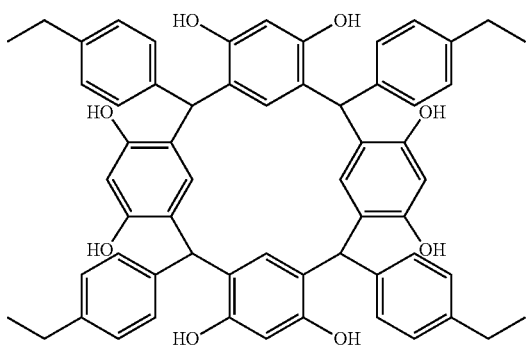

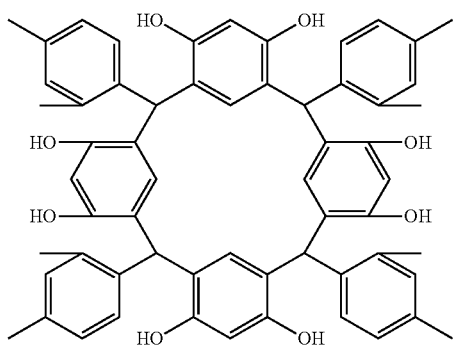

[9]
The resist composition according to any of [1] to [8], further comprising an acid generating agent (C) capable of generating an acid directly or indirectly by irradiation with any one radiation selected from the group consisting of visible light, ultraviolet, excimer laser, electron beam, extreme ultraviolet (EUV), X-ray, and ion beam.

[10]
The resist composition according to any of [1] to [9], further comprising an acid crosslinking agent (G).

[11]
The resist composition according to any of [1] to [10], further comprising an acid diffusion controlling agent (E).

[12]
The resist composition according to [11], wherein a ratio of the resist base material, the acid generating agent (C), the acid crosslinking agent (G), the acid diffusion controlling agent (E), and an optional component (F) (resist base material/acid generating agent (C)/acid crosslinking agent (G)/acid diffusion controlling agent (E)/optional component (F)) in the solid component is from 20 to 99.498/from 0.001 to 49/from 0.5 to 49/from 0.001 to 49/from 0 to 49, based on % by mass.

[13]
The resist composition according to any of [1] to [12], capable of forming an amorphous film by spin coating.

[14]
The resist composition according to [13], wherein a dissolution rate of the amorphous film in a developing solution at 23° C. is 10 angstrom/sec or more.

[15]
The resist composition according to [13] or [14], wherein a dissolution rate of the amorphous film irradiated with KrF excimer laser, extreme ultraviolet, electron beam or X-ray, or the amorphous film heated at 20 to 250° C. in a developing solution is 5 angstrom/sec or less.

[16]
A method for forming a resist pattern, comprising:
coating a substrate with the resist composition according to any of [1] to [15], thereby forming a resist film;
exposing the resist film; and
developing the exposed resist film.

The present invention can provide a resist composition which has high solubility in a safe solvent, has high sensitivity, has small roughness, and imparts a good shape to a resist pattern, and a method for forming a resist pattern using the composition.

DESCRIPTION OF EMBODIMENTS

Hereinafter, an embodiment of the present invention will be described (hereinafter, referred to as "present embodiment"). The present embodiment is given in order to illustrate the present invention. The present invention is not limited to only the present embodiment.

(Resist Composition)

The resist composition of the present embodiment is a resist composition comprising a solid component comprising a resist base material, and a solvent, wherein the resist composition comprises 1 to 80% by mass of the solid component and 20 to 99% by mass of the solvent, the resist base material comprises a compound (ctt form) represented by the formula (1) and a compound represented by the formula (3), a proportion of the compound (ctt form) represented by the formula (1) to the resist base material is from 65 to 99% by mass, and a mass ratio of the compound represented by the formula (3) to the compound (ctt form) represented by the formula (1) is from 0.01 to 0.53.

The resist composition of the present embodiment having such constitution has high solubility in a safe solvent, has high sensitivity, has small roughness, and can stably impart a good shape to a resist pattern. Thus, the resist composition of the present embodiment is useful as an acid amplification type low molecular weight resist material.

[Formula 6]

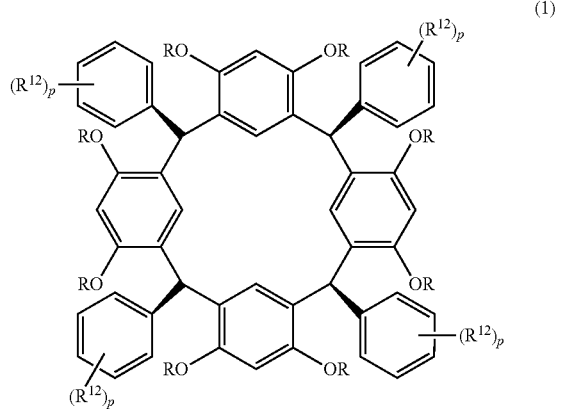

(1)

(in formula (1), R are each independently a hydrogen atom, a substituted or unsubstituted heterocyclic group, a halogen atom, a substituted or unsubstituted linear aliphatic hydrocarbon group having 1 to 20 carbon atoms, a substituted or unsubstituted branched aliphatic hydrocarbon group having 3 to 20 carbon atoms, a substituted or unsubstituted cyclic aliphatic hydrocarbon group having 3 to 20 carbon atoms, a substituted or unsubstituted aryl group having 6 to 20 carbon atoms, a substituted or unsubstituted aralkyl group having 7 to 30 carbon atoms, a substituted or unsubstituted alkoxy group having 1 to 20 carbon atoms, a substituted or unsubstituted amino group having 0 to 20 carbon atoms, a substituted or unsubstituted alkenyl group having 2 to 20 carbon atoms, a substituted or unsubstituted acyl group having 1 to 20 carbon atoms, a substituted or unsubstituted alkoxycarbonyl group having 2 to 20 carbon atoms, a substituted or unsubstituted alkyloyloxy group having 1 to 20 carbon atoms, a substituted or unsubstituted aryloyloxy group having 7 to 30 carbon atoms, a substituted or unsubstituted alkylsilyl group having 1 to 20 carbon atoms, or a group in which a divalent group (one or more groups selected from the group consisting of a substituted or unsubstituted alkylene group, a substituted or unsubstituted arylene group, and an ether group) is bonded to any of these groups; $R^{12}$ is an unsubstituted cyclic aliphatic hydrocarbon group having 3 to 14 carbon atoms; and p is an integer of 0 to 4.)

[Formula 7]

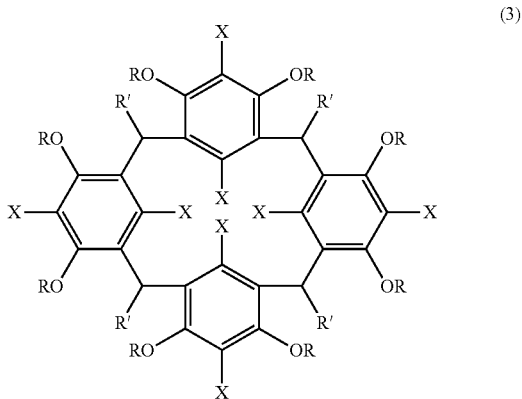

(3)

(in formula (3), R is the same as defined above; R' and X are each independently a hydrogen atom, a hydroxyl group, a cyano group, a nitro group, a substituted or unsubstituted heterocyclic group, a halogen atom, a substituted or unsubstituted linear aliphatic hydrocarbon group having 1 to 20 carbon atoms, a substituted or unsubstituted branched aliphatic hydrocarbon group having 3 to 20 carbon atoms, a substituted or unsubstituted cyclic aliphatic hydrocarbon group having 3 to 20 carbon atoms, a substituted or unsubstituted aryl group having 6 to 20 carbon atoms, a substituted or unsubstituted aralkyl group having 7 to 20 carbon atoms, a substituted or unsubstituted alkoxy group having 1 to 20 carbon atoms, a substituted or unsubstituted amino group having 0 to 20 carbon atoms, a substituted or unsubstituted alkenyl group having 2 to 20 carbon atoms, a substituted or unsubstituted acyl group having 1 to 20 carbon atoms, a substituted or unsubstituted alkoxycarbonyl group having 2 to 20 carbon atoms, a substituted or unsubstituted alkyloyloxy group having 1 to 20 carbon atoms, a substituted or unsubstituted aryloyloxy group having 7 to 20 carbon atoms, a substituted or unsubstituted alkylsilyl group having 1 to 20 carbon atoms, or a group in which a divalent group (one or more groups selected from the group consisting of a substituted or unsubstituted alkylene group, a substituted or unsubstituted arylene group, and an ether group) is bonded to any of these groups, provided that the compound represented by the formula (3) differs from any of the compound (ctt form) represented by the formula (1) and stereoisomers thereof.)

In the present specification, the term "substituted" means that one or more hydrogen atoms in a functional group are each substituted with a halogen atom, a hydroxyl group, a cyano group, a nitro group, a heterocyclic group, a linear aliphatic hydrocarbon group having 1 to 20 carbon atoms, a branched aliphatic hydrocarbon group having 3 to 20 carbon atoms, a cyclic aliphatic hydrocarbon group having 3 to 20 carbon atoms, an aryl group having 6 to 20 carbon atoms, an aralkyl group having 7 to 30 carbon atoms, an alkoxy group having 1 to 20 carbon atoms, an amino group having 0 to 20 carbon atoms, an alkenyl group having 2 to 20 carbon atoms, an acyl group having 1 to 20 carbon atoms, an alkoxycarbonyl group having 2 to 20 carbon atoms, an alkyloyloxy group having 1 to 20 carbon atoms, an aryloyloxy group having 7 to 30 carbon atoms, or an alkylsilyl group having 1 to 20 carbon atoms, unless otherwise defined.

Examples of the unsubstituted heterocyclic group include, but not particularly limited to, a pyridyl group, a bipyridyl group, a pyrrolidyl group, a pyrazolyl group, an imidazolyl group, an isoxazolyl group, an isothiazolyl group, a piperidyl group, a piperazyl group, a morpholyl group, a thiomorpholyl group, a triazole group, and a tetrazole group.

Examples of the substituted heterocyclic group include, but not particularly limited to, an N-methylpyridyl group, an N-fluoropyridyl group, an N-hydroxypyridyl group, an N-cyanopyridyl group, a methylbipyridyl group, a methylpyrrolidyl group, a methylpyrazolyl group, a methylimidazolyl group, a methylisoxazolyl group, a methylisothiazolyl group, a methylpiperidyl group, a methylpiperazyl group, a methylmorpholyl group, a methylthiomorpholyl group, a methyltriazole group, and a methyltetrazole group.

Examples of the unsubstituted linear aliphatic hydrocarbon group having 1 to 20 carbon atoms include, but not particularly limited to, a methyl group, an ethyl group, a propyl group, a butyl group, a pentyl group, a hexyl group, an octyl group, a decyl group, a dodecyl group, a hexadecyl group, and an octadecyl group.

Examples of the substituted linear aliphatic hydrocarbon group having 1 to 20 carbon atoms include, but not particularly limited to, a fluoromethyl group, a 2-hydroxyethyl group, a 3-cyanopropyl group, and a 20-nitrooctadecyl group.

Examples of the unsubstituted branched aliphatic hydrocarbon group having 3 to 20 carbon atoms include, but not particularly limited to, an isopropyl group, an isobutyl group, a tertiary butyl group, a neopentyl group, a 2-hexyl group, a 2-octyl group, a 2-decyl group, a 2-dodecyl group, a 2-hexadecyl group, and a 2-octadecyl group.

Examples of the substituted branched aliphatic hydrocarbon group having 3 to 20 carbon atoms include, but not particularly limited to, a 1-fluoroisopropyl group and a 1-hydroxy-2-octadecyl group.

Examples of the unsubstituted cyclic aliphatic hydrocarbon group having 3 to 14 carbon atoms include, but not particularly limited to, a cyclopropyl group, a cyclobutyl group, a cyclopentyl group, a cyclohexyl group, a cyclooctyl group, a cyclodecyl group, a cyclododecyl group, a cyclohexadecyl group, and a cyclooctadecyl group.

Examples of the substituted cyclic aliphatic hydrocarbon group having 3 to 14 carbon atoms include, but not particularly limited to, a 2-fluorocyclopropyl group, a 4-cyanocyclohexyl group, a 4-methylcyclohexyl group, and a 4-ethylcyclohexyl group.

Examples of the unsubstituted aryl group having 6 to 20 carbon atoms include, but not particularly limited to, a phenyl group and a naphthyl group.

Examples of the substituted aryl group having 6 to 20 carbon atoms include, but not particularly limited to, a 4-isopropylphenyl group, a 4-methylphenyl group, and a 6-fluoronaphthyl group.

Examples of the unsubstituted aralkyl group having 7 to 30 carbon atoms include, but not particularly limited to, a 4-methylphenyl group, a 4-ethylphenyl group, a 6-methylnaphthyl group, and a 2,6-dimethylnaphthyl group.

Examples of the substituted aralkyl group having 7 to 30 carbon atoms include, but not particularly limited to, a 4-fluoro-3-methylphenyl group.

Examples of the unsubstituted alkoxy group having 1 to 20 carbon atoms include, but not particularly limited to, a methoxy group, an ethoxy group, a propoxy group, a butoxy group, a pentyloxy group, a hexyloxy group, an octyloxy group, a decyloxy group, a dodecyloxy group, a hexadecyloxy group, and an octadecyloxy group.

Examples of the substituted alkoxy group having 1 to 20 carbon atoms include, but not particularly limited to, a chloromethoxy group and a bromoethoxy group.

Examples of the unsubstituted amino group having 0 to 20 carbon atoms include, but not particularly limited to, an amino group, a methylamino group, a dimethylamino group, an ethylamino group, a diethylamino group, a dipropylamino group, and a dibutylamino group.

Examples of the substituted amino group having 0 to 20 carbon atoms include, but not particularly limited to, a chloromethylamino group and a dibromomethylamino group.

Examples of the unsubstituted alkenyl group having 2 to 20 carbon atoms include, but not particularly limited to, a vinyl group, a propynyl group, a butynyl group, a pentynyl group, a hexynyl group, an octynyl group, a decynyl group, a dodecynyl group, a hexadecynyl group, and an octadecynyl group.

Examples of the substituted alkenyl group having 2 to 20 carbon atoms include, but not particularly limited to, a chloropropynyl group.

Examples of the unsubstituted acyl group having 1 to 20 carbon atoms include, but not particularly limited to, a formyl group, an acetyl group, a propanoyl group, a butanoyl group, a pentanoyl group, a hexanoyl group, an octanoyl group, a decanoyl group, a dodecanoyl group, a hexadecanoyl group, and a benzoyl group.

Examples of the substituted acyl group having 1 to 20 carbon atoms include, but not particularly limited to, a chloroacetyl group.

Examples of the unsubstituted alkoxycarbonyl group having 2 to 20 carbon atoms include, but not particularly limited to, a methoxycarbonyl group, an ethoxycarbonyl group, a propoxycarbonyl group, a butoxycarbonyl group, a pentyloxycarbonyl group, a hexyloxycarbonyl group, an octyloxycarbonyl group, a decyloxycarbonyl group, a dodecyloxycarbonyl group, and a hexadecyloxycarbonyl group.

Examples of the substituted alkoxycarbonyl group having 2 to 20 carbon atoms include, but not particularly limited to, a chloromethoxycarbonyl group.

Examples of the unsubstituted alkyloyloxy group having 1 to 20 carbon atoms include, but not particularly limited to, a methoxycarbonyloxy group, an ethoxycarbonyloxy group, a propoxycarbonyloxy group, a butoxycarbonyloxy group, a pentyloxycarbonyloxy group, a hexyloxycarbonyloxy group, an octyloxycarbonyloxy group, a decyloxycarbonyloxy group, a dodecyloxycarbonyloxy group, and a hexadecyloxycarbonyloxy group.

Examples of the substituted alkyloyloxy group having 1 to 20 carbon atoms include, but not particularly limited to, a chloromethoxycarbonyloxy group.

Examples of the unsubstituted aryloyloxy group having 7 to 30 carbon atoms include, but not particularly limited to, a benzoyloxy group and a naphthylcarbonyloxy group.

Examples of the substituted aryloyloxy group having 7 to 30 carbon atoms include, but not particularly limited to, a chlorobenzoyloxy group.

Examples of the unsubstituted alkylsilyl group having 1 to 20 carbon atoms include, but not particularly limited to, a methylsilyl group, an ethylsilyl group, a propylsilyl group, a butylsilyl group, a pentylsilyl group, a hexylsilyl group, an octylsilyl group, a decylsilyl group, a dodecylsilyl group, a hexadecylsilyl group, and an octadecylsilyl group.

Examples of the substituted alkylsilyl group having 1 to 20 carbon atoms include, but not particularly limited to, a chloromethylsilyl group.

The molecular weights of the compounds represented by the formulas (1) and (3) are each preferably 500 to 5000, more preferably 800 to 2000, and still more preferably 1000 to 2000. Within the above range, there is a tendency to further improve resolution while maintaining film formability necessary for a resist.

The "stereoisomer" used herein will be described.

Examples of the stereoisomers of the compounds represented by the formulas (1) and (3) include (ccc) isomers, (ctt) isomers, (cct) isomers, and (tct) isomers. Specifically, the stereoisomers are 16-membered ring oligomers in which aromatic rings having two RO are cyclized via methine groups at para positions relative to each of the two RO. In this context, each of the substituents on the 4 methine groups constituting the 16-membered ring is attached to the methine group via upward or downward bond with respect to the plane of the 16-membered ring, and thus there exist cis and trans isomers (stereoisomers).

The (ccc) means a compound having a structure with steric bonds in the orientation of cis-cis-cis in the clockwise order with respect to the substituent attached to one of the methine groups.

The (ctt) means a compound having a structure with steric bonds in the orientation of cis-trans-trans in the clockwise order with respect to the substituent attached to one of the methine groups.

The (cct) means a compound having a structure with steric bonds in the orientation of cis-cis-trans in the clockwise order with respect to the substituent attached to one of the methine groups.

The (tct) means a compound having a structure with steric bonds in the orientation of trans-cis-trans in the clockwise order with respect to the substituent attached to one of the methine groups.

Calixarene is a non-polymer phenolic compound. The calixarene was discovered in the 1950s, and its synthesis method was devised. As for use of the calixarene as a radiation-sensitive composition, calixarene partially protected with an acid-labile group has been widely evaluated with a focus on positive type resist materials.

The present embodiment is effective for solving the above problems by controlling the multimode isomer structure distribution of calix[4]resorcinarene in use of these resist materials, and enables stable obtainment of a resist pattern having high solubility in a safe solvent, high sensitivity, small roughness, and a good shape.

In the present embodiment, in the formula (1), R is preferably a hydrogen atom in terms of obtaining a good resist pattern suitable for alkali developability.

In the present embodiment, in the formula (1), p is preferably 1 in terms of obtaining a good resist pattern having small roughness.

The compound represented by the formula (1) is more preferably represented by the formula (X) in terms of obtaining a good resist pattern having high sensitivity, high resolution, and small roughness.

[Formula 8]

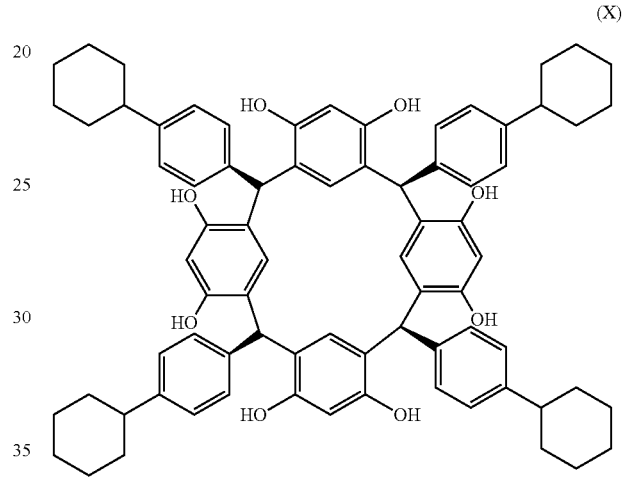

(X)

In the present embodiment, in the formula (3), R' is preferably represented by the formula (2) in terms of obtaining a good resist pattern having high sensitivity, high resolution, and small roughness. It is also preferable in terms of high etching resistance of the resulting resist pattern.

[Formula 9]

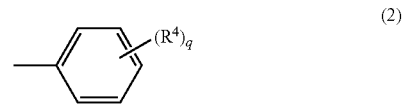

(2)

(in formula (2), $R^4$ are each independently a hydroxyl group, a cyano group, a nitro group, a substituted or unsubstituted heterocyclic group, a halogen atom, a substituted or unsubstituted linear aliphatic hydrocarbon group having 1 to 14 carbon atoms, a substituted or unsubstituted branched aliphatic hydrocarbon group having 3 to 14 carbon atoms, a substituted cyclic aliphatic hydrocarbon group having 3 to 14 carbon atoms, a substituted or unsubstituted aryl group having 6 to 14 carbon atoms, a substituted or unsubstituted alkoxy group having 1 to 14 carbon atoms, or a substituted or unsubstituted alkylsilyl group having 1 to 14 carbon atoms; and q is an integer of 0 to 5.)

In the formula (3), R is more preferably a hydrogen atom in terms of obtaining a good resist pattern suitable for alkali developability.

The compound represented by the formula (3) preferably has 70 mol % or more of a ctt form or a ccc form thereof from the viewpoint of a resist pattern shape.

The compound represented by the formula (3) is preferably at least one selected from the compound group given below in terms of obtaining a good resist pattern having high sensitivity, high resolution, and small roughness. It is also preferable in terms of high etching resistance of the resulting resist pattern.

[Formula 10-1]

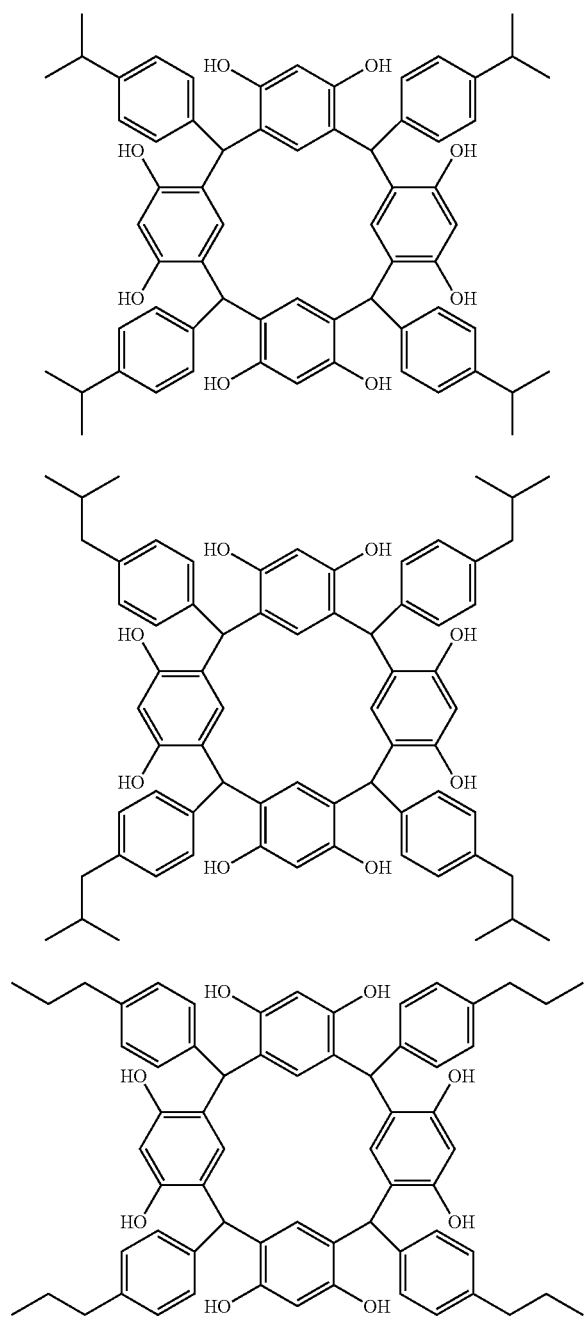

[Formula 10-2]

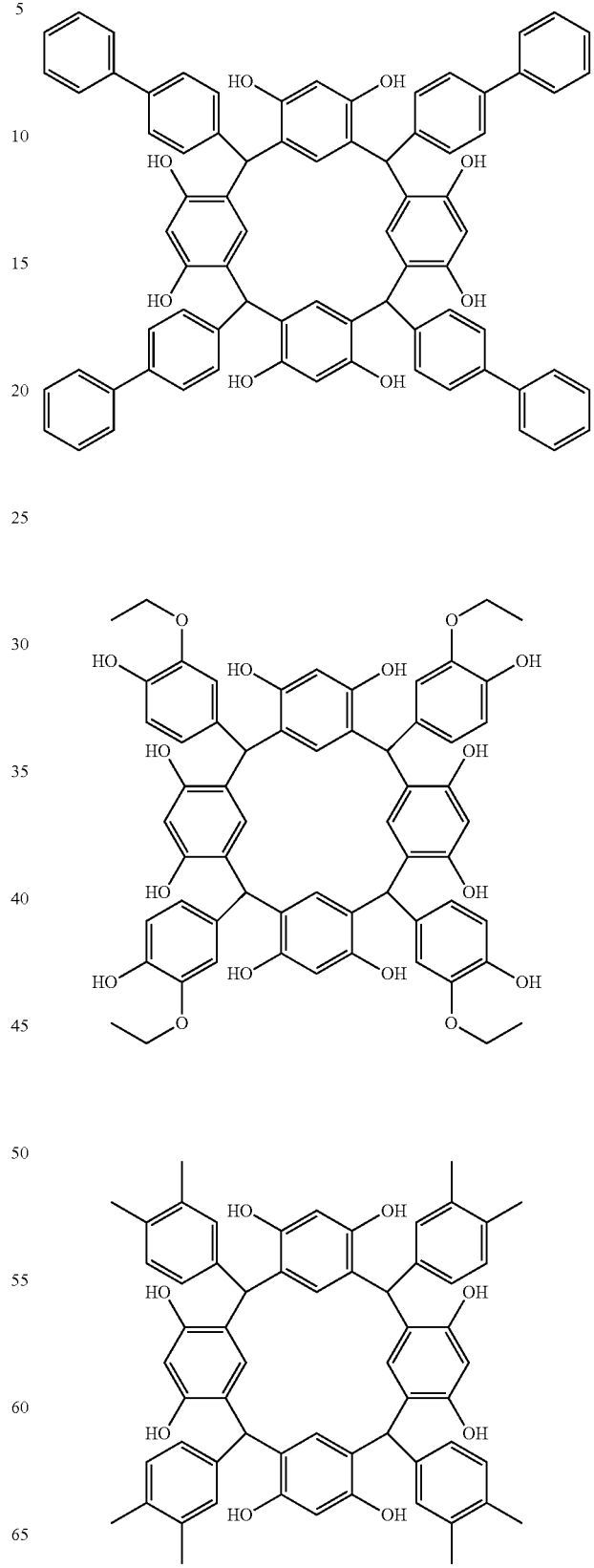

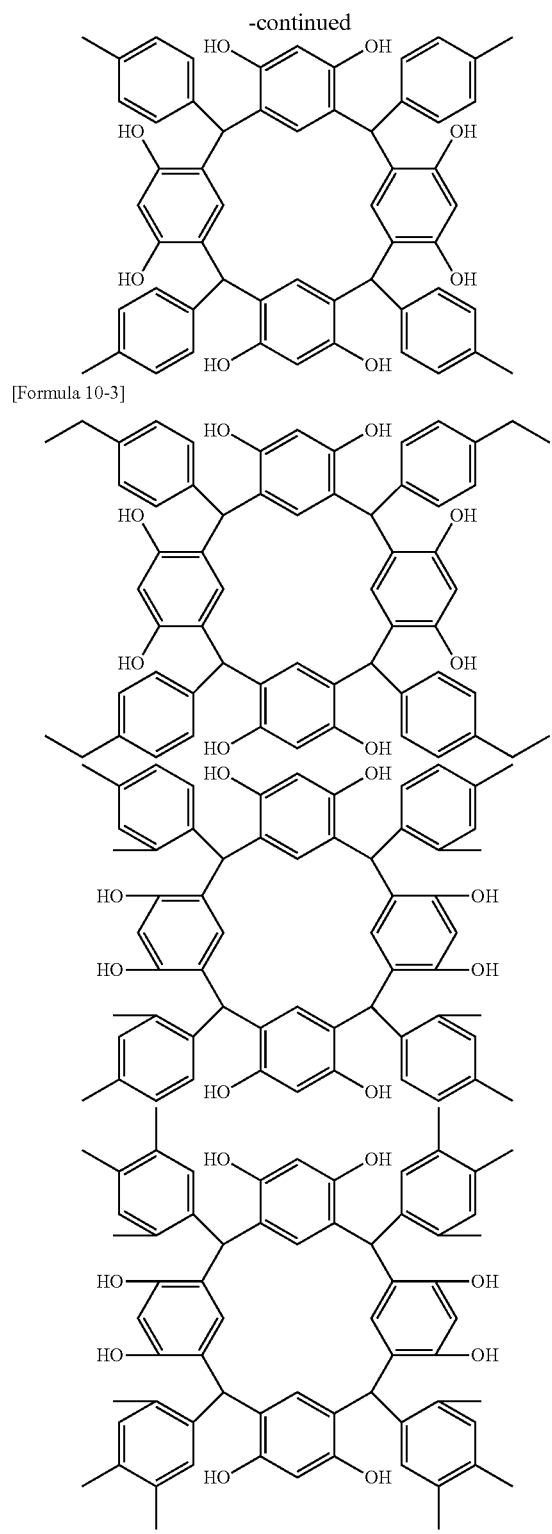

[Formula 10-3]

The compounds represented by the formulas (1) and (3) are each obtained by, but not limited to, for example, a condensation reaction of one or more compounds selected from the group consisting of aldehydic compounds (A1) with one or more compounds selected from the group consisting of phenolic compounds (A2).

More preferably, the aldehydic compound (A1) is a compound having 2 to 59 carbon atoms and has a monovalent group containing 1 to 4 formyl groups, and the phenolic compound (A2) is a compound having 6 to 15 carbon atoms and has 1 to 3 phenolic hydroxyl groups.

Still more preferably, the aldehydic compound (A1) has 3 to 59 carbon atoms and a monovalent group containing 1 to 4 formyl groups, and is selected from an aromatic aldehydic compound (A1A) and an aliphatic aldehydic compound (A1B). The aromatic aldehydic compound (A1A) is preferably a benzaldehyde compound having 7 to 24 carbon atoms, and is, for example, benzaldehyde having 7 to 24 carbon atoms and a substituent containing at least one alicyclic or aromatic ring other than the aromatic ring of benzaldehyde. Examples thereof include, but not limited to, methylbenzaldehyde, ethylbenzaldehyde, propylbenzaldehyde, butylbenzaldehyde, cyclopropylbenzaldehyde, cyclobutanebenzaldehyde, cyclopentanebenzaldehyde, cyclohexanebenzaldehyde, phenylbenzaldehyde, naphthylbenzaldehyde, adamantylbenzaldehyde, norbornylbenzaldehyde, and lactylbenzaldehyde. Propylbenzaldehyde, cyclohexylbenzaldehyde, and phenylbenzaldehyde are preferable, and propylbenzaldehyde and cyclohexylbenzaldehyde are more preferable. The aromatic aldehydic compound (A1A) may have a linear or branched alkyl group having 1 to 4 carbon atoms, a cyano group, a hydroxyl group, halogen or the like, within the range of not deteriorating the effect of the present embodiment. The aromatic aldehydic compound (A1A) may be used alone or in combination of two or more kinds. The aliphatic aldehydic compound (A1B) may have a cyano group, a hydroxyl group, halogen or the like, within the range of not deteriorating the effect of the present embodiment. The aliphatic aldehydic compound (A1B) may be used alone or in combination of two or more kinds.

The phenolic compound (A2) preferably has 6 to 15 carbon atoms and preferably has 1 to 3 phenolic hydroxyl groups. Examples of the phenolic compound (A2) include, but not limited to, phenol, catechol, resorcinol, hydroquinone, pyrogallol, 3-methoxyphenol, 3-ethoxyphenol, 3-cyclohexyloxyphenol, 1,3-dimethoxybenzene, 1,3-diethoxybenzene, and 1,3-dicyclohexyloxybenzene. Resorcinol, pyrogallol, 3-methoxyphenol, 3-ethoxyphenol, 3-cyclohexyloxyphenol, 1,3-dimethoxybenzene, 1,3-diethoxybenzene, and 1,3-dicyclohexyloxybenzene are preferable, and resorcinol is more preferable. The phenolic compound (A2) may have a linear or branched alkyl group having 1 to 4 carbon atoms, a cyano group, a hydroxyl group, halogen or the like, within the range of not deteriorating the effect of the present embodiment. The phenolic compound (A2) may be used alone or in combination of two or more kinds.

The compounds represented by the above formulas (1) and (3) are each obtained by, but not limited to, for example, reacting 0.1 to 10 mol of the phenolic compound (A2) with 1 mol of the aldehydic compound (A1) at 40 to 150° C. for about 0.5 to 20 hours in the presence of an acid catalyst (hydrochloric acid, sulfuric acid, or p-toluenesulfonic acid, etc.) in an organic solvent such as methanol or ethanol, and subsequently conducting filtration, washing with an alcohol such as methanol, washing with water, and separation by filtration, followed by drying. They may be obtained by a similar reaction using a basic catalyst (sodium hydroxide, barium hydroxide, or 1,8-diazabicyclo[5.4.0]undecene-7, etc.) instead of the acid catalyst. Alternatively, each of the compounds used in the present embodiment can also be produced by converting the above aldehydic compound (A1) to a dihalide with hydrogen halide or halogen gas, and reacting the isolated dihalide with the phenolic compound (A2).

If required, the compounds represented by the formulas (1) and (3) may be purified for the purpose of improving their purity and reducing the amount of residual metals. If the acid catalyst and a co-catalyst remain, the storage stability of the resist composition is generally reduced. Alternatively, if the basic catalyst remains, the sensitivity of the resist composition is generally reduced. Therefore, purification aimed at reducing them may be conducted.

The purification method can be conducted by a publicly known method as long as the compounds used are not denatured. Examples thereof include, but not particularly limited to, a method using recrystallization, a method involving washing with water, a method involving washing with an acidic aqueous solution, a method involving washing with a basic aqueous solution, a method involving treatment with an ion exchange resin, and a method involving treatment by silica gel column chromatography. These purification methods are more preferably conducted in combination of two or more kinds.

The acidic aqueous solution, the basic aqueous solution, the ion exchange resin, and the silica gel column chromatography can be appropriately selected so as to be optimal according to the metals to be removed, the amounts or types of acidic and basic compounds, the types and stereoisomers of the compounds to be purified, etc. Examples of the acidic aqueous solution include aqueous solutions of hydrochloric acid, nitric acid, or acetic acid having a concentration of 0.01 to 10 mol/L. Examples of the basic aqueous solution include aqueous solutions of ammonia having a concentration of 0.01 to 10 mol/L. Examples of the ion exchange resin include cationic exchange resins, for example, Amberlyst 15J-HG Dry manufactured by Organo Corp.

The compounds thus purified may be dried. The drying can be conducted by a publicly known method. Examples thereof include, but not particularly limited to, a method of conducting drying in vacuum, drying in hot air, or drying by blowing under conditions of not denaturing the compounds used.

The compounds represented by the formulas (1) and (3) are capable of forming an amorphous film by spin coating. Also, they can be applied to a general semiconductor production process.

The compounds represented by the above formulas (1) and (3) are useful as negative type resist materials that become compounds poorly soluble in a developing solution by irradiation with KrF excimer laser, extreme ultraviolet, electron beam, or X-ray. As a reason for the above, it is assumed that a blend of the compounds is irradiated with KrF excimer laser, extreme ultraviolet, electron beam, or X-ray, thereby inducing a condensation reaction between the compounds to form compounds poorly soluble in an alkaline developing solution. The resist pattern thus obtained has very small LER (line edge roughness).

The compounds represented by the formulas (1) and (3) can be used as main components for a negative type resist composition. In addition, they can be added to a resist composition as additives, for example, for improving sensitivity or improving etching resistance. In this case, the blend of the compounds is preferably used at 1 to 49.999% by mass of the total mass of the solid component of the resist composition.

The glass transition temperatures of the compounds represented by the formulas (1) and (3) are preferably 100° C. or higher, more preferably 120° C. or higher, still more preferably 140° C. or higher, and particularly preferably 150° C. or higher. When the glass transition temperatures fall within the above range, there is a tendency to have heat resistance capable of maintaining a pattern shape in a semiconductor lithography process and to further improve performance such as high resolution.

The crystallization heat generation amount determined by the differential scanning calorimetry of the glass transition temperatures of the compounds represented by the formulas (1) and (3) is preferably less than 20 J/g. (Crystallization temperature)—(Glass transition temperature) is preferably 70° C. or more, more preferably 80° C. or more, still more preferably 100° C. or more, and particularly preferably 130° C. or more. When the crystallization heat generation amount is less than 20 J/g or (Crystallization temperature)—(Glass transition temperature) falls within the above range, there is a tendency to facilitate forming an amorphous film by the spin coating of the resist composition and to be able to secure film formability necessary for a resist over a long period, thereby further improving resolution.

In the present embodiment, the crystallization heat generation amount, the crystallization temperature, and the glass transition temperature can be determined by differential scanning calorimetry using DSC/TA-50WS manufactured by Shimadzu Corp. About 10 mg of a sample is placed in a non-sealed container made of aluminum, and the temperature is raised to the melting point or higher at the rate of temperature rise of 20° C./min in a nitrogen gas stream (50 mL/min). After quenching, again the temperature is raised to the melting point or higher at the rate of temperature rise of 20° C./min in a nitrogen gas stream (30 mL/min). After further quenching, again the temperature is raised to 400° C. at the rate of temperature rise of 20° C./min in a nitrogen gas stream (30 mL/min). The temperature at the middle point (where the specific heat is changed into the half) of steps in the baseline shifted in a step-like pattern is defined as the glass transition temperature (Tg). The temperature of the subsequently appearing exothermic peak is defined as the crystallization temperature. The heat is determined from the area of a region surrounded by the exothermic peak and the baseline and defined as the crystallization heat generation amount.

The compounds represented by the formulas (1) and (3) preferably have a low sublimation property at 100° C. or lower, preferably 120° C. or lower, more preferably 130° C. or lower, still more preferably 140° C. or lower, and particularly preferably 150° C. or lower under normal pressure. The low sublimation property means that in thermogravimetry, weight reduction when the compounds are kept at a predetermined temperature for 10 minutes is 10% or less, preferably 5% or less, more preferably 3% or less, still more preferably 1% or less, and particularly preferably 0.1% or less. Having the low sublimation property can prevent an exposure apparatus from being contaminated by outgassing upon exposure. In addition, low LER and a good pattern shape can be obtained.

The compounds represented by the formulas (1) and (3) preferably satisfy F<3.0 (F represents Total number of atoms/(Total number of carbon atoms—Total number of oxygen atoms)) and more preferably satisfy F<2.5. When the above conditions are satisfied, there is a tendency to be excellent in dry etching resistance.

The solvent according to the present embodiment is selected from propylene glycol monomethyl ether acetate (PGMEA), propylene glycol monomethyl ether (PGME), cyclohexanone (CHN), cyclopentanone (CPN), 2-heptanone, anisole, butyl acetate, ethyl propionate, and ethyl lactate and preferably exhibits the highest ability to dissolve the blend of the compounds represented by the formulas (1) and (3). In this case, the dissolution amount of the compounds represented by the formulas (1) and (3) is preferably 1% by mass or more, more preferably 5% by mass or more, and still more preferably 10% by mass or more at 23° C. Among the solvents described above, the solvent according to the present embodiment is selected from PGMEA, PGME, and CHN and more preferably exhibits the highest ability to dissolve the compounds represented by the formulas (1) and (3). In this case, the dissolution amount of the compounds represented by the formulas (1) and (3) is preferably 20% by mass or more at 23° C. Among the solvents described above, PGMEA is still more preferable. In this case, the dissolution amount of the compounds represented by the formulas (1) and (3) is preferably 20% by mass or more at 23° C. When the above conditions are satisfied, there is a tendency to improve usefulness in a semiconductor production process in actual production.

To the compounds represented by the formulas (1) and (3), within the range of not deteriorating the effect of the present embodiment, nitrogen atoms may be introduced. The proportion of the number of nitrogen atoms to the total number of atoms constituting the compounds represented by the formulas (1) and (3) is preferably from 0.1 to 40%, more preferably from 0.1 to 20%, still more preferably from 0.1 to 10%, and particularly preferably from 0.1 to 5%. Within the above range, there is a tendency to further reduce the line edge roughness of the resulting resist pattern. The introduced nitrogen atoms are preferably secondary or tertiary nitrogen atoms and more preferably tertiary nitrogen atoms.

To the compounds represented by the formulas (1) and (3), within the range of not deteriorating the effect of the present embodiment, a crosslinking reactive group causing a crosslinking reaction by irradiation with at least one of visible light, ultraviolet, excimer laser, electron beam, extreme ultraviolet (EUV), X-ray, and ion beam or by a chemical reaction induced by any of these may be introduced. The introduction is not limited, but is conducted, for example, by reacting the compounds represented by the formulas (1) and (3) with a crosslinking reactive group introduction reagent in the presence of a basic catalyst. Examples of the crosslinking reactive group include, but not limited to, a carbon-carbon multiple bond, an epoxy group, an azide group, a phenyl halide group, and a chloromethyl group. Examples of the crosslinking reactive group introduction reagent include, but not limited to, acids, acid chlorides, acid anhydrides, carboxylic acid derivatives (e.g., dicarbonate) and alkyl halides having such a crosslinking reactive group. The resist composition comprising the compound having the crosslinking reactive group is also useful as a non-polymer resist composition having high resolution, high heat resistance, and solubility in a solvent.

To at least one phenolic hydroxyl group of the compounds represented by the formulas (1) and (3), within the range of not deteriorating the effect of the present embodiment, a non-acid dissociation functional group may be introduced. The non-acid dissociation functional group refers to a characteristic group that does not generate an alkali soluble group because it is not cleaved in the presence of an acid. Examples of the non-acid dissociation functional group include, but not limited to, a functional group selected from the group consisting of a C1-20 alkyl group, a C3-20 cycloalkyl group, a C6-20 aryl group, a C1-20 alkoxyl group, a cyano group, a nitro group, a hydroxyl group, a heterocyclic group, halogen, a carboxyl group, a C1-20 alkylsilane, and their derivatives, which are not decomposed by the action of an acid.

To a phenolic hydroxyl group of the compounds represented by the formulas (1) and (3), within the range of not deteriorating the effect of the present embodiment, a naphthoquinone diazide ester group may be introduced. A blend in which the naphthoquinone diazide ester group is introduced in at least one phenolic hydroxyl group of the compounds represented by the formulas (1) and (3) can be used in itself as a main component for a negative type resist composition. In addition, this blend can be used as a main component for a positive type radiation-sensitive composition or can be added as an acid generating agent or an additive to a resist composition.

To at least one phenolic hydroxyl group of the compounds represented by the formulas (1) and (3), within the range of not deteriorating the effect of the present embodiment, an acid generating functional group capable of generating an acid by irradiation with a radiation may be introduced. A blend in which the acid generating functional group is introduced in at least one phenolic hydroxyl group of the compounds represented by the formulas (1) and (3) can be used in itself as a main component for a negative type resist composition. In addition, this blend can be added as an additive to a resist composition.

To at least one phenolic hydroxyl group of the compounds represented by the formulas (1) and (3), within the range of not deteriorating the effect of the present embodiment, an acid dissociation functional group causing dissociation in the presence of an acid may be introduced. In the case of using a polar solvent such as a ketone-based solvent, an ester-based solvent, an alcohol-based solvent, an amide-based solvent, and an ether-based solvent, or a hydrocarbon-based solvent mentioned later as a developing solution, a blend in which the acid dissociation functional group is introduced in at least one phenolic hydroxyl group of the compounds represented by the formulas (1) and (3) can be used in itself as a main component for a negative type resist composition. In the case of using an alkaline developing solution, the blend itself can be used as a main component for a positive type resist composition. In either case, it can be added as an additive to a resist composition.

In the present embodiment, the acid dissociation functional group refers to a characteristic group that generates an alkali soluble group through cleavage in the presence of an acid. Examples of the alkali soluble group include, but not limited to, a phenolic hydroxyl group, a carboxyl group, a sulfonic acid group, and a hexafluoroisopropanol group. A phenolic hydroxyl group and a carboxyl group are preferable, and a phenolic hydroxyl group is particularly preferable. The acid dissociation functional group can be appropriately selected for use from among those proposed for hydroxystyrene-based resins, (meth)acrylic acid-based resins or the like for use in chemical amplification type resist compositions for KrF or ArF. Examples of such an acid dissociation functional group include, but not limited to, a substituted methyl group, a 1-substituted ethyl group, a 1-substituted n-propyl group, a 1-branched alkyl group, a silyl group, an acyl group, a 1-substituted alkoxymethyl group, a cyclic ether group, an alkoxycarbonyl group, and an alkoxycarbonylalkyl group. The acid dissociation functional group is preferably free from a crosslinkable functional group.

The substituted methyl group is usually a substituted methyl group having 2 to 20 carbon atoms, preferably a substituted methyl group having 4 to 18 carbon atoms, and more preferably a substituted methyl group having 6 to 16 carbon atoms. Examples of the substituted methyl group can include, but not limited to, a methoxymethyl group, a methylthiomethyl group, an ethoxymethyl group, a n-propoxymethyl group, an isopropoxymethyl group, a n-butoxymethyl group, a t-butoxymethyl group, a 2-methylpropoxymethyl group, an ethylthiomethyl group, a methoxyethoxymethyl group, a phenyloxymethyl group, a 1-cyclopentyloxymethyl group, a 1-cyclohexyloxymethyl group, a benzylthiomethyl group, a phenacyl group, a 4-bromophenacyl group, a 4-methoxyphenacyl group, a piperonyl group, and a substituent represented by the formula (13-1) given below. In the following formula (13-1), examples of the alkyl group represented by R² include, but not particularly limited to, a methyl group, an ethyl group, an isopropyl group, a n-propyl group, a t-butyl group, and a n-butyl group.

[Formula 11]

(13-1)

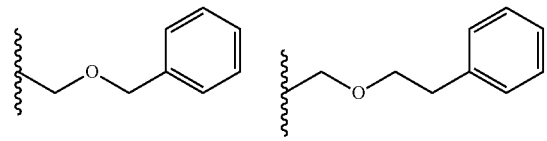

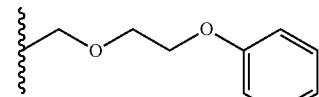

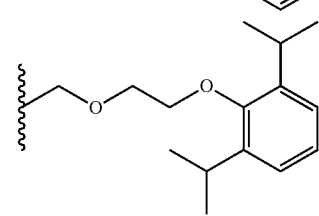

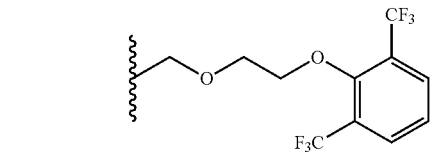

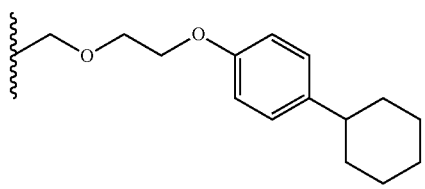

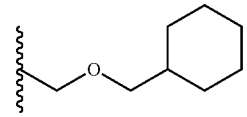

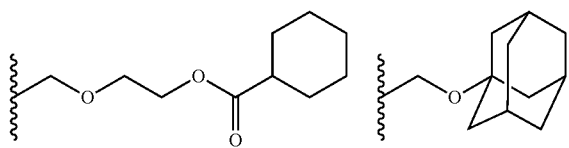

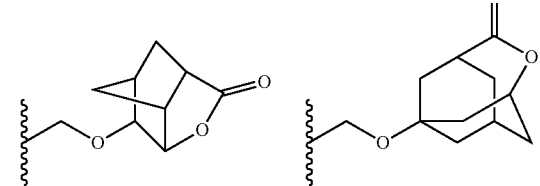

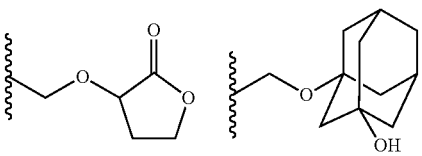

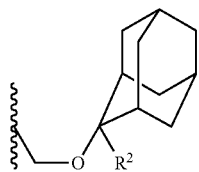

(in formula (13-1), R² is an alkyl group having 1 to 4 carbon atoms.)

The 1-substituted ethyl group is usually a 1-substituted ethyl group having 3 to 20 carbon atoms, preferably a 1-substituted ethyl group having 5 to 18 carbon atoms, and more preferably a substituted ethyl group having 7 to 16 carbon atoms. Examples of the 1-substituted ethyl group can include, but not limited to, a 1-methoxyethyl group, a 1-methylthioethyl group, a 1,1-dimethoxyethyl group, a 1-ethoxyethyl group, a 1-ethylthioethyl group, a 1,1-diethoxyethyl group, a n-propoxyethyl group, an isopropoxyethyl group, a n-butoxyethyl group, a t-butoxyethyl group, a 2-methylpropoxyethyl group, a 1-phenoxyethyl group, a 1-phenylthioethyl group, a 1,1-diphenoxyethyl group, a 1-cyclopentyloxyethyl group, a 1-cyclohexyloxyethyl group, a 1-phenylethyl group, a 1,1-diphenylethyl group, and a substituent represented by the following formula (13-2).

[Formula 12]

(13-2)

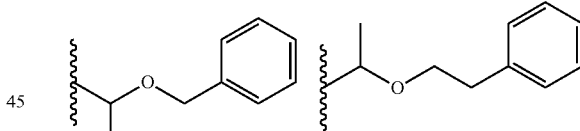

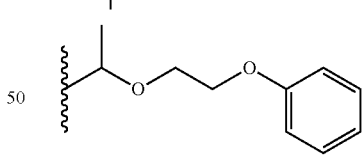

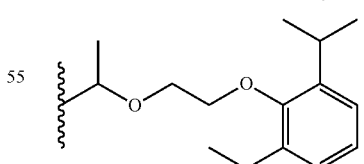

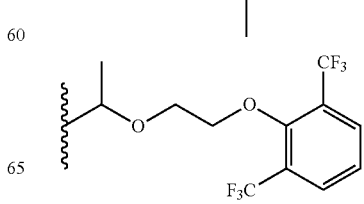

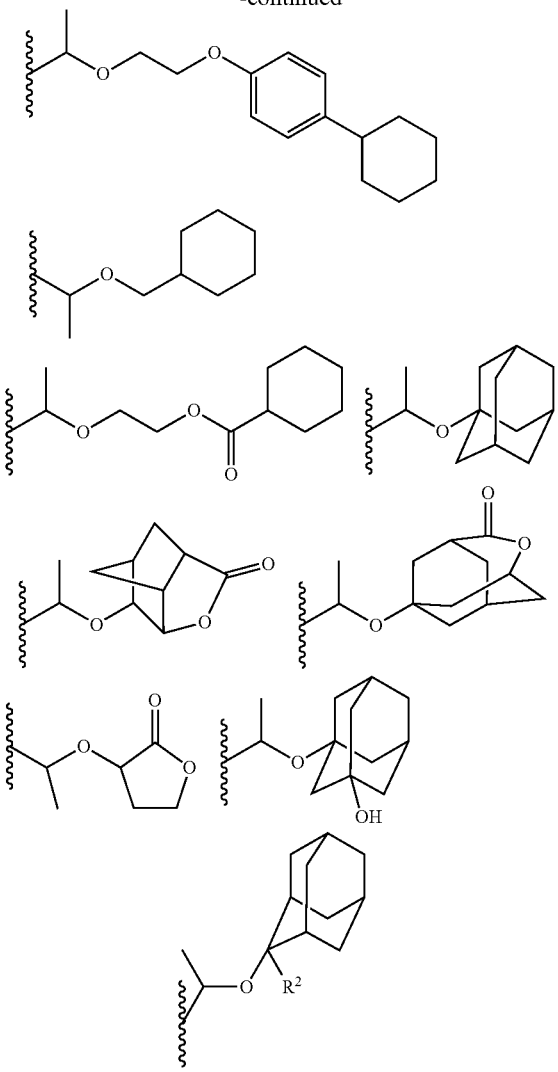

(in formula (13-2), $R^2$ is the same as $R^2$ in the formula (13-1).)

The 1-substituted n-propyl group is usually a 1-substituted n-propyl group having 4 to 20 carbon atoms, preferably a 1-substituted n-propyl group having 6 to 18 carbon atoms, and more preferably a 1-substituted n-propyl group having 8 to 16 carbon atoms. Examples of the 1-substituted n-propyl group can include, but not limited to, a 1-methoxy-n-propyl group and a 1-ethoxy-n-propyl group.

The 1-branched alkyl group is usually a 1-branched alkyl group having 3 to 20 carbon atoms, preferably a 1-branched alkyl group having 5 to 18 carbon atoms, and more preferably a branched alkyl group having 7 to 16 carbon atoms. Examples of the 1-branched alkyl group can include, but not limited to, an isopropyl group, a sec-butyl group, a tert-butyl group, a 1,1-dimethylpropyl group, a 1-methylbutyl group, a 1,1-dimethylbutyl group, a 2-methyladamantyl group, and a 2-ethyladamantyl group.

The silyl group is usually a silyl group having 1 to 20 carbon atoms, preferably a silyl group having 3 to 18 carbon atoms, and more preferably a silyl group having 5 to 16 carbon atoms. Examples of the silyl group can include, but not limited to, a trimethylsilyl group, an ethyldimethylsilyl group, a methyldiethylsilyl group, a triethylsilyl group, a tert-butyldimethylsilyl group, a tert-butyldiethylsilyl group, a tert-butyldiphenylsilyl group, a tri-tert-butylsilyl group, and a triphenylsilyl group.

The acyl group is usually an acyl group having 2 to 20 carbon atoms, preferably an acyl group having 4 to 18 carbon atoms, and more preferably an acyl group having 6 to 16 carbon atoms. Examples of the acyl group can include, but not limited to, an acetyl group, a phenoxyacetyl group, a propionyl group, a butyryl group, a heptanoyl group, a hexanoyl group, a valeryl group, a pivaloyl group, an isovaleryl group, a lauroyl group, an adamantylcarbonyl group, a benzoyl group, and a naphthoyl group.

The 1-substituted alkoxymethyl group is usually a 1-substituted alkoxymethyl group having 2 to 20 carbon atoms, preferably a 1-substituted alkoxymethyl group having 4 to 18 carbon atoms, and more preferably a 1-substituted alkoxymethyl group having 6 to 16 carbon atoms. Examples of the 1-substituted alkoxymethyl group can include, but not limited to, a 1-cyclopentylmethoxymethyl group, a 1-cyclopentylethoxymethyl group, a 1-cyclohexylmethoxymethyl group, a 1-cyclohexylethoxymethyl group, a 1-cyclooctylmethoxymethyl group, and a 1-adamantylmethoxymethyl group.

The cyclic ether group is usually a cyclic ether group having 2 to 20 carbon atoms, preferably a cyclic ether group having 4 to 18 carbon atoms, and more preferably a cyclic ether group having 6 to 16 carbon atoms. Examples of the cyclic ether group can include, but not limited to, a tetrahydropyranyl group, a tetrahydrofuranyl group, a tetrahydrothiopyranyl group, a tetrahydrothiofuranyl group, a 4-methoxytetrahydropyranyl group, and a 4-methoxytetrahydrothiopyranyl group.

The alkoxycarbonyl group is usually an alkoxycarbonyl group having 2 to 20 carbon atoms, preferably an alkoxycarbonyl group having 4 to 18 carbon atoms, and more preferably an alkoxycarbonyl group having 6 to 16 carbon atoms. Examples of the alkoxycarbonyl group can include, but not limited to, a methoxycarbonyl group, an ethoxycarbonyl group, a n-propoxycarbonyl group, an isopropoxycarbonyl group, a n-butoxycarbonyl group, a tert-butoxycarbonyl group, and an acid dissociation functional group represented by the formula (13-3) given below wherein n=0.

The alkoxycarbonylalkyl group is usually an alkoxycarbonylalkyl group having 2 to 20 carbon atoms, preferably an alkoxycarbonylalkyl group having 4 to 18 carbon atoms, and more preferably an alkoxycarbonylalkyl group having 6 to 16 carbon atoms. Examples of the alkoxycarbonylalkyl group can include, but not limited to, a methoxycarbonylmethyl group, an ethoxycarbonylmethyl group, a n-propoxycarbonylmethyl group, an isopropoxycarbonylmethyl group, a n-butoxycarbonylmethyl group, and an acid dissociation functional group represented by the formula (13-3) given below wherein n=1 to 4.

[Formula 13]

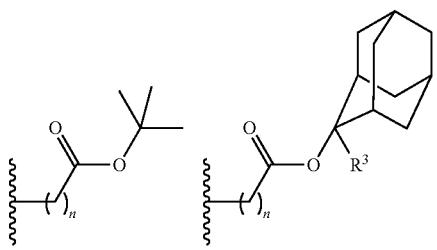

(13-3)

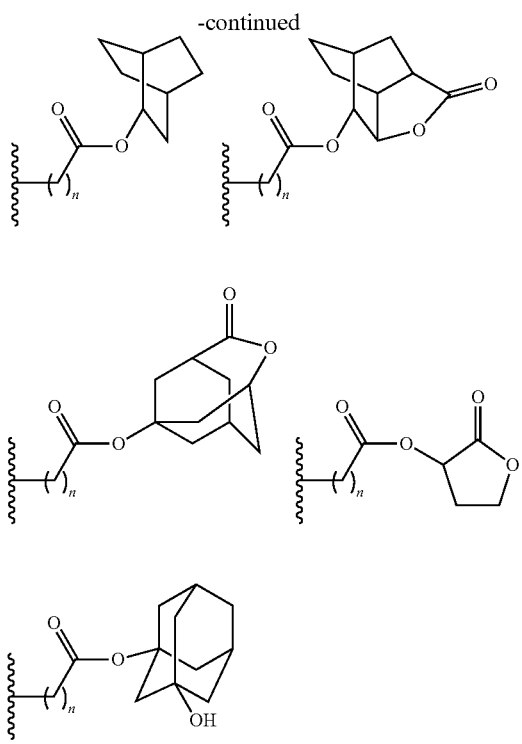

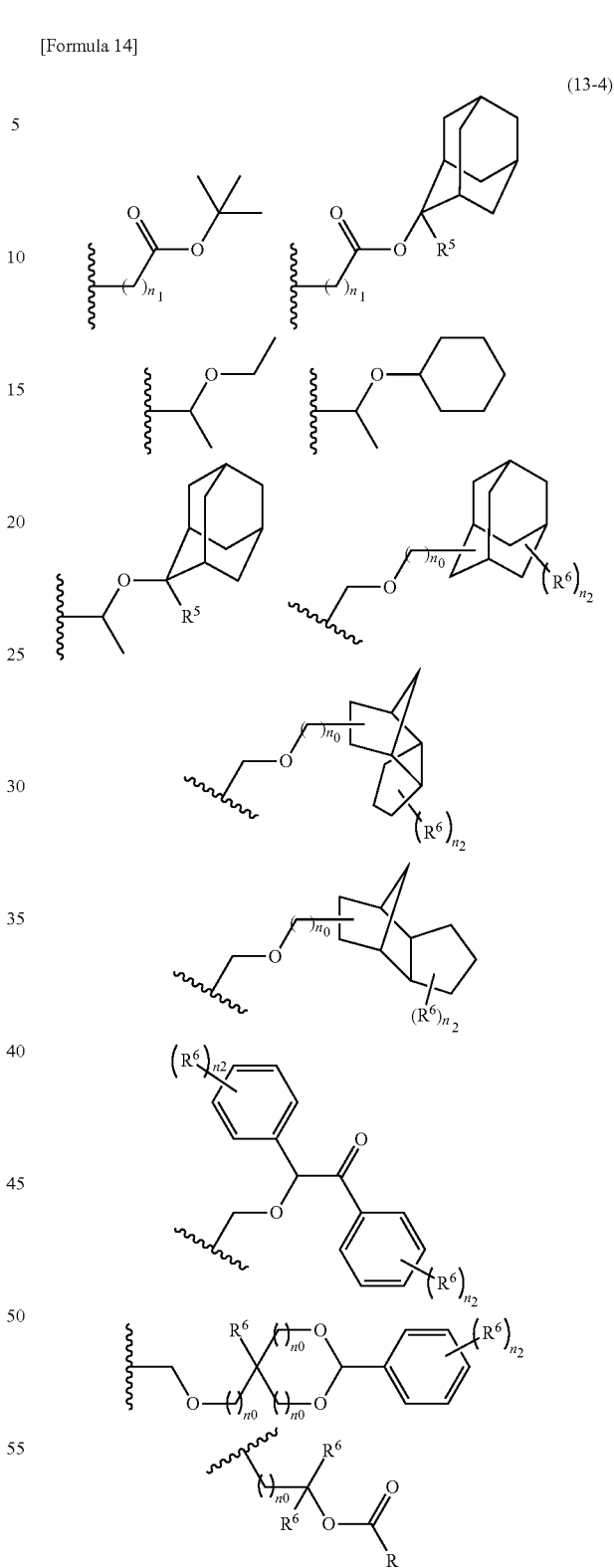

[Formula 14]

(in formula (13-3), $R^3$ is hydrogen or a linear or branched alkyl group having 1 to 4 carbon atoms; and n is an integer of 0 to 4.)

Of these acid dissociation functional groups, a substituted methyl group, a 1-substituted ethyl group, a 1-substituted alkoxymethyl group, a cyclic ether group, an alkoxycarbonyl group, and an alkoxycarbonylalkyl group are preferable, a substituted methyl group, a 1-substituted ethyl group, an alkoxycarbonyl group, and an alkoxycarbonylalkyl group are more preferable because of high sensitivity, and an acid dissociation functional group having a structure selected from cycloalkane having 3 to 12 carbon atoms, lactone, and an aromatic ring having 6 to 12 carbon atoms is still more preferable. The cycloalkane having 3 to 12 carbon atoms may be a monocyclic ring or a polycyclic ring, but is preferably a polycyclic ring. Specific examples of the cycloalkane having 3 to 12 carbon atoms include, but not limited to, monocycloalkane, bicycloalkane, tricycloalkane, and tetracycloalkane and more specifically include: monocycloalkane such as cyclopropane, cyclobutane, cyclopentane, and cyclohexane; and polycycloalkane such as adamantane, norbornane, isobornane, tricyclodecane, and tetracyclodecane. Among them, adamantane, tricyclodecane, and tetracyclodecane are preferable, and adamantane and tricyclodecane are particularly preferable. The cycloalkane having 3 to 12 carbon atoms may have a substituent. Examples of the lactone include a cycloalkane group having 3 to 12 carbon atoms and a butyrolactone or lactone group. Examples of the aromatic ring having 6 to 12 carbon atoms include a benzene ring, a naphthalene ring, an anthracene ring, a phenanthrene ring, and a pyrene ring. A benzene ring and a naphthalene ring are preferable, and a naphthalene ring is particularly preferable.

An acid dissociation functional group selected from the group consisting of groups each represented by the following formula (13-4) is particularly preferable because of high resolution.

(in formula (13-4), $R^5$ is hydrogen or a linear or branched alkyl group having 1 to 4 carbon atoms; $R^6$ is hydrogen, a linear or branched alkyl group having 1 to 4 carbon atoms, a cyano group, a nitro group, a heterocyclic group, halogen, or a carboxyl group; $n_1$ is an integer of 0 to 4; $n_2$ is an integer of 1 to 5; and $n_0$ is an integer of 0 to 4.)

The resist composition of the present embodiment comprises a solid component comprising a resist base material, and a solvent, and the resist base material comprises a compound represented by the formula (1) and a compound represented by the formula (3). The resist composition of the present embodiment comprises 1 to 80% by mass of the solid component and 20 to 99% by mass of the solvent. The resist composition of the present embodiment more preferably comprises 1 to 50% by mass of the solid component and 50 to 99% by mass of the solvent, still more preferably comprises 1 to 40% by mass of the solid component and 60 to 99% by mass of the solvent, and particularly preferably comprises 1 to 10% by mass of the solid component and 90 to 99% by mass of the solvent.

The proportion of the compound represented by the formula (1) to the resist base material is from 65 to 99% by mass and is preferably from 70 to 99% by mass, more preferably from 80 to 99% by mass, and still more preferably from 90 to 99% by mass from the viewpoint of a resist pattern shape.

The mass ratio of the compound represented by the formula (3) to the compound represented by the formula (1) is from 0.01 to 0.53 and is preferably from 0.01 to 0.30, more preferably from 0.01 to 0.20, and still more preferably from 0.01 to 0.15 from the viewpoint of a resist pattern shape.

The resist composition of the present embodiment can form an amorphous film by spin coating. The dissolution rate of the amorphous film formed by spin coating with the resist composition of the present embodiment in a developing solution at 23° C. is preferably 10 angstrom/sec or more, more preferably 10 to 10000 angstrom/sec, and still more preferably 100 to 1000 angstrom/sec. When the dissolution rate is 10 angstrom/sec or more, there is a tendency to improve solubility in a developing solution and to achieve a better resist. When the amorphous film has the dissolution rate of 10000 angstrom/sec or less, the resolution may improve. It is presumed that this is because due to the change in the solubility before and after exposure of the blend of the compound, contrast at the interface between the unexposed portion being dissolved in a developing solution and the exposed portion not being dissolved in a developing solution is increased. There are also reduction effects of LER and defect.

The dissolution rate of the portion exposed by radiation such as KrF excimer laser, extreme ultraviolet, electron beam or X-ray, of the amorphous film formed by spin coating with the resist composition of the present embodiment, in a developing solution at 23° C. is preferably 5 angstrom/sec or less, more preferably 0.05 to 5 angstrom/sec, and still more preferably 0.0005 to 5 angstrom/sec. The dissolution rate of the amorphous film heated at 20 to 250° C. in a developing solution is the same as above. When the dissolution rate is 5 angstrom/sec or less, there is a tendency to render the amorphous film more insoluble in a developing solution and to achieve a better resist. When the amorphous film has the dissolution rate of 0.0005 angstrom/sec or more, the resolution may improve. It is presumed that this is because the micro surface portion of the blend of the compound dissolves and LER is reduced. There is also a reduction effect of defect.

Based on the total mass of the solid component (summation of optionally used solid component such as resist base material, acid generating agent (C), acid crosslinking agent (G), acid diffusion controlling agent (E), and optional component (F), hereinafter the same), the content of the resist base material is preferably 20 to 99.498% by mass, more preferably 30 to 90% by mass, still more preferably 40 to 80% by mass, and particularly preferably 50 to 70% by mass. In the case of the above content, there is a tendency to obtain higher resolution and to further decrease line edge roughness.

The resist composition of the present embodiment preferably contains one or more acid generating agents (C) generating an acid directly or indirectly by irradiation of any radiation selected from visible light, ultraviolet, excimer laser, electron beam, extreme ultraviolet (EUV), X-ray, and ion beam. The amount of the acid generating agent (C) used is preferably 0.001 to 49% by mass of the total mass of the solid component, more preferably 1 to 40% by mass, still more preferably 3 to 30% by mass, and particularly preferably 10 to 25% by mass. By using it within the above range, there is a tendency that a pattern profile with higher sensitivity and low edge roughness can be obtained. In the present embodiment, the acid generation method is not particularly limited as long as an acid is generated within a system. By using excimer laser instead of ultraviolet such as g-ray and i-ray, finer processing is possible, and also by using electron beam, extreme ultraviolet, X-ray or ion beam as a high energy ray, further finer processing is possible.

The acid generating agent (C) is preferably at least one kind selected from the group consisting of compounds represented by the following formulae (7-1) to (7-8):

[Formula 15]

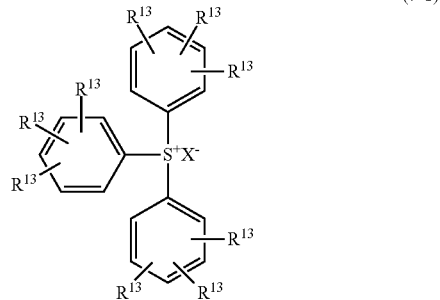

(7-1)

(in formula (7-1), $R^{13}$ may be the same or different, and are each independently a hydrogen atom, a linear, branched or cyclic alkyl group, a linear, branched or cyclic alkoxy group, a hydroxyl group, or a halogen atom; $X^-$ is an alkyl group, an aryl group, a sulfonic acid ion having a halogen substituted alkyl group or a halogen substituted aryl group, or a halide ion.)

The compound represented by the above formula (7-1) is, but not particularly limited to, preferably at least one kind selected from the group consisting of triphenylsulfonium trifluoromethanesulfonate, triphenylsulfonium nonafluoro-n-butanesulfonate, diphenyltolylsulfonium nonafluoro-n-butanesulfonate, triphenylsulfonium perfluoro-n-octanesulfonate, diphenyl-4-methylphenylsulfonium trifluoromethanesulfonate, di-2,4,6-trimethylphenylsulfonium trifluoromethanesulfonate, diphenyl-4-t-butoxyphenylsulfonium trifluoromethanesulfonate, diphenyl-4-t-butoxyphenylsulfonium nonafluoro-n-butanesulfonate, diphenyl-4-hydroxyphenylsulfonium trifluoromethanesulfonate, bis(4-fluorophenyl)-4-hydroxyphenylsulfonium trifluoromethanesulfonate, diphenyl-4-hydroxyphenylsulfonium nonafluoro-n-butanesulfonate, bis(4-hydroxyphenyl)-phenylsulfonium trifluoromethanesulfonate, tri(4-methoxyphenyl)sulfonium trifluoromethanesulfonate, tri(4-fluorophenyl)sulfonium trifluoromethanesulfonate, triphenylsulfonium p-toluenesulfonate, triphenylsulfonium benzenesulfonate, diphenyl-2,4,6-trimethylphenylsulfonium-p-toluenesulfonate, diphenyl-2,4,6-trimethylphenylsulfonium-2-trifluoromethylbenzenesulfonate, diphenyl-2,4,6-trimethylphenylsulfonium-4-trifluoromethylbenzenesulfonate, diphenyl-2,4,6-trimethylphenylsulfonium-2,4-difluorobenzenesulfonate, diphenyl-2,4,6-trimethylphenylsulfonium hexafluorobenzenesulfonate, diphenylnaphthylsulfonium trifluoromethanesulfonate, diphenyl-4-hydroxyphenylsulfonium-p-toluenesulfonate, triphenylsulfonium 10-camphorsulfonate, diphenyl-4-hydroxyphenylsulfonium 10-camphorsulfonate, and cyclo(1,3-perfluoropropanedisulfone)imidate.

[Formula 16]

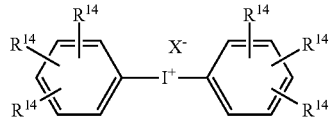

(7-2)

(in formula (7-2), $R^{14}$ may be the same or different, and each independently represents a hydrogen atom, a linear, branched or cyclic alkyl group, a linear, branched or cyclic alkoxy group, a hydroxyl group, or a halogen atom. $X^-$ is the same as the $X^-$ of the formula (7-1).)

The compound represented by the above formula (7-2) is, but not particularly limited to, preferably at least one kind selected from the group consisting of bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium p-toluenesulfonate, bis(4-t-butylphenyl)iodonium benzenesulfonate, bis(4-t-butylphenyl)iodonium-2-trifluoromethylbenzenesulfonate, bis(4-t-butylphenyl)iodonium-4-trifluoromethylbenzenesulfonate, bis(4-t-butylphenyl)iodonium-2,4-difluorobenzenesulfonate, bis(4-t-butylphenyl)iodonium hexafluorobenzenesulfonate, bis(4-t-butylphenyl)iodonium 10-camphorsulfonate, diphenyliodonium trifluoromethanesulfonate, diphenyliodonium nonafluoro-n-butanesulfonate, diphenyliodonium perfluoro-n-octanesulfonate, diphenyliodonium p-toluenesulfonate, diphenyliodonium benzenesulfonate, diphenyliodonium 10-camphorsulfonate, diphenyliodonium-2-trifluoromethylbenzenesulfonate, diphenyliodonium-4-trifluoromethylbenzenesulfonate, diphenyliodonium-2,4-difluorobenzenesulfonate, diphenyliodonium hexafluorobenzenesulfonate, di(4-trifluoromethylphenyl)iodonium trifluoromethanesulfonate, di(4-trifluoromethylphenyl)iodonium nonafluoro-n-butanesulfonate, di(4-trifluoromethylphenyl)iodonium perfluoro-n-octanesulfonate, di(4-trifluoromethylphenyl)iodonium p-toluenesulfonate, di(4-trifluoromethylphenyl)iodonium benzenesulfonate, and di(4-trifluoromethylphenyl)iodonium 10-camphersulfonate.

[Formula 17]

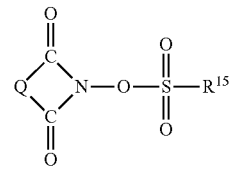

(7-3)

(in formula (7-3), Q is an alkylene group, an arylene group, or an alkoxylene group, and $R^{15}$ is an alkyl group, an aryl group, a halogen substituted alkyl group, or a halogen substituted aryl group.)

The compound represented by the above formula (7-3) is, but not particularly limited to, preferably at least one kind selected from the group consisting of N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-en-2,3-dicarboxyimide, N-(trifluoromethylsulfonyloxy)naphthylimide, N-(10-camphorsulfonyloxy)succinimide, N-(10-camphorsulfonyloxy)phthalimide, N-(10-camphorsulfonyloxy)diphenylmaleimide, N-(10-camphorsulfonyloxy)bicyclo[2.2.1]hept-5-en-2,3-dicarboxyimide, N-(10-camphorsulfonyloxy)naphthylimide, N-(n-octanesulfonyloxy)bicyclo[2.2.1]hept-5-en-2,3-dicarboxyimide, N-(n-octanesulfonyloxy)naphthylimide, N-(p-toluenesulfonyloxy)bicyclo[2.2.1]hept-5-en-2,3-dicarboxyimide, N-(p-toluenesulfonyloxy)naphthylimide, N-(2-trifluoromethylbenzenesulfonyloxy)bicyclo[2.2.1]hept-5-en-2,3-dicarboxyimide, N-(2-trifluoromethylbenzenesulfonyloxy)naphthylimide, N-(4-trifluoromethylbenzenesulfonyloxy)bicyclo[2.2.1]hept-5-en-2,3-dicarboxyimide, N-(4-trifluoromethylbenzenesulfonyloxy)naphthylimide, N-(perfluorobenzenesulfonyloxy)bicyclo[2.2.1]hept-5-en-2,3-dicarboxyimide, N-(perfluorobenzenesulfonyloxy)naphthylimide, N-(1-naphthalenesulfonyloxy)bicyclo[2.2.1]hept-5-en-2,3-dicarboxyimide, N-(1-naphthalenesulfonyloxy)naphthylimide, N-(nonafluoro-n-butanesulfonyloxy)bicyclo[2.2.1]hept-5-en-2,3-dicarboxyimide, N-(nonafluoro-n-butanesulfonyloxy)naphthylimide, N-(perfluoro-n-octanesulfonyloxy)bicyclo[2.2.1]hept-5-en-2,3-dicarboxyimide, and N-(perfluoro-n-octanesulfonyloxy)naphthylimide.

[Formula 18]

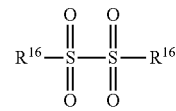

(7-4)

(in formula (7-4), $R^{16}$ may be the same or different, and are each independently an optionally substituted linear, branched or cyclic alkyl group, an optionally substituted aryl group, an optionally substituted heteroaryl group, or an optionally substituted aralkyl group.)

The compound represented by the above formula (7-4) is, but not particularly limited to, preferably at least one kind selected from the group consisting of diphenyldisulfone, di(4-methylphenyl)disulfone, dinaphthyldisulfone, di(4-tert-butylphenyl)disulfone, di(4-hydroxyphenyl)disulfone, di(3-hydroxynaphthyl)disulfone, di(4-fluorophenyl)disulfone, di(2-fluorophenyl)disulfone, and di(4-trifluoromethylphenyl)disulfone.

[Formula 19]

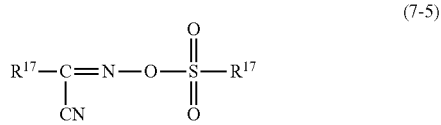

(7-5)

(in formula (7-5), $R^{17}$ may be the same or different, and are each independently an optionally substituted linear, branched or cyclic alkyl group, an optionally substituted aryl group, an optionally substituted heteroaryl group, or an optionally substituted aralkyl group.)

The compound represented by the above formula (7-5) is, but not particularly limited to, preferably at least one kind selected from the group consisting of α-(methylsulfonyloxyimino)-phenylacetonitrile, α-(methylsulfonyloxyimino)-4-methoxyphenylacetonitrile, α-(trifluoromethylsulfonyloxyimino)-phenylacetonitrile, α-(trifluoromethylsulfonyloxyimino)-4-methoxyphenylacetonitrile, α-(ethylsulfonyloxyimino)-4-methoxyphenylacetonitrile, α-(propylsulfonyloxyimino)-4-methylphenylacetonitrile, and α-(methylsulfonyloxyimino)-4-bromophenylacetonitrile.

[Formula 20]

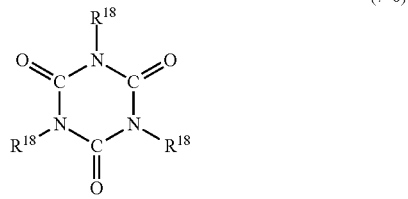

(7-6)

(in formula (7-6), $R^{18}$ may be the same or different, and are each independently a halogenated alkyl group having one or more chlorine atoms and one or more bromine atoms. The number of carbon atoms of the halogenated alkyl group is preferably 1 to 5.)

[Formula 21]

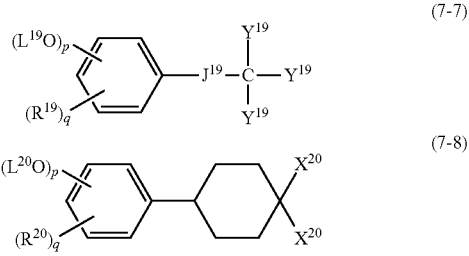

(7-7)

(7-8)

In formulae (7-7) and (7-8), $R^{19}$ and $R^{20}$ are each independently an alkyl group having 1 to 3 carbon atoms such as a methyl group, an ethyl group, an n-propyl group, and an isopropyl group; a cycloalkyl group such as a cyclopentyl group and a cyclohexyl group; an alkoxyl group having 1 to 3 carbon atoms such as a methoxy group, an ethoxy group, and a propoxy group; or an aryl group such as a phenyl group, a toluoyl group, and a naphthyl group, and preferably an aryl group having 6 to 10 carbon atoms. $L^{19}$ and $L^{20}$ are each independently an organic group having a 1,2-naphthoquinonediazide group. Specifically, preferable examples of the organic group having a 1,2-naphthoquinonediazide group include, but not particularly limited to, a 1,2-quinonediazidesulfonyl group such as a 1,2-naphthoquinonediazide-4-sulfonyl group, a 1,2-naphthoquinonediazide-5-sulfonyl group, and a 1,2-naphthoquinonediazide-6-sulfonyl group.

Particularly, a 1,2-naphthoquinonediazide-4-sulfonyl group and a 1,2-naphthoquinonediazide-5-sulfonyl group are preferable. p is an integer of 1 to 3; q is an integer of 0 to 4; and 1≤p+q≤5. $J^{19}$ is a single bond, a polymethylene group having 1 to 4 carbon atoms, a cycloalkylene group, a phenylene group, a group represented by the following formula (7-7-1), a carbonyl group, an ester group, an amide group, or an ether group. $Y^{19}$ is a hydrogen atom, an alkyl group, or an aryl group, and $X^{20}$ are each independently a group represented by the following formula (7-8-1):

[Formula 22]

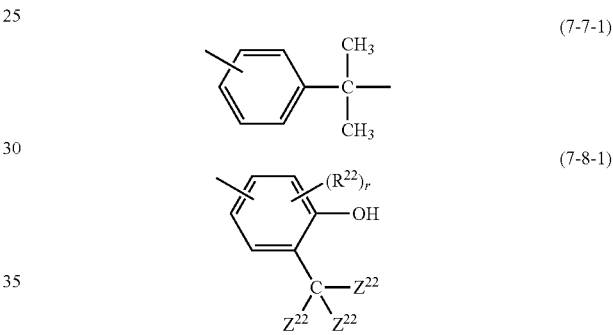

(7-7-1)

(7-8-1)

(in formula (7-8-1), $Z^{22}$ are each independently an alkyl group, a cycloalkyl group, or an aryl group; $R^{22}$ is an alkyl group, a cycloalkyl group, or an alkoxyl group; and r is an integer of 0 to 3.)

Examples of the other acid generating agent are not limited, but include, for example, bissulfonyldiazomethanes such as bis(p-toluenesulfonyl)diazomethane, bis(2,4-dimethylphenylsulfonyl)diazomethane, bis(tert-butylsulfonyl) diazomethane, bis(n-butylsulfonyl)diazomethane, bis(isobutylsulfonyl)diazomethane, bis(isopropylsulfonyl) diazomethane, bis(n-propylsulfonyl)diazomethane, bis (cyclohexylsulfonyl)diazomethane, bis(isopropylsulfonyl) diazomethane, 1,3-bis (cyclohexylsulfonylazomethylsulfonyl)propane, 1,4-bis (phenylsulfonylazomethylsulfonyl)butane, 1,6-bis (phenylsulfonylazomethylsulfonyl)hexane, and 1,10-bis (cyclohexylsulfonylazomethylsulfonyl)decane; and halogen-containing triazine derivatives such as 2-(4-methoxyphenyl)-4,6-(bistrichloromethyl)-1,3,5-triazine, 2-(4-methoxynaphthyl)-4,6-(bistrichloromethyl)-1,3,5-triazine, tris(2,3-dibromopropyl)-1,3,5-triazine, and tris(2,3-dibromopropyl)isocyanurate.

Among the above acid generating agents, an acid generating agent having an aromatic ring is preferable, and an acid generating agent represented by the formula (7-1) or (7-2) is more preferable. An acid generating agent having a sulfonate ion wherein $X^-$ of the formula (7-1) or (7-2) has an aryl group or a halogen-substituted aryl group is still more preferable; an acid generating agent having a sulfonate ion having an aryl group is particularly preferable; and diphenyltrimethylphenylsulfonium p-toluenesulfonate, triphenylsulfonium p-toluenesulfonate, triphenylsulfonium trifluoromethanesulfonate, and triphenylsulfonium nonafluoromethanesulfonate are particularly preferable. By using the acid generating agent, there is a tendency that LER can be further reduced.

The above acid generating agent (C) can be used alone or in combination of two or more kinds.

The resist composition of the present embodiment preferably contains one or more acid crosslinking agents (G). The acid crosslinking agent (G) is a compound capable of intramolecular or intermolecular crosslinking the compound represented by the formula (1) and/or the compound represented by the formula (3) in the presence of the acid generated from the acid generating agent (C). Examples of such an acid crosslinking agent (G) include, but not particularly limited to, a compound having the configuration of the formula (1) and a compound having one or more groups (hereinafter, referred to as "crosslinkable group") capable of crosslinking the blend of the compounds.

Specific examples of such a crosslinkable group include, but not limited to, (i) a hydroxyalkyl group such as a hydroxy (C1-C6 alkyl group), a C1-C6 alkoxy (C1-C6 alkyl group), and an acetoxy (C1-C6 alkyl group), or a group derived therefrom; (ii) a carbonyl group such as a formyl group and a carboxy (C1-C6 alkyl group), or a group derived therefrom; (iii) a nitrogenous group-containing group such as a dimethylaminomethyl group, a diethylaminomethyl group, a dimethylolaminomethyl group, a diethylolaminomethyl group, and a morpholinomethyl group; (iv) a glycidyl group-containing group such as a glycidyl ether group, a glycidyl ester group, and a glycidylamino group; (v) a group derived from an aromatic group such as a C1-C6 allyloxy (C1-C6 alkyl group) and a C1-C6 aralkyloxy (C1-C6 alkyl group) such as a benzyloxymethyl group and a benzoyloxymethyl group; and (vi) a polymerizable multiple bond-containing group such as a vinyl group and a isopropenyl group. As the crosslinkable group of the acid crosslinking agent (G) of the present embodiment, a hydroxyalkyl group and an alkoxyalkyl group or the like are preferable, and an alkoxymethyl group is particularly preferable.

Examples of the acid crosslinking agent (G) having the above crosslinkable group include, but not limited to, (i) a methylol group-containing compound such as a methylol group-containing melamine compound, a methylol group-containing benzoguanamine compound, a methylol group-containing urea compound, a methylol group-containing glycoluryl compound, and a methylol group-containing phenolic compound; (ii) an alkoxyalkyl group-containing compound such as an alkoxyalkyl group-containing melamine compound, an alkoxyalkyl group-containing benzoguanamine compound, an alkoxyalkyl group-containing urea compound, an alkoxyalkyl group-containing glycoluryl compound, and an alkoxyalkyl group-containing phenolic compound; (iii) a carboxymethyl group-containing compound such as a carboxymethyl group-containing melamine compound, a carboxymethyl group-containing benzoguanamine compound, a carboxymethyl group-containing urea compound, a carboxymethyl group-containing glycoluryl compound, and a carboxymethyl group-containing phenolic compound; (iv) an epoxy compound such as a bisphenol A based epoxy compound, a bisphenol F based epoxy compound, a bisphenol S based epoxy compound, a novolac resin based epoxy compound, a resol resin based epoxy compound, and a poly(hydroxystyrene) based epoxy compound.

As the acid crosslinking agent (G), a compound having a phenolic hydroxyl group, and a compound and resin where the above crosslinkable group is introduced into an acid functional group in an alkali soluble resin to impart crosslinkability can be further used. The introduction rate of the crosslinkable group in that case is adjusted, usually, to be normally 5 to 100 mol %, preferably 10 to 60 mol %, and more preferably 15 to 40 mol % based on the total acid functional groups in the compound having a phenolic hydroxyl group, and the alkali soluble resin. The above range is preferable from the viewpoint of that the crosslinking reaction sufficiently occurs, and a decrease in the film remaining rate, and swelling phenomena and meandering or the like of a pattern can be avoided.

In the resist composition of the present embodiment, as the acid crosslinking agent (G), an alkoxyalkylated urea compound or resin thereof, or an alkoxyalkylated glycoluryl compound or resin thereof is preferable. Particularly preferable examples of the acid crosslinking agent (G) include compounds represented by the following formulae (8-1) to (8-3) and an alkoxymethylated melamine compound (acid crosslinking agent (G1)).

[Formula 23]

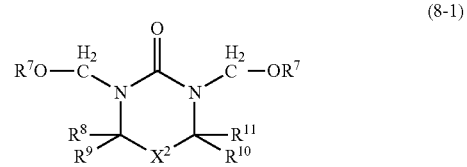

(8-1)

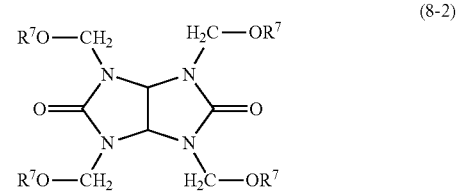

(8-2)

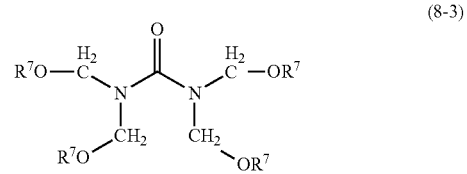

(8-3)

(in the above formulae (8-1) to (8-3), $R^7$ each independently represents a hydrogen atom, an alkyl group, or an acyl group; $R^8$ to $R^{11}$ each independently represents a hydrogen atom, a hydroxyl group, an alkyl group, or an alkoxyl group; and $X^2$ represents a single bond, a methylene group, or an oxygen atom.)

The alkyl group represented by $R^7$ is preferably 1 to 6 carbon atoms, and more preferably 1 to 3 carbon atoms. Examples thereof include a methyl group, an ethyl group, and a propyl group. The acyl group represented by $R^7$ is preferably 2 to 6 carbon atoms, and more preferably 2 to 4 carbon atoms. Examples thereof include an acetyl group and a propyonyl group. The alkyl group represented by $R^8$ to $R^{11}$ is preferably 1 to 6 carbon atoms, and more preferably 1 to 3 carbon atoms. Examples thereof include a methyl group, an ethyl group, and a propyl group. The alkoxy group represented by $R^8$ to $R^{11}$ is preferably 1 to 6 carbon atoms, and more preferably 1 to 3 carbon atoms. Examples thereof include a methoxy group, an ethoxy group, and a propoxy group. $X^2$ is preferably a single bond or a methylene group. $R^7$ to $R^{11}$ and $X^2$ may be substituted with an alkyl group such as a methyl group and an ethyl group, an alkoxy group such as a methoxy group and an ethoxy group; a hydroxyl group; and a halogen atom or the like. A plurality of $R^7$ and $R^8$ to $R^{11}$ may be each the same or different.

Specific examples of the compound represented by the formula (8-1) include compounds shown below:

[Formula 24]

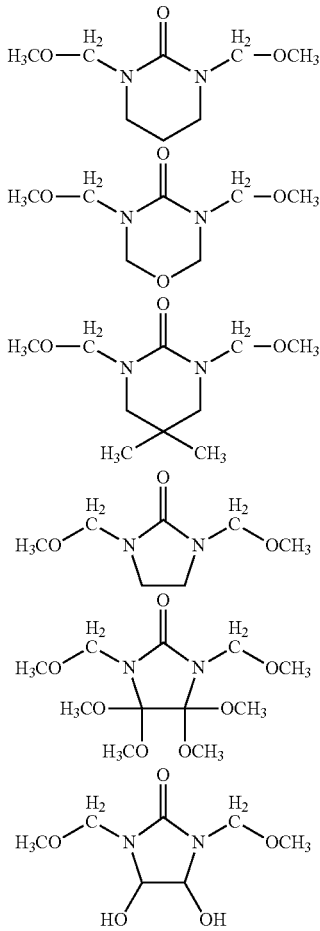

Specific examples of the compound represented by the formula (8-2) include, but not limited to, N,N,N,N-tetra(methoxymethyl)glycoluryl, N,N,N,N-tetra(ethoxymethyl)glycoluryl, N,N,N,N-tetra(n-propoxymethyl)glycoluryl, N,N,N,N-tetra(isopropoxymethyl)glycoluryl, N,N,N,N-tetra(n-butoxymethyl)glycoluryl, and N,N,N,N-tetra(t-butoxymethyl)glycoluryl. Among them, particularly, N,N,N,N-tetra(methoxymethyl)glycoluryl is preferable.

Specific examples of the compound represented by the formula (8-3) include compounds shown below:

[Formula 25]

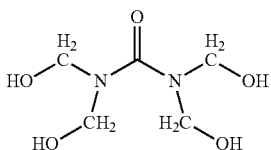

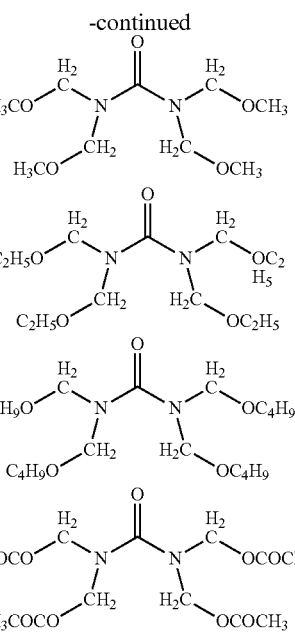

Specific examples of the alkoxymethylated melamine compound include, but not limited to, N,N,N,N,N,N-hexa(methoxymethyl)melamine, N,N,N,N,N,N-hexa(ethoxymethyl)melamine, N,N,N,N,N,N-hexa(n-propoxymethyl)melamine, N,N,N,N,N,N-hexa(isopropoxymethyl)melamine, N,N,N,N,N,N-hexa(n-butoxymethyl)melamine, and N,N,N,N,N,N-hexa(t-butoxymethyl)melamine. Among them, particularly, N,N,N,N,N,N-hexa(methoxymethyl)melamine is preferable.

The above acid crosslinking agent (G1) can be obtained by, for example, conducting a condensation reaction of a urea compound or a glycoluryl compound with formalin to introduce an methylol group, etherifying the product with lower alcohols such as methyl alcohol, ethyl alcohol, propyl alcohol, and butyl alcohol, and then cooling the reaction solution to collect a precipitated compound or resin thereof. The above acid crosslinking agent (G1) can be obtained as a commercially available product such as CYMEL (trade name, manufactured by MT AquaPolymer) and NIKALAC (manufactured by Sanwa Chemical).

Other particularly preferable examples of the acid crosslinking agent (G) include a phenol derivative having 1 to 6 benzene rings within a molecule and two or more hydroxyalkyl groups and/or alkoxyalkyl groups within the entire molecule, the hydroxyalkyl groups and/or alkoxyalkyl groups being bonded to any of the above benzene rings (acid crosslinking agent (G2)). Preferable examples thereof include a phenol derivative having a molecular weight of 1500 or less, 1 to 6 benzene rings and a total of two or more hydroxyalkyl groups and/or alkoxyalkyl groups within a molecule, the hydroxyalkyl groups and/or alkoxyalkyl groups being bonded to any one of the above benzene rings, or a plurality of benzene rings.

The hydroxyalkyl group bonded to a benzene ring is the one of 1 to 6 carbon atoms such as a hydroxymethyl group, a 2-hydroxyethyl group, a 2-hydroxy-1-propyl group is preferable. As the alkoxyalkyl group bonded to a benzene ring, the one of 2 to 6 carbon atoms is preferable. As the hydroxyalkyl group bonded to a benzene ring, specifically, a methoxymethyl group, an ethoxymethyl group, an n-propoxymethyl group, an isopropoxymethyl group, an n-butoxymethyl group, an isobutoxymethyl group, a sec-butoxymethyl group, a t-butoxymethyl group, a 2-methoxyethyl group, or a 2-methoxy-1-propyl group is preferable.
Among these phenol derivatives, particularly preferable ones are shown below:
[Formula 26]
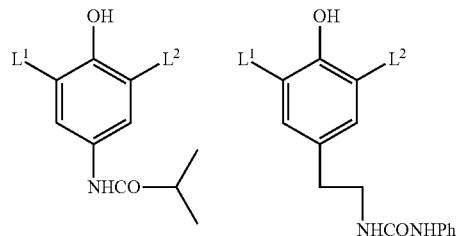
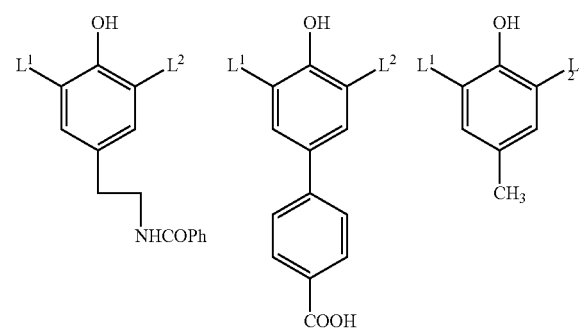
[Formula 27]
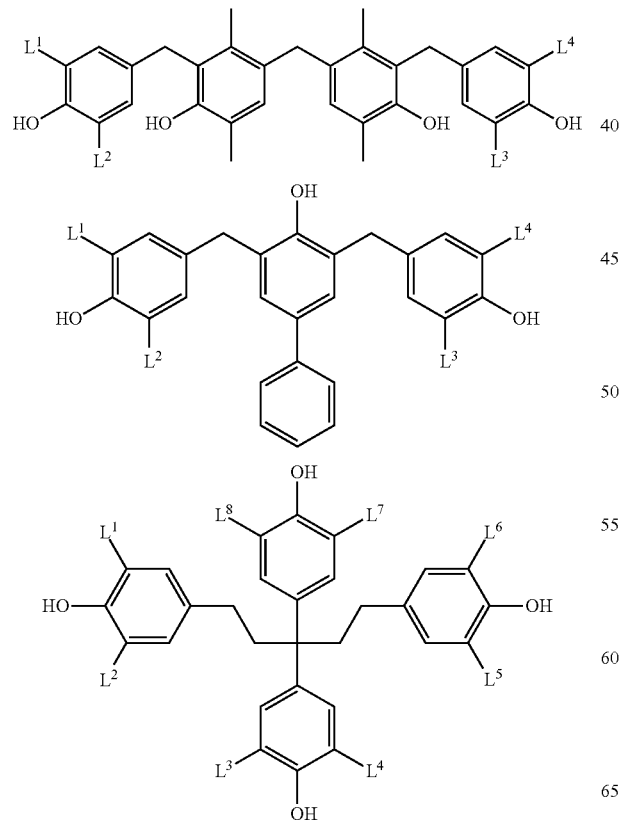
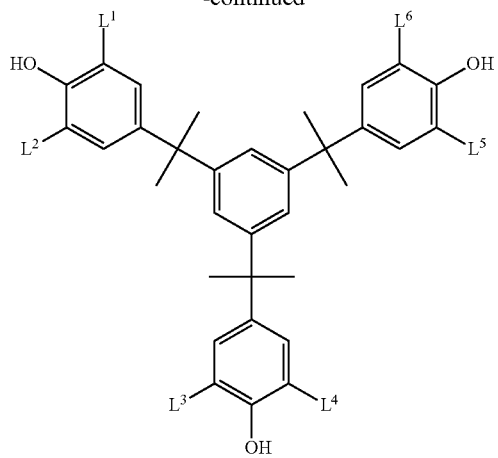
[Formula 28]
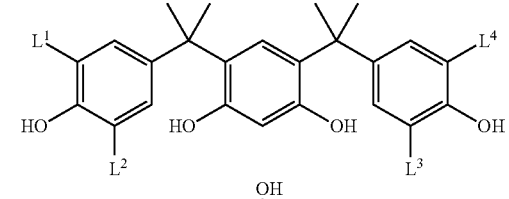
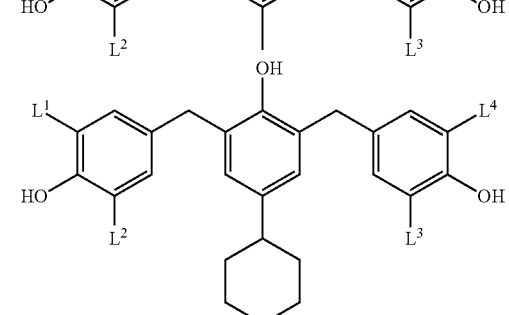
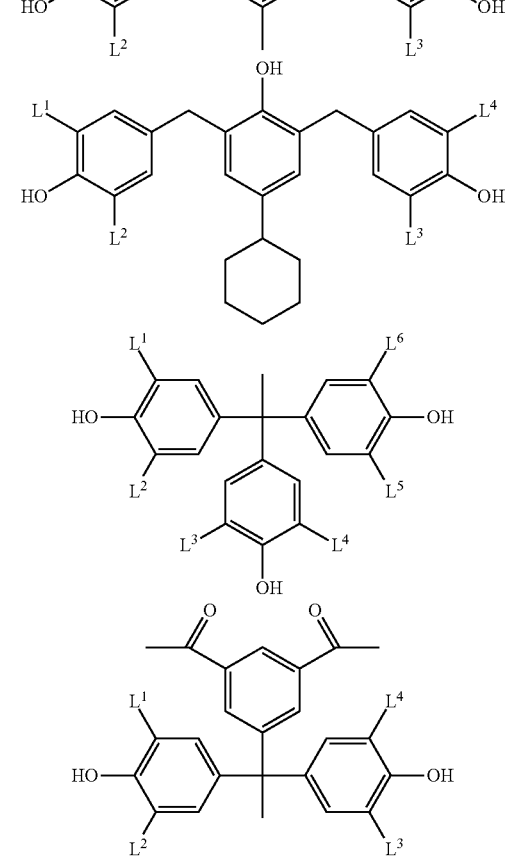

[Formula 29]
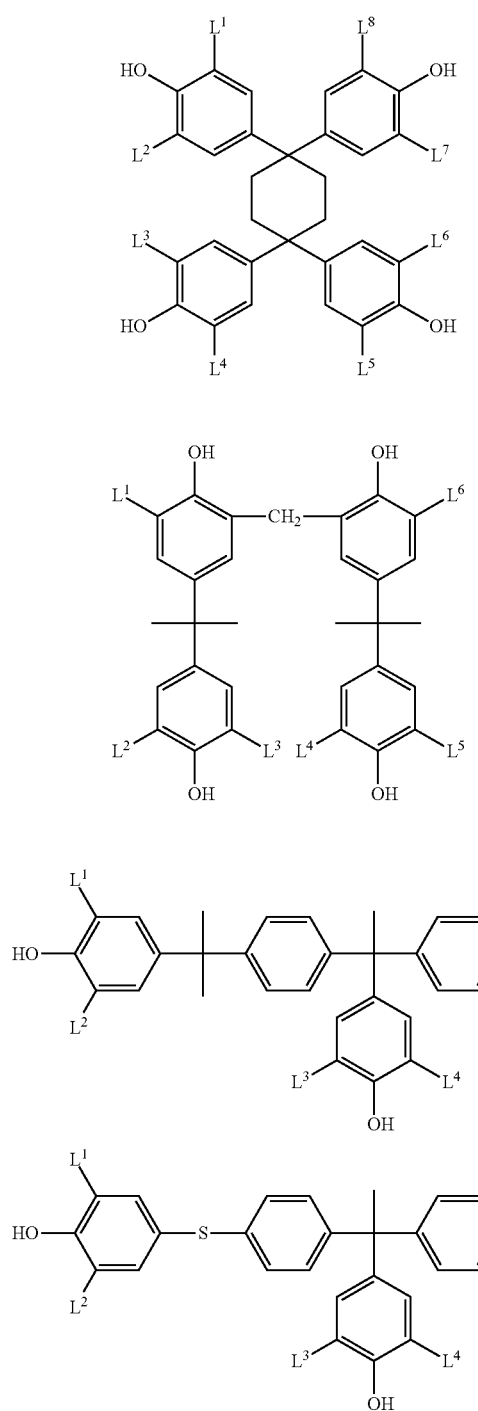
[Formula 30]
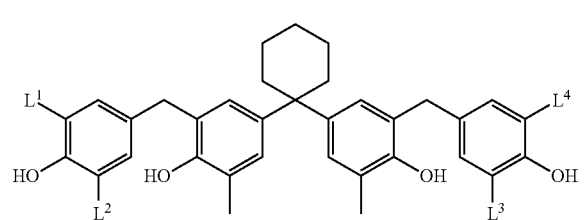
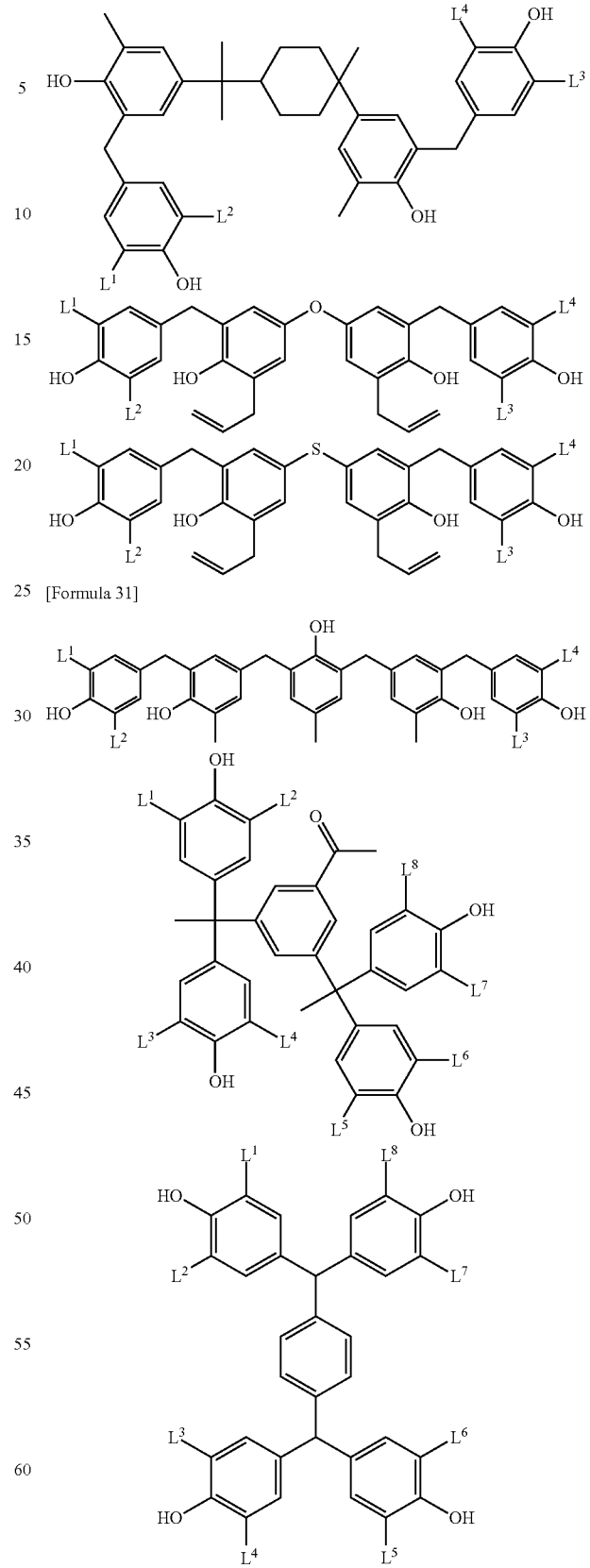
In the above formulae, $L^1$ to $L^8$ may be the same or different, and each independently represents a hydroxymethyl group, a methoxymethyl group, or an ethoxymethyl group. A phenol derivative having a hydroxymethyl group can be obtained by reacting the corresponding phenolic compound having no hydroxymethyl group (a compound where $L^1$ to $L^8$ in the above formulae are a hydrogen atom) with formaldehyde in the presence of a basic catalyst. In this case, in order to prevent resinification and gelation, the reaction temperature is preferably 60° C. or less. Specifically, it can be synthesized by methods described in Japanese Patent Application Laid-Open Nos. H6-282067 and H7-64285 or the like.

A phenol derivative having an alkoxymethyl group can be obtained by reacting the corresponding phenol derivative having a hydroxymethyl group with an alcohol in the presence of an acid catalyst. In this case, in order to prevent resinification and gelation, the reaction temperature is preferably 100° C. or less. Specifically, it can be synthesized by methods described in EP632003A1 or the like.

While the phenol derivative having a hydroxymethyl group and/or an alkoxymethyl group thus synthesized is preferable in terms of stability upon storage, the phenol derivative having an alkoxymethyl group is particularly preferable in terms of stability upon storage. The acid crosslinking agent (G2) may be used alone, or may be used in combination of two or more kinds.

Other particularly preferable examples of the acid crosslinking agent (G) include a compound having at least one α-hydroxyisopropyl group (acid crosslinking agent (G3)). The compound is not particularly limited in the structure, as long as it has an α-hydroxyisopropyl group. A hydrogen atom of a hydroxyl group in the above α-hydroxyisopropyl group may be substituted with one or more acid dissociation groups (R—COO— group, R—SO$_2$— group or the like, wherein the above R represents a substituent group selected from the group consisting of a linear hydrocarbon group having 1 to 12 carbon atoms, a cyclic hydrocarbon group having 3 to 12 carbon atoms, an alkoxy group having 1 to 12 carbon atoms, a 1-branched alkyl group having 3 to 12 carbon atoms, and an aromatic hydrocarbon group having 6 to 12 carbon atoms). Examples of a compound having the above α-hydroxyisopropyl group include one kind or two kinds or more of a substituted or non-substituted aromatic based compound, a diphenyl compound, a naphthalene compound, a furan compound or the like containing at least one α-hydroxyisopropyl group. Specific examples thereof include a compound represented by the following general formula (9-1) (hereinafter, referred to as "benzene based compound (1)"), a compound represented by the following general formula (9-2) (hereinafter, referred to as "diphenyl based compound (2)"), a compound represented by the following general formula (9-3) (hereinafter, referred to as "naphthalene based compound (3)"), and a compound represented by the following general formula (9-4) (hereinafter, referred to as "furan based compound (4)").

[Formula 32]

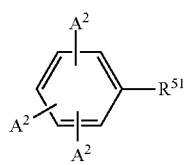

(9-1)

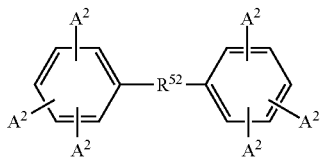

(9-2)

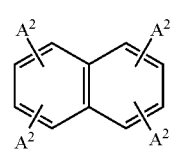

(9-3)

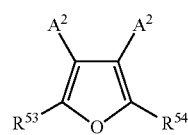

(9-4)

In the above general formulae (9-1) to (9-4), each $A^2$ independently represents an α-hydroxyisopropyl group or a hydrogen atom, and at least one $A^2$ is an α-hydroxyisopropyl group. In the general formula (9-1), $R^{51}$ represents a hydrogen atom, a hydroxyl group, a linear or branched alkylcarbonyl group having 2 to 6 carbon atoms, or a linear or branched alkoxycarbonyl group having 2 to 6 carbon atoms. Furthermore, in the general formula (9-2), $R^{52}$ represents a single bond, a linear or branched alkylene group having 1 to 5 carbon atoms, —O—, —CO—, or —COO—. Also, in the general formula (9-4), $R^{53}$ and $R^{54}$ represent a hydrogen atom or a linear or branched alkyl group having 1 to 6 carbon atoms independently from each other.

Specific examples of the above benzene based compound (1) include, but not limited to, α-hydroxyisopropylbenzenes such as α-hydroxyisopropylbenzene, 1,3-bis(α-hydroxyisopropyl)benzene, 1,4-bis(α-hydroxyisopropyl)benzene, 1,2,4-tris(α-hydroxyisopropyl)benzene, and 1,3,5-tris(α-hydroxyisopropyl)benzene; α-hydroxyisopropylphenols such as 3-α-hydroxyisopropylphenol, 4-α-hydroxyisopropylphenol, 3,5-bis(α-hydroxyisopropyl)phenol, and 2,4,6-tris(α-hydroxyisopropyl)phenol; α-hydroxyisopropylphenyl alkyl ketones such as 3-α-hydroxyisopropylphenyl methyl ketone, 4-α-hydroxyisopropylphenyl methyl ketone, 4-α-hydroxyisopropylphenyl ethyl ketone, 4-α-hydroxyisopropylphenyl n-propyl ketone, 4-α-hydroxyisopropylphenyl isopropyl ketone, 4-α-hydroxyisopropylphenyl n-butyl ketone, 4-α-hydroxyisopropylphenyl t-butyl ketone, 4-α-hydroxyisopropylphenyl n-pentyl ketone, 3,5-bis(α-hydroxyisopropyl)phenyl methyl ketone, 3,5-bis(α-hydroxyisopropyl)phenyl ethyl ketone, and 2,4,6-tris(α-hydroxyisopropyl)phenyl methyl ketone; alkyl 4-α-hydroxyisopropylbenzoates such as methyl 3-α-hydroxyisopropylbenzoate, methyl 4-α-hydroxyisopropylbenzoate, ethyl 4-α-hydroxyisopropylbenzoate, n-propyl 4-α-hydroxyisopropylbenzoate, isopropyl 4-α-hydroxyisopropylbenzoate, n-butyl 4-α-hydroxyisopropylbenzoate, t-butyl 4-α-hydroxyisopropylbenzoate, n-pentyl 4-α-hydroxyisopropylbenzoate, methyl 3,5-bis(α-hydroxyisopropyl)benzoate, ethyl 3,5-bis(α-hydroxyisopropyl)benzoate, and methyl 2,4,6-tris(α-hydroxyisopropyl)benzoate.

Specific examples of the above diphenyl based compound (2) include, but not limited to, α-hydroxyisopropylbiphenyls such as 3-α-hydroxyisopropylbiphenyl, 4-α-hydroxyisopropylbiphenyl, 3,5-bis(α-hydroxyisopropyl)biphenyl, 3,3'-bis(α-hydroxyisopropyl)biphenyl, 3,4'-bis(α-hydroxyisopropyl)biphenyl,4,4'-bis(α-hydroxyisopropyl)biphenyl, 2,4,6-tris(α-hydroxyisopropyl)biphenyl, 3,3',5-tris(α-hydroxyisopropyl)biphenyl, 3,4',5-tris(α-hydroxyisopropyl)biphenyl, 2,3',4,6,-tetrakis(α-hydroxyisopropyl)biphenyl, 2,4,4',6,-tetrakis(α-hydroxyisopropyl)biphenyl, 3,3',5,5'-tetrakis(α-hydroxyisopropyl)biphenyl, 2,3',4,5',6-pentakis(α-hydroxyisopropyl)biphenyl, and 2,2',4,4',6,6'-hexakis(α-hydroxyisopropyl)biphenyl;
α-hydroxyisopropyldiphenylalkanes such as 3-α-hydroxyisopropyldiphenylmethane, 4-α-hydroxyisopropyldiphenylmethane, 1-(4-α-hydroxyisopropylphenyl)-2-phenylethane, 1-(4-α-hydroxyisopropylphenyl)-2-phenylpropane, 2-(4-α-hydroxyisopropylphenyl)-2-phenylpropane, 1-(4-α-hydroxyisopropylphenyl)-3-phenylpropane, 1-(4-α-hydroxyisopropylphenyl)-4-phenylbutane, 1-(4-α-hydroxyisopropylphenyl)-5-phenylpentane, 3,5-bis(α-hydroxyisopropyldiphenylmethane, 3,3'-bis(α-hydroxyisopropyl)diphenylmethane, 3,4'-bis(α-hydroxyisopropyl)diphenylmethane, 4,4'-bis(α-hydroxyisopropyl)diphenylmethane, 1,2-bis(4-α-hydroxyisopropylphenyl)ethane 1,2-bis(4-α-hydroxypropylphenyl)propane, 2,2-bis(4-α-hydroxypropylphenyl)propane, 1,3-bis(4-α-hydroxypropylphenyl)propane, 2,4,6-tris(α-hydroxyisopropyl)diphenylmethane,3,3',5-tris(α-hydroxyisopropyl)diphenylmethane,3,4',5-tris(α-hydroxyisopropyl)diphenylmethane, 2,3',4,6-tetrakis(α-hydroxyisopropyl)diphenylmethane, 2,4,4',6-tetrakis(α-hydroxyisopropyl)diphenylmethane, 3,3',5,5'-tetrakis(α-hydroxyisopropyl)diphenylmethane, 2,3',4,5',6-pentakis(α-hydroxyisopropyl)diphenylmethane, and 2,2',4,4',6,6'-hexakis(α-hydroxyisopropyl)diphenylmethane;
α-hydroxyisopropyldiphenyl ethers such as 3-α-hydroxyisopropyldiphenyl ether, 4-α-hydroxyisopropyldiphenyl ether, 3,5-bis(α-hydroxyisopropyl)diphenyl ether, 3,3'-bis(α-hydroxyisopropyl)diphenyl ether, 3,4'-bis(α-hydroxyisopropyl)diphenyl ether, 4,4'-bis(α-hydroxyisopropyl)diphenyl ether, 2,4,6-tris(α-hydroxyisopropyl)diphenyl ether, 3,3',5-tris(α-hydroxyisopropyl)diphenyl ether, 3,4',5-tris(α-hydroxyisopropyl)diphenyl ether, 2,3',4,6-tetrakis(α-hydroxyisopropyl)diphenyl ether, 2,4,4',6-tetrakis(α-hydroxyisopropyl)diphenyl ether, 3,3',5,5'-tetrakis(α-hydroxyisopropyl)diphenyl ether, 2,3',4,5',6-pentakis(α-hydroxyisopropyl)diphenyl ether, and 2,2',4,4',6,6'-hexakis(α-hydroxyisopropyl)diphenyl ether;
α-hydroxyisopropyldiphenyl ketones such as 3-α-hydroxyisopropyldiphenyl ketone, 4-α-hydroxyisopropyldiphenyl ketone, 3,5-bis(α-hydroxyisopropyl)diphenyl ketone, 3,3'-bis(α-hydroxyisopropyl)diphenyl ketone, 3,4'-bis(α-hydroxyisopropyl)diphenyl ketone, 4,4'-bis(α-hydroxyisopropyl)diphenyl ketone, 2,4,6-tris(α-hydroxyisopropyl)diphenyl ketone, 3,3',5-tris(α-hydroxyisopropyl)diphenyl ketone, 3,4',5-tris(α-hydroxyisopropyl)diphenyl ketone, 2,3',4,6-tetrakis(α-hydroxyisopropyl)diphenyl ketone, 2,4,4',6-tetrakis(α-hydroxyisopropyl)diphenyl ketone, 3,3',5,5'-tetrakis(α-hydroxyisopropyl)diphenyl ketone, 2,3',4,5',6-pentakis(α-hydroxyisopropyl)diphenyl ketone, and 2,2',4,4',6,6'-hexakis(α-hydroxyisopropyl)diphenyl ketone; phenyl α-hydroxyisopropylbenzoates such as phenyl 3-α-hydroxyisopropylbenzoate, phenyl 4-α-hydroxyisopropylbenzoate, 3-α-hydroxyisopropylphenyl benzoate, 4-α-hydroxyisopropylphenyl benzoate, phenyl 3,5-bis(α-hydroxyisopropyl) benzoate, 3-α-hydroxyisopropylphenyl 3-α-hydroxyisopropylbenzoate, 4-α-hydroxyisopropylphenyl 3-α-hydroxyisopropylbenzoate, 3-α-hydroxyisopropylphenyl 4-α-hydroxyisopropylbenzoate, 4-α-hydroxyisopropylphenyl 4-α-hydroxyisopropylbenzoate, 3,5-bis(α-hydroxyisopropyl)phenyl benzoate, phenyl 2,4,6-tris(α-hydroxyisopropyl)benzoate, 3-α-hydroxyisopropylphenyl 3,5-bis(α-hydroxyisopropyl)benzoate, 4-α-hydroxyisopropylphenyl 3,5-bis(α-hydroxyisopropyl)benzoate, 3,5-bis(α-hydroxyisopropyl)phenyl 3-α-hydroxyisopropylbenzoate, 3,5-bis(α-hydroxyisopropyl)phenyl 4-α-hydroxyisopropylbenzoate, 2,4,6-tris(α-hydroxyisopropyl)phenyl benzoate, 3-α-hydroxyisopropylphenyl 2,4,6-tris(α-hydroxyisopropyl)benzoate, 4-α-hydroxyisopropylphenyl 2,4,6-tris(α-hydroxyisopropyl)benzoate, 3,5-bis(α-hydroxyisopropyl)phenyl 3,5-bis(α-hydroxyisopropyl)benzoate, 2,4,6-tris(α-hydroxyisopropyl)phenyl 3-α-hydroxyisopropylbenzoate, 2,4,6-tris(α-hydroxyisopropyl)phenyl 4-α-hydroxyisopropylbenzoate, 3,5-bis(α-hydroxyisopropyl)phenyl 2,4,6-tris(α-hydroxyisopropyl)benzoate, 2,4,6-tris(α-hydroxyisopropyl)phenyl 3,5-bis(α-hydroxyisopropyl)benzoate, and 2,4,6-tris (α-hydroxyisopropyl)phenyl 2,4,6-tris(α-hydroxyisopropyl)benzoate.

Furthermore, specific examples of the above naphthalene based compound (3) include, but not limited to, 1-(α-hydroxyisopropyl)naphthalene, 2-(α-hydroxyisopropyl)naphthalene, 1,3-bis(α-hydroxyisopropyl)naphthalene, 1,4-bis(α-hydroxyisopropyl)naphthalene, 1,5-bis(α-hydroxyisopropyl)naphthalene, 1,6-bis(α-hydroxyisopropyl)naphthalene, 1,7-bis(α-hydroxyisopropyl)naphthalene, 2,6-bis(α-hydroxyisopropyl)naphthalene, 2,7-bis(α-hydroxyisopropyl)naphthalene, 1,3,5-tris(α-hydroxyisopropyl)naphthalene, 1,3,6-tris(α-hydroxyisopropyl)naphthalene, 1,3,7-tris(α-hydroxyisopropyl)naphthalene, 1,4,6-tris(α-hydroxyisopropyl)naphthalene, 1,4,7-tris(α-hydroxyisopropyl)naphthalene, and 1,3,5,7-tetrakis(α-hydroxyisopropyl)naphthalene.

Specific examples of the above furan based compound (4) include, but not limited to, 3-(α-hydroxyisopropyl)furan, 2-methyl-3-(α-hydroxyisopropyl)furan, 2-methyl-4-(α-hydroxyisopropyl)furan, 2-ethyl-4-(α-hydroxyisopropyl)furan, 2-n-propyl-4-(α-hydroxyisopropyl)furan, 2-isopropyl-4-(α-hydroxyisopropyl)furan, 2-n-butyl-4-(α-hydroxyisopropyl)furan, 2-t-butyl-4-(α-hydroxyisopropyl)furan, 2-n-pentyl-4-(α-hydroxyisopropyl)furan, 2,5-dimethyl-3-(α-hydroxyisopropyl)furan, 2,5-diethyl-3-(α-hydroxyisopropyl)furan, 3,4-bis(α-hydroxyisopropyl)furan, 2,5-dimethyl-3,4-bis(α-hydroxyisopropyl)furan, and 2,5-diethyl-3,4-bis(α-hydroxyisopropyl)furan.

As the above acid crosslinking agent (G3), a compound having two or more free α-hydroxyisopropyl groups is preferable; the above benzene based compound (1) having two or more α-hydroxyisopropyl groups, the above diphenyl based compound (2) having two or more α-hydroxyisopropyl groups, and the above naphthalene based compound (3) having two or more α-hydroxyisopropyl groups are more preferable; and α-hydroxyisopropylbiphenyls having two or more α-hydroxyisopropyl groups and the above naphthalene based compound (3) having two or more α-hydroxyisopropyl groups are particularly preferable.

The above acid crosslinking agent (G3) can normally be obtained by a method for reacting an acetyl group-containing compound such as 1,3-diacetylbenzene with Grignard reagent such as $CH_3MgBr$ to methylate and then hydrolyzing, or a method for oxidizing an isopropyl group-containing compound such as 1,3-diisopropylbenzene with oxygen or the like to produce a peroxide and then reducing.

The amount of the acid crosslinking agent (G) used in the present embodiment is preferably 0.5 to 49% by mass of the total mass of the solid component, more preferably 0.5 to 40% by mass, still more preferably 1 to 30% by mass, and particularly preferably 2 to 20% by mass. The content ratio of the above acid crosslinking agent (G) is preferably 0.5% by mass or more from the viewpoint of that the inhibiting effect of the solubility of a resist film in an alkaline developing solution can be improved, and a decrease in the film remaining rate, and occurrence of swelling and meandering of a pattern can be inhibited. On the other hand, the above content ratio is preferably 50% by mass or less from the viewpoint of that a decrease in heat resistance as a resist can be further inhibited.

The above content ratio of at least one kind of compound selected from the above acid crosslinking agent (G1), acid crosslinking agent (G2), and acid crosslinking agent (G3) in the acid crosslinking agent (G) is also not particularly limited, and can be within various ranges according to the kind of substrates or the like used upon forming a resist pattern.

In all acid crosslinking agent components, the content of the above alkoxymethylated melamine compound and/or the compounds represented by (9-1) to (9-3) is 50 to 99% by mass, preferably 60 to 99% by mass, more preferably 70 to 98% by mass, and much more preferably 80 to 97% by mass. It is preferable to have the alkoxymethylated melamine compound and/or the compounds represented by (9-1) to (9-3) of 50% by mass or more of all acid crosslinking agent components, from the viewpoint of improving the resolution. By having the compounds of 99% by mass or less, there is a tendency that the pattern cross section is likely to have a rectangular shape, which is preferable.

In the present embodiment, an acid diffusion controlling agent (E) having a function of controlling diffusion of an acid generated from an acid generating agent by radiation irradiation in a resist film to inhibit any unpreferable chemical reaction in an unexposed region or the like may be blended in the resist composition. By using such an acid diffusion controlling agent (E), there is a tendency that the storage stability of a resist composition is improved. Also, by using an acid diffusion controlling agent (E), there is a tendency that, along with the improvement of the resolution, the line width change of a resist pattern due to variation in the post exposure delay time before radiation irradiation and the post exposure delay time after radiation irradiation can be inhibited, and the composition has more excellent process stability. Examples of such an acid diffusion controlling agent (E) include a radiation degradable basic compound such as a nitrogen atom-containing basic compound, a basic sulfonium compound, and a basic iodonium compound. The acid diffusion controlling agent (E) can be used alone or in combination of two or more kinds.

Examples of the above acid diffusion controlling agent include, but not limited to, a nitrogen-containing organic compound, and a basic compound degradable by exposure. Examples of the above nitrogen-containing organic compound include, but not limited to, a compound represented by the following general formula (10) (hereinafter, referred to as a "nitrogen-containing compound (I)"), a diamino compound having two nitrogen atoms within the same molecule (hereinafter, referred to as a "nitrogen-containing compound (II)"), a polyamino compound or polymer having three or more nitrogen atoms (hereinafter, referred to as a "nitrogen-containing compound (III)"), an amide group-containing compound, a urea compound, and a nitrogen-containing heterocyclic compound. The acid diffusion controlling agent (E) may be used alone as one kind or may be used in combination of two or more kinds.

[Formula 33]

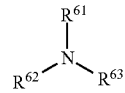

(10)

In the above general formula (10), $R^{61}$, $R^{62}$, and $R^{63}$ represent a hydrogen atom, a linear, branched or cyclic alkyl group, an aryl group, or an aralkyl group independently from each other. The above alkyl group, aryl group, or aralkyl group may be non-substituted or may be substituted with a hydroxyl group or the like. Herein, examples of the above linear, branched or cyclic alkyl group include, but not limited to, the one having 1 to 15 carbon atoms, and preferably 1 to 10 carbon atoms. Specific examples thereof include a methyl group, an ethyl group, an n-propyl group, an isopropyl group, an n-butyl group, an isobutyl group, a sec-butyl group, a t-butyl group, an n-pentyl group, a neopentyl group, an n-hexyl group, a texyl group, an n-heptyl group, an n-octyl group, an n-ethylhexyl group, an n-nonyl group, and an n-decyl group. Examples of the above aryl group include, but not limited to, the one having 6 to 12 carbon atoms. Specific examples thereof include a phenyl group, a tolyl group, a xylyl group, a cumenyl group, and a 1-naphthyl group. Furthermore, examples of the above aralkyl group include the one having 7 to 19 carbon atoms, and preferably 7 to 13 carbon atoms. Specific examples thereof include a benzyl group, an α-methylbenzyl group, a phenethyl group, and a naphthylmethyl group.

Specific examples of the above nitrogen-containing compound (I) include, but not limited to, mono(cyclo)alkylamines such as n-hexylamine, n-heptylamine, n-octylamine, n-nonylamine, n-decylamine, n-dodecylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, methyl-n-dodecylamine, di-n-dodecylmethyl, cyclohexylmethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, dimethyl-n-dodecylamine, di-n-dodecylmethylamine, dicyclohexylmethylamine, and tricyclohexylamine; alkanolamines such as monoethanolamine, diethanolamine, and triethanolamine; and aromatic amines such as aniline, N-methylaniline, N,N-dimethylaniline, 2-methylaniline, 3-methylaniline, 4-methylaniline, 4-nitroaniline, diphenylamine, triphenylamine, and 1-naphthylamine.

Specific examples of the above nitrogen-containing compound (II) include, but not limited to, ethylenediamine, N,N,N',N'-tetramethylethylenediamine, N,N,N',N'-tetrakis(2-hydroxypropyl)ethylenediamine, tetramethylenediamine, hexamethylenediamine, 4,4'-diaminodiphenylmethane, 4,4'- diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, and 1,3-bis[1-(4-aminophenyl)-1-methylethyl]benzene.

Specific examples of the above nitrogen-containing compound (III) include, but not limited to, polymers of polyethyleneimine, polyarylamine, and N-(2-dimethylaminoethyl)acrylamide.

Specific examples of the above amide group-containing compound include, but not limited to, formamide, N-methylformamide, N,N-dimethylformamide, acetamide, N-methylacetamide, N,N-dimethylacetamide, propioneamide, benzamide, pyrrolidone, and N-methylpyrrolidone.

Specific examples of the above urea compound include, but not limited to, urea, methylurea, 1,1-dimethylurea, 1,3-dimethylurea, 1,1,3,3-tetramethylurea, 1,3-diphenylurea, and tri-n-butylthiourea.

Specific examples of the above nitrogen-containing heterocyclic compound include, but not limited to, imidazoles such as imidazole, benzimidazole, 4-methylimidazole, 4-methyl-2-phenylimidazole, and 2-phenylbenzimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, amide nicotinate, quinoline, 8-oxyquinoline, and acridine; and pyrazine, pyrazole, pyridazine, quinozaline, purine, pyrrolidine, piperidine, morpholine, 4-methylmorpholine, piperazine, 1,4-dimethylpiperazine, and 1,4-diazabicyclo[2.2.2]octane.

Examples of the above radiation degradable basic compound include, but not limited to, a sulfonium compound represented by the following general formula (11-1) and an iodonium compound represented by the following general formula (11-2).

[Formula 34]

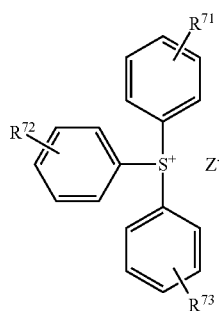

(11-1)

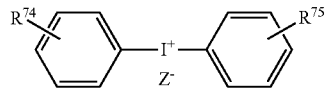

(11-2)

In the above general formulae (11-1) and (11-2), $R^{71}$, $R^{72}$, $R^{73}$, $R^{74}$, and $R^{75}$ represent a hydrogen atom, an alkyl group having 1 to 6 carbon atoms, an alkoxyl group having 1 to 6 carbon atoms, a hydroxyl group, or a halogen atom independently from each other. $Z^-$ represents $HO^-$, $R—COO^-$ (R represents an alkyl group having 1 to 6 carbon atoms, an aryl group having 6 to 11 carbon atoms, or an alkaryl group having 7 to 12 carbon atoms), or an anion represented by the following general formula (11-3).

[Formula 35]

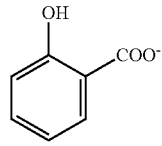

(11-3)

Specific examples of the above radiation degradable basic compound include, but not limited to, triphenylsulfonium hydroxide, triphenylsulfonium acetate, triphenylsulfonium salicylate, diphenyl-4-hydroxyphenylsulfonium hydroxide, diphenyl-4-hydroxyphenylsulfonium acetate, diphenyl-4-hydroxyphenylsulfonium salicylate, bis(4-t-butylphenyl)iodonium hydroxide, bis(4-t-butylphenyl)iodonium acetate, bis(4-t-butylphenyl)iodonium hydroxide, bis(4-t-butylphenyl)iodonium acetate, bis(4-t-butylphenyl)iodonium salicylate, 4-t-butylphenyl-4-hydroxyphenyliodonium hydroxide, 4-t-butylphenyl-4-hydroxyphenyliodonium acetate, and 4-t-butylphenyl-4-hydroxyphenyliodonium salicylate.

The content of the acid diffusion controlling agent (E) is preferably 0.001 to 49% by mass of the total mass of the solid component, more preferably 0.01 to 10% by mass, still more preferably 0.01 to 5% by mass, and particularly preferably 0.01 to 3% by mass. The above range is preferable from the viewpoint of preventing a decrease in resolution, and deterioration of the pattern shape and the dimension fidelity or the like. Moreover, even though the post exposure delay time from electron beam irradiation to heating after radiation irradiation becomes longer, there is a tendency that deterioration of the shape of the pattern upper layer portion can be effectively prevented. When the content is 10% by mass or less, there is a tendency that a decrease in sensitivity, and developability of the unexposed portion or the like can be more effectively prevented. By using such an acid diffusion controlling agent, there is a tendency that the storage stability of a resist composition improves, also along with improvement of the resolution, the line width change of a resist pattern due to variation in the post exposure delay time before radiation irradiation and the post exposure delay time after radiation irradiation can be effectively inhibited, and the composition becomes more excellent from the viewpoint of process stability.

To the resist composition of the present embodiment, within the range of not inhibiting the purpose of the present embodiment, if required, as the other component (F), one kind or two kinds or more of various additive agents such as a dissolution promoting agent, a dissolution controlling agent, a sensitizing agent, a surfactant, an organic carboxylic acid or an oxo acid of phosphor, or derivative thereof can be added.

(1) Dissolution Promoting Agent

A low molecular weight dissolution promoting agent is a component having a function of increasing the solubility of a compound represented by the formula (1) and the compound represented by the formula (3) in a developing solution to moderately increase the dissolution rate of the compound represented by the formula (1) and the compound represented by the formula (3) upon developing, when the solubility of the compound is too low. The low molecular weight dissolution promoting agent can be used, within the range of not deteriorating the effect of the present embodiment. Examples of the above dissolution promoting agent include, but not limited to, a low molecular weight phenolic compound. Specific examples thereof include bisphenols and tris(hydroxyphenyl)methane. These dissolution promoting agents can be used alone or in mixture of two or more kinds. The content of the dissolution promoting agent, which is arbitrarily adjusted according to the kind of the compound represented by the formula (1) and the compound represented by the formula (3) to be used, is preferably 0 to 49% by mass of the total mass of the solid component, more preferably 0 to 5% by mass, still more preferably 0 to 1% by mass, and particularly preferably 0% by mass.

(2) Dissolution Controlling Agent

The dissolution controlling agent is a component having a function of controlling the solubility of the compound represented by the formula (1) and the compound represented by the formula (3) in a developing solution to moderately decrease the dissolution rate upon developing, when the solubility of the compound is too high. As such a dissolution controlling agent, the one which does not chemically change in steps such as calcination of resist coating, radiation irradiation, and development is preferable.

Examples of the dissolution controlling agent include, but not limited to, aromatic hydrocarbons such as phenanthrene, anthracene, and acenaphthene; ketones such as acetophenone, benzophenone, and phenyl naphtyl ketone; and sulfones such as methyl phenyl sulfone, diphenyl sulfone, and dinaphthyl sulfone. These dissolution controlling agents can be used alone or in two or more kinds.

The content of the dissolution controlling agent is arbitrarily adjusted according to the kind of the compound represented by the formula (1) and the compound represented by the formula (3) to be used, is preferably 0 to 49% by mass of the total mass of the solid component, more preferably 0 to 5% by mass, still more preferably 0 to 1% by mass, and particularly preferably 0% by mass.

(3) Sensitizing Agent

The sensitizing agent is a component having a function of absorbing irradiated radiation energy, transmitting the energy to the acid generating agent (C), and thereby increasing the acid production amount, and improving the apparent sensitivity of a resist. Examples of such a sensitizing agent include, but not limited to, benzophenones, biacetyls, pyrenes, phenothiazines, and fluorenes. These sensitizing agents can be used alone or in two or more kinds. The content of the sensitizing agent, which is arbitrarily adjusted according to the kind of the compound represented by the formula (1) and the compound represented by the formula (3) to be used, is preferably 0 to 49% by mass of the total mass of the solid component, more preferably 0 to 5% by mass, still more preferably 0 to 1% by mass, and particularly preferably 0% by mass.

(4) Surfactant

The surfactant is a component having a function of improving coatability and striation of the resist composition of the present embodiment, and developability of a resist or the like. Such a surfactant is not particularly limited, and may be any of anionic, cationic, nonionic or amphoteric. A preferable surfactant is a nonionic surfactant. The nonionic surfactant has a good affinity with a solvent used in production of resist compositions and more effects. Examples of the nonionic surfactant include, but not limited to, a polyoxyethylene higher alkyl ethers, polyoxyethylene higher alkyl phenyl ethers, and higher fatty acid diesters of polyethylene glycol. Examples of commercially available products include, but not particularly limited to, hereinafter by trade name, EFTOP (manufactured by Jemco Inc.), MEGAFAC (manufactured by DIC Corporation), Fluorad (manufactured by Sumitomo 3M Limited), AsahiGuard, Surflon (hereinbefore, manufactured by Asahi Glass Co., Ltd.), Pepole (manufactured by Toho Chemical Industry Co., Ltd.), KP (manufactured by Shin-Etsu Chemical Co., Ltd.), and Polyflow (manufactured by Kyoeisha Fat Chemical Industry Co., Ltd.). The content of the surfactant is arbitrarily adjusted according to the kind of the compound represented by the formula (1) and the compound represented by the formula (3) to be used, is preferably 0 to 49% by mass of the total mass of the solid component, more preferably 0 to 5% by mass, still more preferably 0 to 1% by mass, and particularly preferably 0% by mass.

(5) Organic Carboxylic Acid or Oxo Acid of Phosphor or Derivative Thereof

For the purpose of prevention of sensitivity deterioration or improvement of a resist pattern shape and post exposure delay stability or the like, and as an additional optional component, the resist composition of the present embodiment may contain an organic carboxylic acid or an oxo acid of phosphor or derivative thereof. The composition can be used in combination with the acid diffusion controlling agent, or may be used alone. As the organic carboxylic acid, but not particularly limited to, for example, malonic acid, citric acid, malic acid, succinic acid, benzoic acid, and salicylic acid, or the like are preferable. Examples of the oxo acid of phosphor or derivative thereof include, but not particularly limited to, phosphoric acid or derivative thereof such as ester including phosphoric acid, di-n-butyl ester phosphate, and diphenyl ester phosphate; phosphonic acid or derivative thereof such as ester including phosphonic acid, dimethyl ester phosphonate, di-n-butyl ester phosphonate, phenylphosphonic acid, diphenyl ester phosphonate, and dibenzyl ester phosphonate; and phosphinic acid or derivative thereof such as ester including phosphinic acid and phenylphosphinic acid. Among them, phosphonic acid is particularly preferable.

The organic carboxylic acid or the oxo acid of phosphor or derivative thereof can be used alone or in combination of two or more kinds. The content of the organic carboxylic acid or the oxo acid of phosphor or derivative thereof, which is arbitrarily adjusted according to the kind of the compound represented by the formula (1) and the compound represented by the formula (3) to be used, is preferably 0 to 49% by mass of the total mass of the solid component, more preferably 0 to 5% by mass, still more preferably 0 to 1% by mass, and particularly preferably 0% by mass.

(6) Additional Additive Other than Above Dissolution Controlling Agent, Sensitizing Agent, Surfactant and Organic Carboxylic Acid or Oxo Acid of Phosphor, or Derivative Thereof Furthermore, one kind or two kinds or more of additive agents other than the above dissolution controlling agent, sensitizing agent, and surfactant can be blended in the resist composition of the present embodiment, within the range of not inhibiting the purpose of the present embodiment, if required. Examples of such an additive agent include, but not limited to, a dye, a pigment, and an adhesion aid. For example, the dye or the pigment is blended in the composition, and thereby a latent image of the exposed portion can be visualized and influence of halation upon exposure can be alleviated, which is preferable. The adhesion aid is blended in the composition contains, and thereby adhesiveness to a substrate can be improved, which is preferable. Furthermore, examples of other additive agent include a halation preventing agent, a storage stabilizing agent, a defoaming agent, and a shape improving agent. Specific examples thereof include 4-hydroxy-4'-methylchalkone.

The total of the optional component (F) is preferably 0 to 49% by mass of the total mass of the solid component, more preferably 0 to 5% by mass, still more preferably 0 to 1% by mass, and particularly preferably 0% by mass.

The ratio of the resist base material, the acid generating agent (C), the acid crosslinking agent (G), the acid diffusion controlling agent (E), and the optional component (F) (resist base material/acid generating agent (C)/acid crosslinking agent (G)/acid diffusion controlling agent (E)/optional component (F)) in the solid component is preferably from 20 to 99.498/from 0.001 to 49/from 0.5 to 49/from 0.001 to 49/from 0 to 49 based on % by mass, more preferably from 30 to 90/from 1 to 40/from 0.5 to 40/from 0.01 to 10/from 0 to 5, still more preferably from 40 to 80/from 3 to 30/from 1 to 30/from 0.01 to 5/0 to 1, and particularly preferably from 50 to 70/from 10 to 25/from 2 to 20/from 0.01 to 3/0. The content ratio of each component is selected from each range so that the summation thereof is 100% by mass. By the above content ratio, there is a tendency that performance such as sensitivity, resolution, and developability is further improved.

Examples of the resist composition of the present embodiment is usually prepared by dissolving each component in a solvent upon use into a homogenous solution, and then if required, filtering through a filter or the like with a pore diameter of about 0.2 μm, for example.

Examples of the solvent used in the preparation of the resist composition of the present embodiment can include, but not limited to, ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate; ethylene glycol monoalkyl ethers such as ethylene glycol monomethyl ether and ethylene glycol monoethyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate; propylene glycol monoalkyl ethers such as propylene glycol monomethyl ether and propylene glycol monoethyl ether; ester lactates such as methyl lactate, ethyl lactate, n-propyl lactate, n-butyl lactate, and n-amyl lactate; aliphatic carboxylic acid esters such as methyl acetate, ethyl acetate, n-propyl acetate, n-butyl acetate, n-amyl acetate, n-hexyl acetate, methyl propionate, and ethyl propionate; other esters such as methyl 3-methoxypropionate, ethyl 3-methoxypropionate, methyl 3-ethoxypropionate, ethyl 3-ethoxypropionate, methyl 3-methoxy-2-methylpropionate, 3-methoxybutylacetate, 3-methyl-3-methoxybutylacetate, butyl 3-methoxy-3-methylpropionate, butyl 3-methoxy-3-methylbutyrate, methyl acetoacetate, methyl pyruvate, and ethyl pyruvate; aromatic hydrocarbon atoms such as toluene and xylene; ketones such as 2-heptanone, 3-heptanone, 4-heptanone, cyclopentanone, and cyclohexanone; amides such as N,N-dimethylformamide, N-methylacetamide, N,N-dimethylacetamide, and N-methylpyrrolidone; and lactones such as γ-lactone. These solvents can be used alone or in combination of two or more kinds.

The resist composition of the present embodiment can contain a resin within the range of not inhibiting the purpose of the present embodiment. Examples of the resin include, but not limited to, a novolac resin, polyvinyl phenols, polyacrylic acid, polyvinyl alcohol, a styrene-maleic anhydride resin, a polymer containing acrylic acid, vinyl alcohol or vinylphenol as a monomeric unit, or derivative thereof. The content of the resin is arbitrarily adjusted according to the kind of the blend of the compound represented by the formula (1) and the compound represented by the formula (3) to be used, is preferably 30 parts by mass or less per 100 parts by mass of the blend of the compound, more preferably 10 parts by mass or less, still more preferably 5 parts by mass or less, and particularly preferably 0 part by mass.

(Resist Pattern Formation Method)

A resist pattern formation method according to the present embodiment comprise the steps of coating a substrate with the resist composition of the present embodiment, thereby forming a resist film; exposing the resist film; and developing the exposed resist film. The resist pattern can be formed as an upper layer resist in a multilayer process.

In order to form a resist pattern, for example, a resist film is formed by coating a conventionally publically known substrate with the resist composition using a coating means such as spin coating, flow casting coating, and roll coating. The conventionally publically known substrate is not particularly limited. For example, a substrate for electronic components, and the one having a predetermined wiring pattern formed thereon, or the like can be exemplified. More specific examples include a substrate made of a metal such as a silicon wafer, copper, chromium, iron and aluminum, and a glass substrate. Examples of a wiring pattern material include, but not particularly limited to, copper, aluminum, nickel, and gold. Also if required, the substrate may be a substrate having an inorganic and/or organic film provided thereon. Examples of the inorganic film include, but not particularly limited to, an inorganic antireflection film (inorganic BARC). Examples of the organic film include an organic antireflection film (organic BARC). Surface treatment with hexamethylene disilazane or the like may be conducted.

Next, the coated substrate is heated if required. The heating conditions vary according to the content composition of the resist composition, or the like, but are preferably 20 to 250° C., and more preferably 20 to 150° C. By heating, the adhesiveness of a resist to a substrate may improve, which is preferable. Then, the resist film is exposed to a desired pattern by any radiation selected from the group consisting of visible light, ultraviolet, excimer laser, electron beam, extreme ultraviolet (EUV), X-ray, and ion beam. The exposure conditions or the like are arbitrarily selected according to the compounding composition of the resist composition, or the like. In the present embodiment, in order to stably form a fine pattern with a high degree of accuracy in exposure, the resist film is preferably heated after radiation irradiation. The heating conditions vary according to the compounding composition of the resist composition, or the like, but are preferably 20 to 250° C., and more preferably 20 to 150° C.

Next, by developing the exposed resist film in a developing solution, a predetermined resist pattern is formed. As the developing solution, but not particularly limited to, for example, an alkaline aqueous solution, a polar solvent such as a ketone-based solvent, an ester-based solvent, an alcohol-based solvent, an amide-based solvent, and an ether-based solvent; or a hydrocarbon-based solvent can be used.

Examples of the alkaline aqueous solution include, but not limited to, an alkaline compound such as mono-, di- or tri-alkylamines, mono-, di- or tri-alkanolamines, heterocyclic amines, tetramethyl ammonium hydroxide (TMAH), and choline.

Examples of the ketone-based solvent include, but not limited to, 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, and propylene carbonate.

Examples of the ester-based solvent include, but not limited to, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, and propyl lactate.

Examples of the alcohol-based solvent include, but not limited to, an alcohol such as methyl alcohol, ethyl alcohol, n-propyl alcohol, isopropyl alcohol (2-propanol), n-butyl alcohol, sec-butyl alcohol, tert-butyl alcohol, isobutyl alcohol, n-hexyl alcohol, 4-methyl-2-pentanol, n-heptyl alcohol, n-octyl alcohol, and n-decanol; a glycol-based solvent such as ethylene glycol, diethylene glycol, and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol.

Examples of the ether-based solvent include, but not limited to, dioxane and tetrahydrofuran in addition to the above glycol ether-based solvents.

Examples of the amide-based solvent which can be used include, but not limited to, N-methyl-2-pyrrolidone, N,N-dimethylacetamide, N,N-dimethylformamide, phosphoric hexamethyltriamide, and 1,3-dimethyl-2-imidazolidinone.

Examples of the hydrocarbon-based solvent include, but not limited to, an aromatic hydrocarbon-based solvent such as toluene and xylene, and an aliphatic hydrocarbon-based solvent such as pentane, hexane, octane, and decane.

In case of using the above solvents, a plurality of these solvents may be mixed, or the solvent may be used by mixing the solvent with a solvent other than those described above or water within the range having performance.

The vapor pressure of the developing solution is preferably 5 kPa or less at 20° C., more preferably 3 kPa or less, and much more preferably 2 kPa or less. The evaporation of the developing solution on the substrate or in a developing cup is inhibited by setting the vapor pressure of the developing solution to 5 kPa or less, to improve temperature uniformity within a wafer surface, there is a tendency to resulting in improvement in size uniformity within the wafer surface.

Specific examples of the developing solution having a vapor pressure of 5 kPa or less include, but not limited to, a ketone-based solvent such as 1-octanone, 2 -octanone, 1-nonanone, 2-nonanone, 4-heptanone, 2-hexanone, diisobutyl ketone, cyclohexanone, methylcyclohexanone, phenylacetone, and methyl isobutyl ketone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxy butyl acetate, 3-methyl-3-methoxy butyl acetate, butyl formate, propyl formate, ethyl lactate, butyl lactate, and propyl lactate; an alcohol-based solvent such as n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol, and n-decanol; a glycol-based solvent such as ethylene glycol, diethylene glycol, and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol; an ether-based solvent such as tetrahydrofuran; an amide-based solvent such as N-methyl-2-pyrrolidone, N,N-dimethylacetamide, and N,N-dimethylformamide; an aromatic hydrocarbon-based solvent such as toluene and xylene; and an aliphatic hydrocarbon-based solvent such as octane and decane or the like.

Specific examples of the developing solution having a vapor pressure of 2 kPa or less which is a particularly preferable range include, but not limited to, a ketone-based solvent such as 1-octanone, 2-octanone, 1-nonanone, 2-nonanone, 4-heptanone, 2-hexanone, diisobutyl ketone, cyclohexanone, methylcyclohexanone, and phenylacetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxy butyl acetate, 3-methyl-3-methoxy butyl acetate, ethyl lactate, butyl lactate, and propyl lactate; an alcohol-based solvent such as -butyl alcohol, sec-butyl alcohol, tert-butyl alcohol, isobutyl alcohol, n-hexyl alcohol, 4-methyl-2-pentanol, n-heptyl alcohol, n-octyl alcohol, and n-decanol; a glycol-based solvent such as ethylene glycol, diethylene glycol, and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol; an amide-based solvent such as N-methyl-2-pyrrolidone, N,N-dimethylacetamide, and N,N-dimethylformamide; an aromatic hydrocarbon-based solvent such as xylene; and an aliphatic hydrocarbon-based solvent such as octane and decane or the like.

To the developing solution, a surfactant can be added in an appropriate amount, if required. The surfactant is not particularly limited but, for example, an ionic or nonionic fluorine-based and/or silicon-based surfactant can be used. Examples of the fluorine-based and/or silicon-based surfactant include the surfactants described in Japanese Patent Application Laid-Open Nos. S62-36663, S61-226746, S61-226745, S62-170950, S63-34540, H7-230165, H8-62834, H9-54432, and H9-5988, and U.S. Pat. Nos. 5,405,720, 5,360,692, 5,529,881, 5,296,330, 5,436,098, 5,576,143, 5,294,511, and 5,824,451. The surfactant is preferably a nonionic surfactant. The nonionic surfactant is not particularly limited, but a fluorine-based surfactant or a silicon-based surfactant is more preferably used.

The amount of the surfactant used is, but not limited to, usually 0.001 to 5% by mass based on the total amount of the developing solution, preferably 0.005 to 2% by mass, and more preferably 0.01 to 0.5% by mass.

The development method is, but not limited to, for example, a method for dipping a substrate in a bath filled with a developing solution for a fixed time (dipping method), a method for raising a developing solution on a substrate surface by the effect of a surface tension and keeping it still for a fixed time, thereby conducting the development (puddle method), a method for spraying a developing solution on a substrate surface (spraying method), and a method for continuously ejecting a developing solution on a substrate rotating at a constant speed while scanning a developing solution ejecting nozzle at a constant rate (dynamic dispense method), or the like may be applied. The time for conducting the pattern development is not particularly limited, but is preferably 10 seconds to 90 seconds.

After the step of conducting development, a step of stopping the development by the replacement with another solvent may be practiced.

A step of rinsing the resist pattern with a rinsing solution containing an organic solvent may be practiced after the development. The rinsing solution used in the rinsing step after development is not particularly limited as long as the rinsing solution does not dissolve the resist pattern cured by crosslinking. A solution containing a general organic solvent or water may be used as the rinsing solution. As the rinsing solution, a rinsing solution containing at least one kind of organic solvent selected from a hydrocarbon-based solvent, a ketone-based solvent, an ester-based solvent, an alcohol-based solvent, an amide-based solvent, and an ether-based solvent is preferably used. More preferably, after development, a step of rinsing the film by using a rinsing solution containing at least one kind of organic solvent selected from the group consisting of a ketone-based solvent, an ester-based solvent, an alcohol-based solvent and an amide-based solvent is conducted. Still more preferably, after development, a step of rinsing the film by using a rinsing solution containing an alcohol-based solvent or an ester-based solvent is conducted. Yet still more preferably, after development, a step of rinsing the film by using a rinsing solution containing a monohydric alcohol is conducted. Particularly preferably, after development, a step of rinsing the film by using a rinsing solution containing a monohydric alcohol having 5 or more carbon atoms is conducted. The time for rinsing the pattern is not particularly limited, but is preferably 10 seconds to 90 seconds.

Herein, examples of the monohydric alcohol used in the rinsing step after development include, but not limited to, a linear, branched or cyclic monohydric alcohol. Specifically, 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, and 4-octanol or the like can be used. As the particularly preferable monohydric alcohol having 5 or more carbon atoms, 1-hexanol, 2-hexanol, 4-methyl-2-pentanol, 1-pentanol, and 3-methyl-1-butanol or the like can be used.

A plurality of these components may be mixed, or the component may be used by mixing the component with an organic solvent other than those described above.

The water content ratio in the rinsing solution is preferably 10% by mass or less, more preferably 5% by mass or less, and particularly preferably 3% by mass or less. By setting the water content ratio to 10% by mass or less, there is a tendency that better development characteristics can be obtained.

The vapor pressure at 20° C. of the rinsing solution used after development is preferably 0.05 kPa or more and 5 kPa or less, more preferably 0.1 kPa or more and 5 kPa or less, and much more preferably 0.12 kPa or more and 3 kPa or less. By setting the vapor pressure of the rinsing solution to 0.05 kPa or more and 5 kPa or less, there is a tendency that the temperature uniformity in the wafer surface is enhanced and moreover, swelling due to permeation of the rinsing solution is further inhibited. As a result, the dimensional uniformity in the wafer surface is further improved.

The rinsing solution may also be used after adding an appropriate amount of a surfactant to the rinsing solution.

In the rinsing step, the wafer after development is rinsed using the organic solvent-containing rinsing solution. The method for rinsing treatment is not particularly limited. However, for example, a method for continuously ejecting a rinsing solution on a substrate spinning at a constant speed (spin coating method), a method for dipping a substrate in a bath filled with a rinsing solution for a fixed time (dipping method), and a method for spraying a rinsing solution on a substrate surface (spraying method), or the like can be applied. Above all, it is preferable to conduct the rinsing treatment by the spin coating method and after the rinsing, spin the substrate at a rotational speed of 2,000 rpm to 4,000 rpm, to remove the rinsing solution from the substrate surface.

After forming the resist pattern, a pattern wiring substrate is obtained by etching. Etching can be conducted by a publicly known method such as dry etching using plasma gas, and wet etching with an alkaline solution, a cupric chloride solution, and a ferric chloride solution or the like.

After forming the resist pattern, plating can also be conducted on it. Examples of the above plating method include, but not limited to, copper plating, solder plating, nickel plating, and gold plating.

The remaining resist pattern after etching can be peeled by an organic solvent. Examples of the above organic solvent include, but not limited to, PGMEA (propylene glycol monomethyl ether acetate), PGME (propylene glycol monomethyl ether), and EL (ethyl lactate). Examples of the above peeling method include, but not limited to, a dipping method and a spraying method. A wiring substrate having a resist pattern formed thereon may be a multilayer wiring substrate, and may have a small diameter through hole.

The wiring substrate obtained in the present embodiment can also be formed by a method for forming a resist pattern, then depositing a metal in vacuum, and subsequently dissolving the resist pattern in a solution, i.e., a liftoff method.

EXAMPLES

The present embodiment will be more specifically described with reference to examples below. However, the present embodiment is not limited to these examples. In Synthesis Examples below, the structures of compounds were confirmed by $^1$H-NMR measurement.

Synthesis Example 1

Synthesis of CR-1t and CR-1c 74.3 g (3.71 mol) of anhydrous HF and 50.5 g (0.744 mol) of $BF_3$ were charged into a temperature-controllable autoclave (made of SUS316L) having an internal capacity of 500 ml and equipped with an electromagnetic stirring device. Next, the content was stirred and the pressure was increased with carbon monoxide to 2 MPa while maintaining the liquid temperature at −30° C. Thereafter, while maintaining the pressure at 2 MPa and the liquid temperature at −30° C., a raw material obtained by mixing 57.0 g (0.248 mol) of 4-cyclohexylbenzene and 50.0 g of n-heptane was fed thereto, and maintained the content for 1 hour. Then, the content was collected into ice, diluted with benzene, and neutralized to obtain an oil layer. The oil layer was analyzed by gas chromatograph for evaluating the reaction performance. As a result, the 4-cyclohexylbenzene conversion was 100%, and the 4-cyclohexylbenzaldehyde selectivity was 97.3%.

The target component was isolated by simple distillation and analyzed by GC-MS, and the result exhibited a molecular weight of 188, which was 4-cyclohexylbenzaldehyde (hereinafter, referred to as CHBAL) as a target object. The chemical shift value of $^1$H-NMR in a deuterated chloroform solvent (δ ppm, TMS standard) was 1.0 to 1.6 (m, 10H), 2.6 (m, 1H), 7.4 (d, 2H), 7.8 (d, 2H), and 10.0 (s, 1H).

Under a nitrogen gas stream, resorcinol (manufactured by Kanto Chemical Co., Inc., 23.1 g, 0.2 mol), and ethanol (190 g) were charged to a four necked flask (500 mL) sufficiently dried, substituted with nitrogen, and equipped with a dropping funnel, a Dimroth condenser tube, a thermometer, and a stirring blade, to prepare an ethanol solution. This solution was cooled in ice. While cooling and stirring at 5 to 15° C., concentrated sulfuric acid (97%, 18.5 g, 0.2 mol) and 23.9 g of pure water were dropped through the dropping funnel for 10 minutes, and the CHBAL (4-cyclohexylbenzaldehyde, 37.7 g, 0.2 mol) and ethanol (21 g) were then dropped. Then, it was heated to 80° C. by a mantle heater and stirred for 5 hours. After the reaction terminated, it was stood to cool, and after it reached room temperature, it was cooled in an ice bath. It was left at rest for 1 hour, to precipitate a target light yellow crude crystal, which was filtered. The crude crystal was washed 3 times with 500 mL of methanol, 5 times with 500 mL of pure water and dried in a vacuum to obtain 42.5 g of the light yellow product (hereinafter, referred to as CR-1).

The result of high performance liquid chromatography (hereinafter, referred to as HPLC) analysis for the product exhibited the compositional ratio of (ccc) isomer/(ctt) isomer/other isomers of 49.9/49.9/0.2. 40 g of this product was recrystallized twice from a mixed solution of 8 of tetrahydrofuran and 8 of hexane.

<Filtrate Obtained from Second Recrystallization>

11 g of the filtrate concentrate obtained from the second recrystallization was subjected to third recrystallization from 100 mL of ethyl acetate to obtain 9 g of a white crystal.

The result of HPLC analysis for this crystal (hereinafter, referred to as CR-1t) exhibited the compositional ratio of (ccc) isomer/(ctt) isomer/other isomers of 3.1/96.9/0.0. This purified product had the thermal decomposition temperature of 407° C. and the glass transition temperature of 180° C.

The result of GPC analysis for the structure of the (ctt) isomer of this CR-1 exhibited the number average molecular weight Mn of 979 and the weight average molecular weight Mw of 986 in terms of styrene. The chemical shift value of $^1$H-NMR in a deuterated acetonitrile solvent (δ ppm, TMS standard) was 0.8 to 1.9 (m, 44H), 5.5 (s, 4H), 6.0 to 6.4 (d, 8H), 6.6 to 6.7 (m, 16H), and 8.4, 8.5 (m, 8H).

From these results, the obtained product was identified as a (ctt) isomer of an objective compound (CR-1).

[Formula 36]

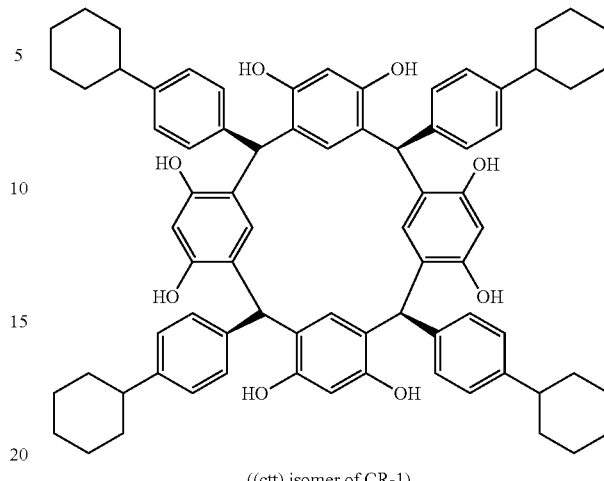

((ctt) isomer of CR-1)

<Crystal Obtained from Second Recrystallization>

22 g of the crystal obtained from the second recrystallization was subjected to third recrystallization from 800 mL of ethyl acetate to obtain 10 g of a white crystal. The result of HPLC analysis for this crystal (hereinafter, referred to as CR-1c) exhibited the compositional ratio of (ccc) isomer/(ctt) isomer/other isomers of 97.6/2.4/0.0. This purified product had the thermal decomposition temperature of 350° C. and the glass transition temperature of 186° C.

The result of GPC analysis for the structure of the (ccc) isomer of this product exhibited the number average molecular weight Mn of 979 and the weight average molecular weight Mw of 986 in terms of styrene. The chemical shift value of $^1$H-NMR in a deuterated acetonitrile solvent (δ ppm, TMS standard) was 0.8 to 1.9 (m, 44H), 5.6 (s, 4H), 6.1 to 6.5 (d, 8H), 6.7 to 6.9 (m, 16H), and 8.5 (m, 8H).

From these results, the obtained product was identified as a (ccc) isomer of an objective compound (CR-1).

[Formula 37]

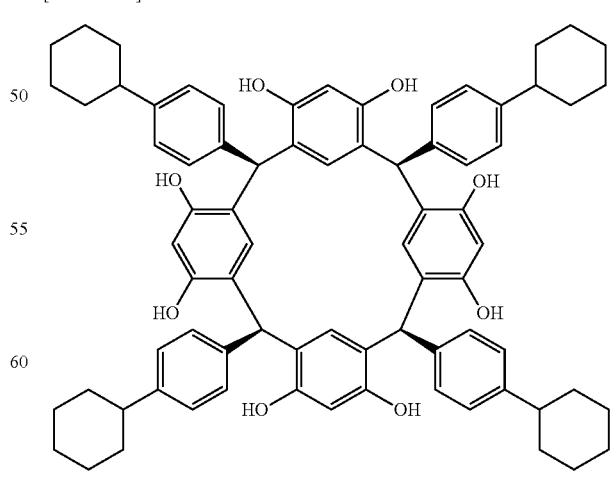

((ccc) isomer of CR-1)

Synthesis Example 2

Synthesis of CR-2t

Synthesis was conducted in the same way as in Synthesis Example 1 except that Cumal (manufactured by Mitsubishi Gas Chemical Company, Inc., 4-isopropylbenzaldehyde) was used instead of 4-cyclohexylbenzaldehyde. The third recrystallization from ethyl acetate was conducted using the filtrate concentrate obtained from the second recrystallization to obtain 13 g of a product (hereinafter, referred to as CR-2t). The result of HPLC analysis for this product exhibited the compositional ratio of (ccc) isomer/(ctt) isomer/other isomers of 0.8/99.2/0.0.

[Formula 38]

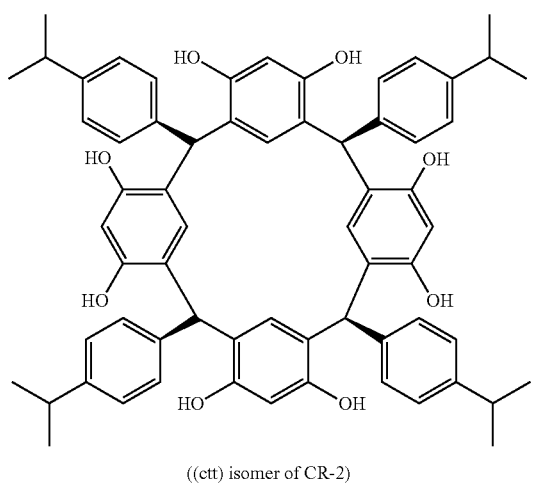

((ctt) isomer of CR-2)

Synthesis Example 3

Synthesis of CR-4t

Synthesis was conducted in the same way as in Synthesis Example 1 except that IBBAL (manufactured by Mitsubishi Gas Chemical Company, Inc., 4-isobutylbenzaldehyde) was used instead of 4-cyclohexylbenzaldehyde. The third recrystallization from ethyl acetate was conducted using the filtrate concentrate obtained from the second recrystallization to obtain 16.0 g of a product (hereinafter, referred to as CR-4t). The result of HPLC analysis for this product exhibited the compositional ratio of (ccc) isomer/(ctt) isomer/other isomers of 0.6/99.4/0.0.

[Formula 39]

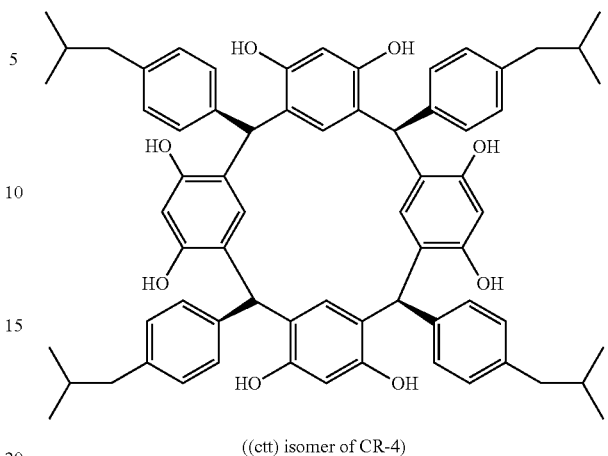

((ctt) isomer of CR-4)

Synthesis Example 4

Synthesis of CR-5t

Synthesis was conducted in the same way as in Synthesis Example 1 except that NPBAL (manufactured by Mitsubishi Gas Chemical Company, Inc., 4-n-propylbenzaldehyde) was used instead of 4-cyclohexylbenzaldehyde. The third recrystallization from ethyl acetate was conducted using the filtrate concentrate obtained from the second recrystallization to obtain 15.7 g of a product (hereinafter, referred to as CR-5t). The result of HPLC analysis for this product exhibited the compositional ratio of (ccc) isomer/(ctt) isomer/other isomers of 0.3/99.7/0.0.

[Formula 40]

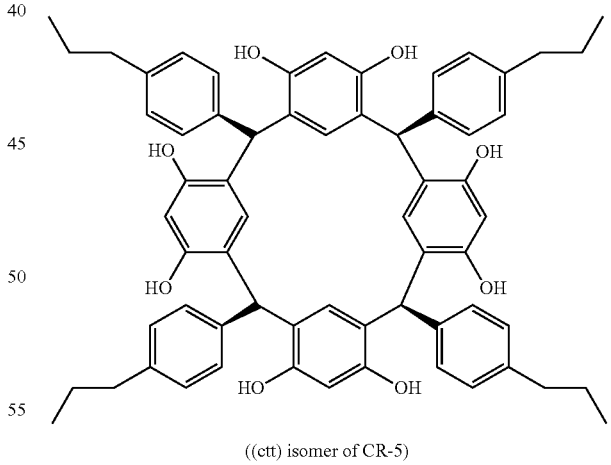

((ctt) isomer of CR-5)

Synthesis Example 5

Synthesis of CR-8t and CR-8c

Synthesis was conducted in the same way as in Synthesis Example 1 except that BPAL (manufactured by Mitsubishi Gas Chemical Company, Inc., 4-phenylbenzaldehyde) was used instead of 4-cyclohexylbenzaldehyde. The third recrystallization from ethyl acetate was conducted using the filtrate concentrate obtained from the second recrystallization to obtain 1.7 g of a product (hereinafter, referred to as CR-8t). Also, the third recrystallization from ethyl acetate was conducted using the crystal obtained from the second recrystallization to obtain 5.4 g of a product (hereinafter, referred to as CR-8c). The result of HPLC analysis for these products exhibited the compositional ratio of (ccc) isomer/(ctt) isomer/other isomers of 0.0/99.8/0.2 and the compositional ratio of (ccc) isomer/(ctt) isomer/other isomers of 98.3/1.4/2.3, respectively.

[Formula 41]

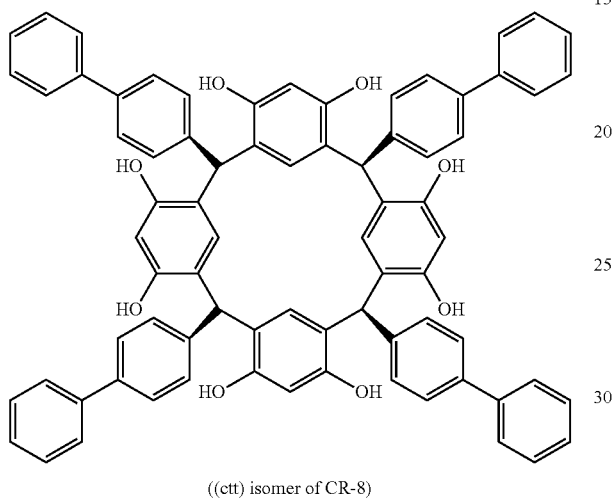

((ctt) isomer of CR-8)

[Formula 42]

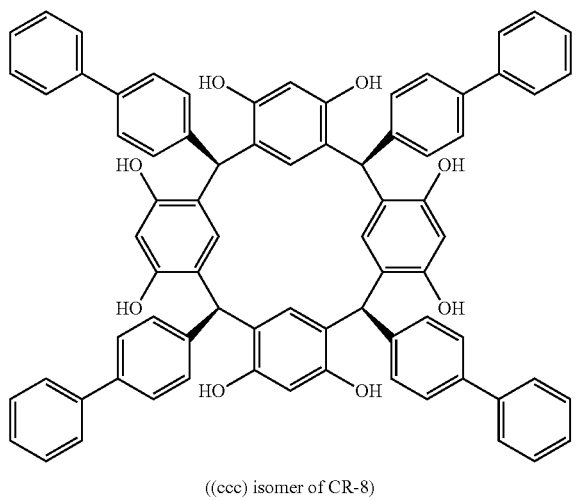

((ccc) isomer of CR-8)

Synthesis Example 6

Synthesis of CR-10t

Synthesis was conducted in the same way as in Synthesis Example 1 except that EV (manufactured by Toyotama International Inc., ethylvanillin) was used instead of 4-cyclohexylbenzaldehyde. The third recrystallization from ethyl acetate was conducted using the filtrate concentrate obtained from the second recrystallization to obtain 2.2 g of a product (hereinafter, referred to as CR-10t). The result of HPLC analysis for this product exhibited the compositional ratio of (ccc) isomer/(ctt) isomer/other isomers of 2.7/97.3/0.0.

[Formula 43]

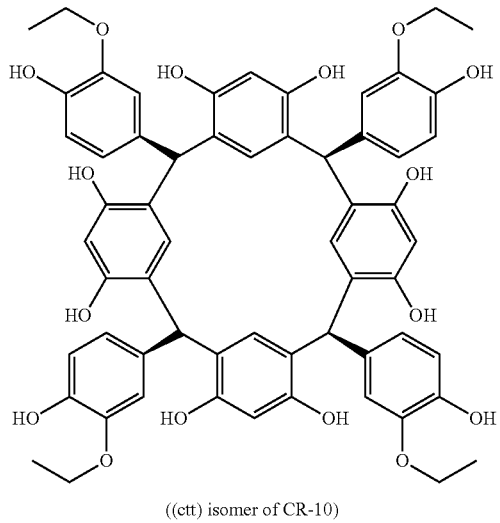

((ctt) isomer of CR-10)

Synthesis Example 7

Synthesis of CR-11c

Synthesis was conducted in the same way as in Synthesis Example 1 except that 3,4-DBAL (manufactured by Mitsubishi Gas Chemical Company, Inc., 3,4-dimethylbenzaldehyde) was used instead of 4-cyclohexylbenzaldehyde. The third recrystallization from ethyl acetate was conducted using the crystal obtained from the second recrystallization to obtain 5.3 g of a product (hereinafter, referred to as CR-11c). The result of HPLC analysis for this product exhibited the compositional ratio of (ccc) isomer/(ctt) isomer/other isomers of 99.9/0.0/0.1.

[Formula 44]

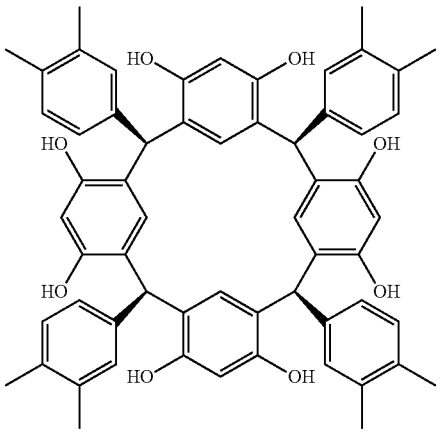

((ccc) isomer of CR-11)

Synthesis Example 8

Synthesis of CR-12c

Synthesis was conducted in the same way as in Synthesis Example 1 except that PTAL (manufactured by Mitsubishi Gas Chemical Company, Inc., p-tolualdehyde) was used instead of 4-cyclohexylbenzaldehyde. The third recrystallization from ethyl acetate was conducted using the crystal obtained from the second recrystallization to obtain 0.5 g of a product (hereinafter, referred to as CR-12c). The result of HPLC analysis for this product exhibited the compositional ratio of (ccc) isomer/(ctt) isomer/other isomers of 99.9/0.1/0.0.

[Formula 45]

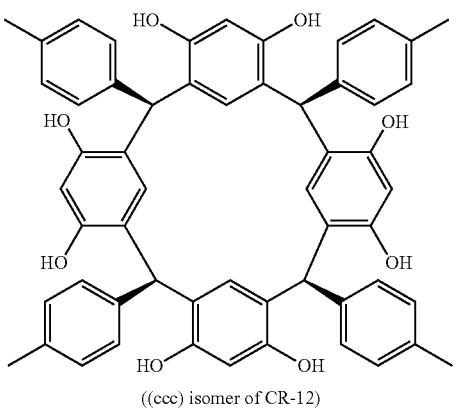

((ccc) isomer of CR-12)

Synthesis Example 9

Synthesis of CR-13c

Synthesis was conducted in the same way as in Synthesis Example 1 except that EBAL (manufactured by Mitsubishi Gas Chemical Company, Inc., 4-ethylbenzaldehyde) was used instead of 4-cyclohexylbenzaldehyde. The third recrystallization from ethyl acetate was conducted using the crystal obtained from the second recrystallization to obtain 5.2 g of a product (hereinafter, referred to as CR-13c). The result of HPLC analysis for this product exhibited the compositional ratio of (ccc) isomer/(ctt) isomer/other isomers of 99.7/0.2/0.1.

[Formula 46]

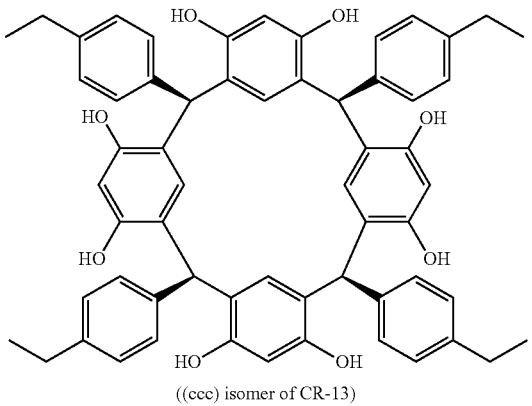

((ccc) isomer of CR-13)

Synthesis Example 10

Synthesis of CR-15t

Synthesis was conducted in the same way as in Synthesis Example 1 except that 2,4-DBAL (manufactured by Mitsubishi Gas Chemical Company, Inc., 2,4-dimethylbenzaldehyde) was used instead of 4-cyclohexylbenzaldehyde. The third recrystallization from ethyl acetate was conducted using the filtrate concentrate obtained from the second recrystallization to obtain 9.4 g of a product (hereinafter, referred to as CR-15t). The result of HPLC analysis for this product exhibited the compositional ratio of (ccc) isomer/(ctt) isomer/other isomers of 0.0/96.3/3.7.

[Formula 47]

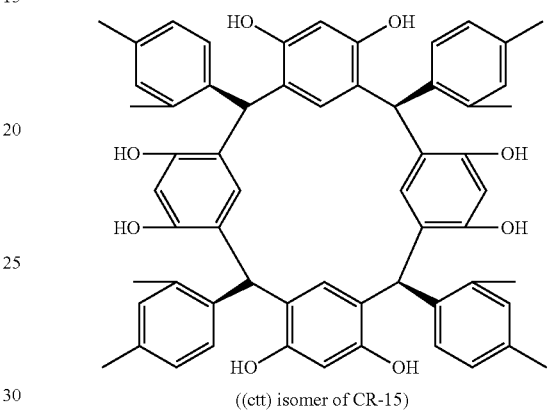

((ctt) isomer of CR-15)

Synthesis Example 11

Synthesis of CR-17t

Synthesis was conducted in the same way as in Synthesis Example 1 except that TBAL (manufactured by Mitsubishi Gas Chemical Company, Inc., 2,4,5-trimethylbenzaldehyde) was used instead of 4-cyclohexylbenzaldehyde. The third recrystallization from ethyl acetate was conducted using the filtrate concentrate obtained from the second recrystallization to obtain 1.3 g of a product (hereinafter, referred to as CR-17t). The result of HPLC analysis for this product exhibited the compositional ratio of (ccc) isomer/(ctt) isomer/other isomers of 0.0/96.0/4.0.

[Formula 48]

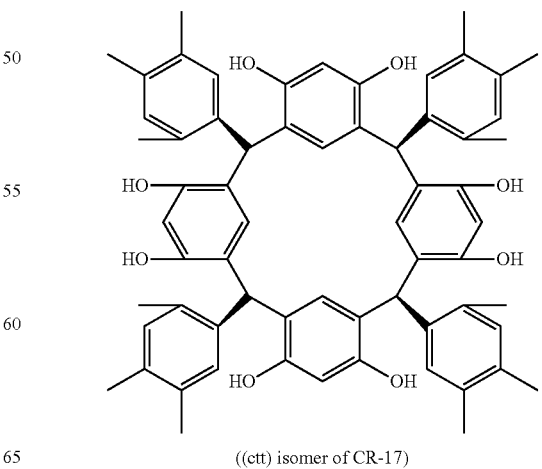

((ctt) isomer of CR-17)

Synthesis Example 12

The product CR-1 synthesized and purified in Synthesis Example 1 was used. The result of HPLC analysis for this product exhibited the compositional ratio of (ccc) isomer/(ctt) isomer/(cct) isomer of 49.9/49.9/0.2.

Examples 1 to 18 and Comparative Examples 1 to 4

(1) Patterning Test

Components were prepared as described in Table 1 to obtain a homogenous solution. Then, it was filtered through a membrane filter made of Teflon with a pore diameter of 0.1 μm to prepare a resist composition corresponding to each example. Each resist composition was evaluated as described below. The evaluation results are shown in Table 2.

TABLE 1

| | Resist base material | | Proportion of compound of formula (1) to resist base material[a] (%) | Mass ratio [formula (3)/formula (1)][b] | Acid crosslinking agent (G) | Acid generating agent (C) | Acid diffusion controlling agent (E) | Solvent |
|---|---|---|---|---|---|---|---|---|
| | Base material containing compound of formula (1) | Compound of formula (3) | | | | | | |
| Example 1 | CR-1t 0.68 | CR-2t 0.17 | 77.5 | 0.26 | C-1 0.15 | P-1 0.3 | Q-1 0.03 | S-1 62.8 |
| Example 2 | CR-1t 0.76 | CR-2t 0.09 | 86.6 | 0.12 | C-1 0.15 | P-1 0.3 | Q-1 0.03 | S-1 63.1 |
| Example 3 | CR-1t 0.76 | CR-2t 0.04 | 92.1 | 0.05 | C-1 0.2 | P-1 0.2 | Q-1 0.03 | S-1 63.5 |
| Example 4 | CR-1t 0.72 | CR-4t 0.09 | 86.1 | 0.13 | C-1 0.2 | P-1 0.2 | Q-1 0.03 | S-1 62.8 |
| Example 5 | CR-1t 0.75 | CR-4t 0.05 | 90.8 | 0.07 | C-1 0.2 | P-1 0.2 | Q-1 0.03 | S-1 62.6 |
| Example 6 | CR-1t 0.72 | CR-5t 0.08 | 87.2 | 0.11 | C-1 0.2 | P-1 0.2 | Q-1 0.03 | S-1 63.3 |
| Example 7 | CR-1t 0.76 | CR-5t 0.04 | 92.1 | 0.05 | C-1 0.2 | P-1 0.2 | Q-1 0.03 | S-1 62.9 |
| Example 8 | CR-1t 0.73 | CR-8t 0.08 | 87.3 | 0.11 | C-1 0.18 | P-1 0.18 | Q-1 0.03 | S-1 58.4 |
| Example 9 | CR-1t 0.77 | CR-8t 0.04 | 92.1 | 0.05 | C-1 0.19 | P-1 0.19 | Q-1 0.03 | S-1 61.0 |
| Example 10 | CR-1t 0.76 | CR-8c 0.04 | 92.1 | 0.05 | C-1 0.2 | P-1 0.2 | Q-1 0.03 | S-1 63.7 |
| Example 11 | CR-1t 0.76 | CR-10t 0.04 | 92.1 | 0.05 | C-1 0.2 | P-1 0.2 | Q-1 0.03 | S-1 63.0 |
| Example 12 | CR-1t 0.76 | CR-11c 0.05 | 90.9 | 0.07 | C-1 0.19 | P-1 0.19 | Q-1 0.03 | S-1 60.1 |
| Example 13 | CR-1t 0.76 | CR-12c 0.04 | 92.1 | 0.05 | C-1 0.2 | P-1 0.2 | Q-1 0.03 | S-1 63.1 |
| Example 14 | CR-1t 0.77 | CR-13c 0.03 | 93.3 | 0.04 | C-1 0.19 | P-1 0.19 | Q-1 0.03 | S-1 61.2 |
| Example 15 | CR-1t 0.72 | CR-15t 0.08 | 87.2 | 0.11 | C-1 0.2 | P-1 0.2 | Q-1 0.03 | S-1 63.1 |
| Example 16 | CR-1t 0.76 | CR-15t 0.04 | 92.1 | 0.05 | C-1 0.2 | P-1 0.2 | Q-1 0.03 | S-1 64.5 |
| Example 17 | CR-1t 0.72 | CR-17t 0.08 | 87.2 | 0.11 | C-1 0.2 | P-1 0.2 | Q-1 0.03 | S-1 63.3 |
| Example 18 | CR-1t 0.76 | CR-17t 0.04 | 92.1 | 0.05 | C-1 0.2 | P-1 0.2 | Q-1 0.03 | S-1 63.1 |
| Comparative Example 1 | CR-1t 0.8 | — | 96.9 | 0.00 | C-1 0.2 | P-1 0.3 | Q-1 0.03 | S-1 43.0 |
| Comparative Example 2 | — | CR-2t 0.8 | 0.0 | — | C-1 0.2 | P-1 0.3 | Q-1 0.03 | S-1 43.0 |
| Comparative Example 3 | — | CR-2t 0.8 | 0.0 | — | C-1 0.2 | P-1 0.2 | Q-1 0.03 | S-1 43.0 |
| Comparative Example 4 | CR-1 1.0 | — | 49.9 | 0.00 | C-1 0.3 | P-1 0.3 | Q-1 0.03 | S-1 30.0 |

[a] The ratio (%) of the compound represented by the formula (1) to the resist base material was calculated in consideration of the purity of the compound.
[b] The mass ratio was calculated in consideration of the purity of the compound represented by the formula (1).

The components used in each example were as described below.

Acid Generating Agent (C)
P-1: triphenylbenzenesulfonium trifluoromethanesulfonate (Midori Kagaku Co., Ltd.)
Acid Crosslinking Agent (G)
C-1: NIKALAC MW-100LM (Sanwa Chemical Co., Ltd.)
Acid Diffusion Controlling Agent (E)
Q-1: trioctylamine (Tokyo Kasei Kogyo Co., Ltd.)

Solvent

S-1: propylene glycol monomethyl ether (Tokyo Kasei Kogyo Co., Ltd.)

A clean silicon wafer was spin coated with a resist composition of each example, and then prebaked (PB) before exposure in an oven of 110° C. to form a resist film with a thickness of 60 nm. The resist film was irradiated with electron beams of 1:1 line and space setting with a 30 nm interval, a 25 nm interval, and a 20 nm interval using an electron beam lithography system (ELS-7500 manufactured by ELIONIX INC.). After irradiation, it was heated at each predetermined temperature for 90 seconds, and immersed in 2.38% by weight tetramethylammonium hydroxide (TMAH) alkaline developing solution for 60 seconds for development. Subsequently, it was washed with ultrapure water for 30 seconds, and dried to form a negative type resist pattern.

The obtained line and space were observed by a scanning electron microscope (S-4800 manufactured by Hitachi High-Technologies Corporation). The dose amount (µC/cm²) was used as an index for sensitivity. From the obtained dose amount, the sensitivity was evaluated on the basis of the following criteria:

1: dose amount≤45 µC/cm² (excellent sensitivity)
2: 45 µC/cm²<dose amount≤60 µC/cm² (good sensitivity)
3: 60 µC/cm²<dose amount (poor sensitivity)

For the line edge roughness of the pattern, the distance between the edge and the standard line was measured using a Hitachi SEM Terminal PC V5 Offline Length Measuring Software for Semiconductor (manufactured by Hitachi Science Systems) for arbitrary 300 points in the length direction (0.75 µm) with 1:1 line and space. From the measurement results, standard deviation (3σ) was calculated and used as an index for LER. From the obtained standard deviation, LER was evaluated on the basis of the following criteria:

A: LER≤4.0 nm (excellent LER)
B: 4.0 nm<LER≤8.0 nm (good LER)
C: 8.0 nm<LER (including pattern fall)
D: no pattern or collapse

TABLE 2

|  | 30 (nm) | 25 (nm) | 20 (nm) |
| --- | --- | --- | --- |
| Example 1 | 2, A | 2, B | 2, C |
| Example 2 | 2, A | 2, A | 2, C |
| Example 3 | 2, A | 2, A | 2, C |
| Example 4 | 1, A | 1, B | 1, C |
| Example 5 | 1, B | 1, C | 1, C |
| Example 6 | 1, A | 1, B | 1, C |
| Example 7 | 1, B | 1, B | 1, C |
| Example 8 | 2, B | 2, B | 2, B |
| Example 9 | 2, A | 2, B | 2, B |
| Example 10 | 2, A | 2, B | 2, C |
| Example 11 | 1, A | 1, B | 1, C |
| Example 12 | 2, A | 2, B | 2, C |
| Example 13 | 2, B | 2, B | 2, C |
| Example 14 | 1, B | 1, B | 1, C |
| Example 15 | 2, A | 2, A | 2, B |
| Example 16 | 2, A | 2, B | 2, B |
| Example 17 | 1, B | 1, B | 1, C |
| Example 18 | 1, A | 1, A | 1, C |
| Comparative Example 1 | D | D | D |
| Comparative Example 2 | 3, C | D | D |
| Comparative Example 3 | 3, C | 3, C | 3, C |
| Comparative Example 4 | 1, C | D | D |

As described above, the resist composition of the present embodiment can form a resist pattern having high sensitivity, small roughness, and a good shape as compared with the resist compositions containing the compounds of Comparative Examples. Resist compositions other than those described in Examples exhibit similar effects as long as the predetermined conditions of the present embodiment are satisfied.

This application claims a priority based on Japanese Patent Application No. 2013-121183 filed with JPO on Jun. 7, 2013, the entire contents of which are hereby incorporated by reference.

The present invention is preferably used for a useful resist composition and a method for forming a resist pattern using the resist composition.

The invention claimed is:

1. A resist composition comprising an acid crosslinking agent (G), a solid component comprising a resist base material, and a solvent, wherein the resist composition comprises 1 to 80% by mass of the solid component and 20 to 99% by mass of the solvent, the resist base material comprises a compound (ctt form) represented by the formula (1) and a compound represented by the formula (3), a proportion of the compound (ctt form) represented by the formula (1) to the resist base material is from 65 to 99% by mass, and a mass ratio of the compound represented by the formula (3) to the compound (ctt form) represented by the formula (1) is from 0.01 to 0.53:

[Formula 1]

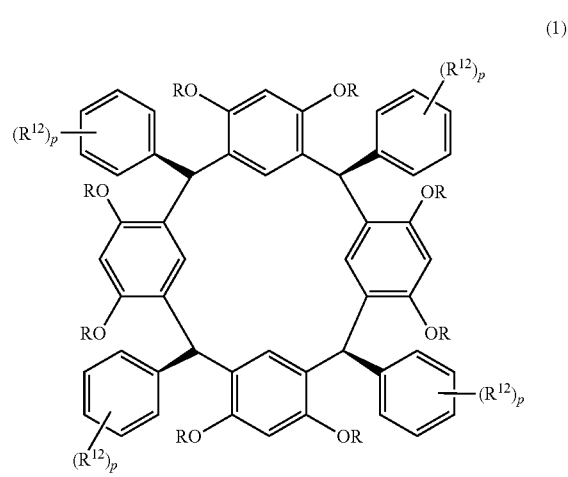

(1)

(in formula (1), R are each independently a hydrogen atom, a substituted or unsubstituted heterocyclic group, a halogen atom, a substituted or unsubstituted linear aliphatic hydrocarbon group having 1 to 20 carbon atoms, a substituted or unsubstituted branched aliphatic hydrocarbon group having 3 to 20 carbon atoms, a substituted or unsubstituted cyclic aliphatic hydrocarbon group having 3 to 20 carbon atoms, a substituted or unsubstituted aryl group having 6 to 20 carbon atoms, a substituted or unsubstituted aralkyl group having 7 to 30 carbon atoms, a substituted or unsubstituted alkoxy group having 1 to 20 carbon atoms, a substituted or unsubstituted amino group having 0 to 20 carbon atoms, a substituted or unsubstituted alkenyl group having 2 to 20 carbon atoms, a substituted or unsubstituted acyl group having 1 to 20 carbon atoms, a substituted or unsubstituted alkoxycarbonyl group having 2 to 20 carbon atoms, a substituted or unsubstituted alkyloyloxy group having 1 to 20 carbon atoms, a substituted or unsubstituted aryloyloxy group having 7 to 30 carbon atoms, a substituted or unsubstituted alkylsilyl group having 1 to 20 carbon atoms, or a group in which a divalent group (one or more groups selected from the group consisting of a substituted or unsubstituted alkylene group, a substituted or unsubstituted arylene group, and an ether group) is bonded to any of these groups; $R^{12}$ is an unsubstituted cyclic aliphatic hydrocarbon group having 3 to 14 carbon atoms; and p is an integer of 0 to 4.)

[Formula 2]

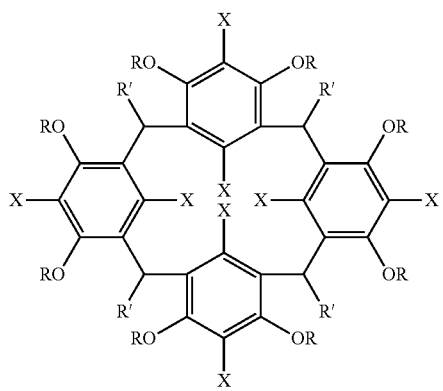

(3)

(in formula (3), R is the same as defined above; R' and X are each independently a hydrogen atom, a hydroxyl group, a cyano group, a nitro group, a substituted or unsubstituted hetero-cyclic group, a halogen atom, a substituted or unsubstituted linear aliphatic hydrocarbon group having 1 to 20 carbon atoms, a substituted or unsubstituted branched aliphatic hydrocarbon group having 3 to 20 carbon atoms, a substituted or unsubstituted cyclic aliphatic hydrocarbon group having 3 to 20 carbon atoms, a substituted or unsubstituted aryl group having 6 to 20 carbon atoms, a substituted or unsubstituted aralkyl group having 7 to 30 carbon atoms, a substituted or unsubstituted alkoxy group having 1 to 20 carbon atoms, a substituted or unsubstituted amino group having 0 to 20 carbon atoms, a substituted or unsubstituted alkenyl group having 2 to 20 carbon atoms, a substituted or unsubstituted acyl group having 1 to 20 carbon atoms, a substituted or unsubstituted alkoxycarbonyl group having 2 to 20 carbon atoms, a substituted or unsubstituted alkyloyloxy group having 1 to 20 carbon atoms, a substituted or unsubstituted aryloyloxy group having 7 to 20 carbon atoms, a substituted or unsubstituted alkylsilyl group having 1 to 20 carbon atoms, or a group in which a divalent group (one or more groups selected from the group consisting of a substituted or unsubstituted alkylene group, a substituted or unsubstituted arylene group, and an ether group) is bonded to any of these groups, provided that the compound represented by the formula (3) differs from any of the compound (ctt form) represented by the formula (1) and stereoisomers thereof).

2. The resist composition according to claim 1, wherein, in the formula (1), R is a hydrogen atom.

3. The resist composition according to claim 1, wherein, in the formula (1), p is 1.

4. The resist composition according to claim 3, wherein the compound represented by the formula (1) is represented by the following formula (X):

[Formula 3]

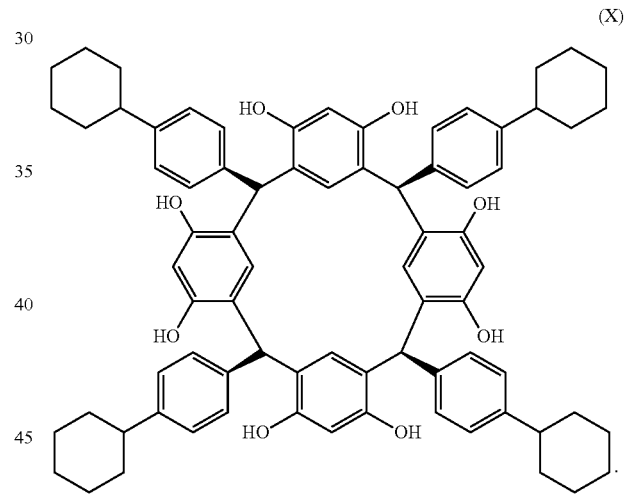

(X)

5. The resist composition according to claim 1, wherein, in the formula (3), R' is represented by the following formula (2):

[Formula 4]

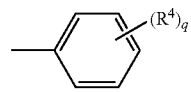

(2)

(in formula (2), $R^4$ are each independently a hydroxyl group, a cyano group, a nitro group, a substituted or unsubstituted heterocyclic group, a halogen atom, a substituted or unsubstituted linear aliphatic hydrocarbon group having 1 to 14 carbon atoms, a substituted or unsubstituted branched aliphatic hydrocarbon group having 3 to 14 carbon atoms, a substituted cyclic aliphatic hydrocarbon group having 3 to 14 carbon atoms, a substituted or unsubstituted aryl group having 6 to 14 carbon atoms, a substituted or unsubstituted alkoxy group having 1 to 14 carbon atoms, or a substituted or unsubstituted alkylsilyl group having 1 to 14 carbon atoms; and q is an integer of 0 to 5).

6. The resist composition according to claim 1, wherein in the formula (3), R is a hydrogen atom.

7. The resist composition according to claim 1, wherein the compound represented by the formula (3) comprises 70 mol % or more of a ctt form or a ccc form thereof.

8. The resist composition according to claim 1, wherein the compound represented by the formula (3) is at least one selected from the following compound group:

[Formula 5-1]

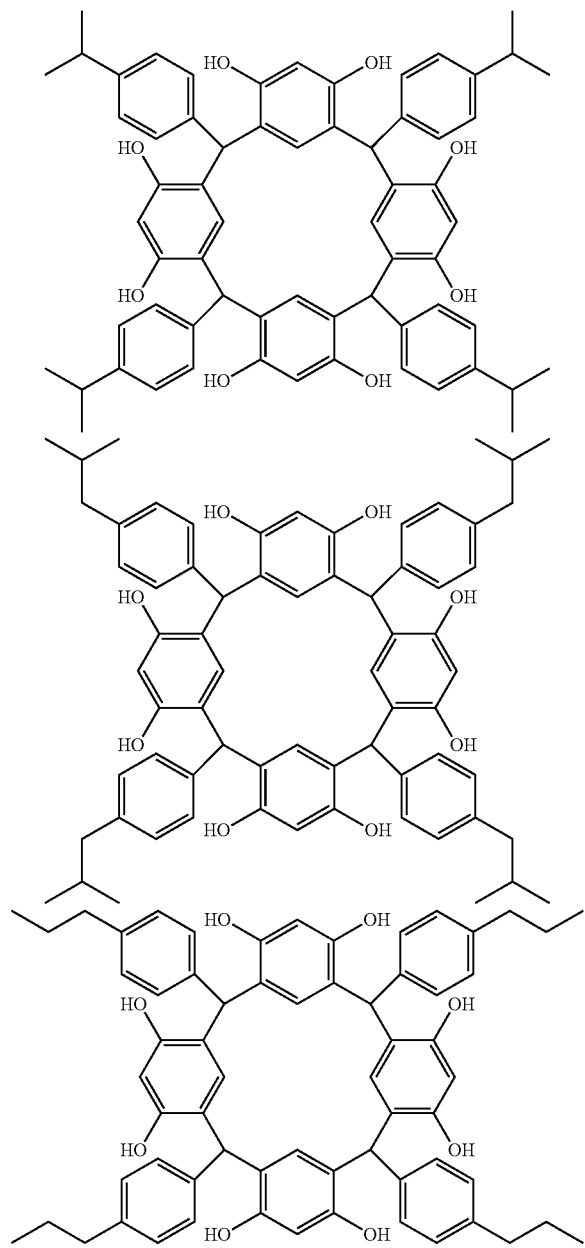

[Formula 5-2]

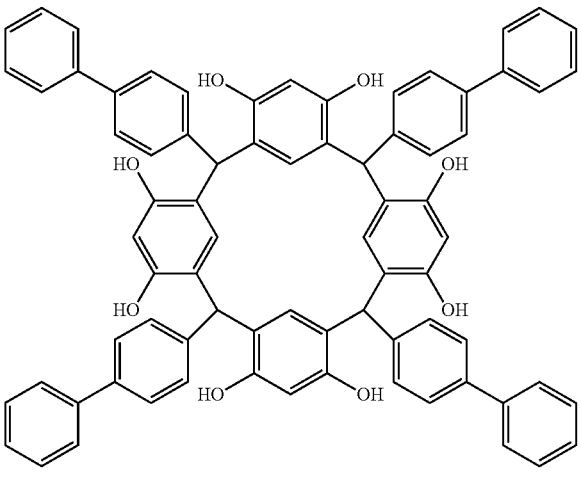

-continued

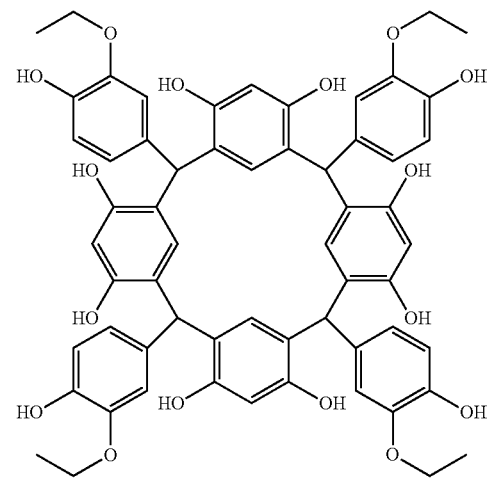

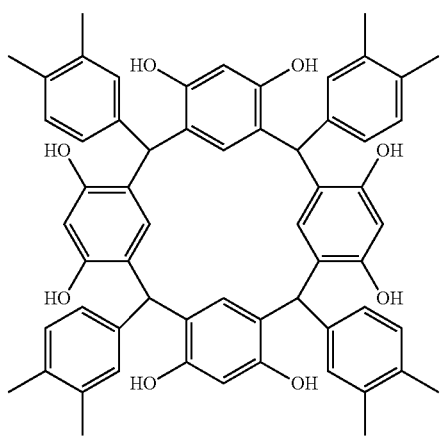

-continued

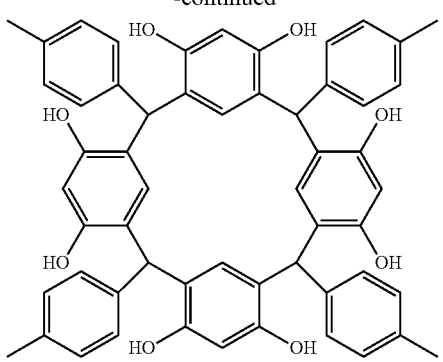

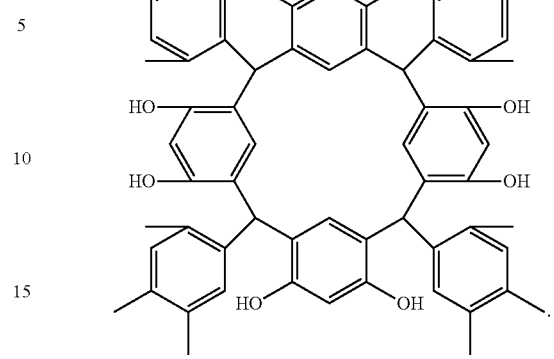

[Formula 5-3]

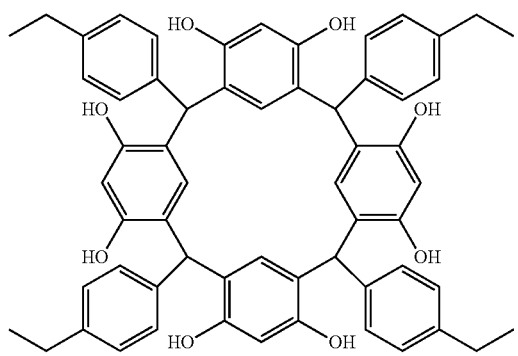

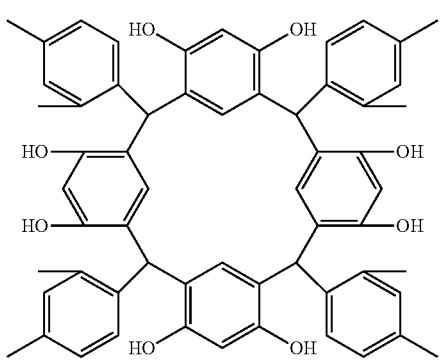

9. The resist composition according to claim 1, further comprising an acid generating agent (C) capable of generating an acid directly or indirectly by irradiation with any one radiation selected from the group consisting of visible light, ultraviolet, excimer laser, electron beam, extreme ultraviolet (EUV), X-ray, and ion beam.

10. The resist composition according to claim 1, further comprising an acid diffusion controlling agent (E).

11. The resist composition according to claim 1, wherein the resist composition further comprises an acid generating agent (C) and an acid diffusion controlling agent (E), and wherein a ratio of the resist base material, the acid generating agent (C), the acid crosslinking agent (G), the acid diffusion controlling agent (E), and an optional component (F) (resist base material/acid generating agent (C)/acid crosslinking agent (G)/acid diffusion controlling agent (E)/optional component (F)) in the solid component is from 20 to 99.498/from 0.001 to 49/from 0.5 to 49/from 0.001 to 49/from 0 to 49, based on % by mass.

12. The resist composition according to claim 1, capable of forming an amorphous film by spin coating.

13. The resist composition according to claim 12, wherein a dissolution rate of the amorphous film in a developing solution at 23° C. is 10 angstrom/sec or more.

14. The resist composition according to claim 12, wherein a dissolution rate of the amorphous film irradiated with KrF excimer laser, extreme ultraviolet, electron beam or X-ray, or the amorphous film heated at 20 to 250° C. in a developing solution is 5 angstrom/sec or less.

15. A method for forming a resist pattern, comprising:
   coating a substrate with the resist composition according to claim 1, thereby forming a resist film;
   exposing the resist film; and
   developing the exposed resist film.

* * * * *